US011626311B2

(12) United States Patent
Lowrance et al.

(10) Patent No.: US 11,626,311 B2
(45) Date of Patent: *Apr. 11, 2023

(54) PRINTING SYSTEM ASSEMBLIES AND METHODS

(71) Applicant: Kateeva, Inc., Newark, CA (US)

(72) Inventors: Robert B. Lowrance, San Jose, CA (US); Alexander Sou-Kang Ko, Santa Clara, CA (US); Justin Mauck, Belmont, CA (US); Eliyahu Vronsky, Los Altos, CA (US); Aleksey Khrustalev, Sunnyvale, CA (US); Karl Mathia, Menlo Park, CA (US); Shandon Alderson, San Carlos, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/247,013

(22) Filed: Nov. 24, 2020

(65) Prior Publication Data

US 2021/0086535 A1 Mar. 25, 2021

Related U.S. Application Data

(63) Continuation of application No. 16/416,523, filed on May 20, 2019, now Pat. No. 10,875,329, which is a
(Continued)

(51) Int. Cl.
*B41J 29/02* (2006.01)
*B41J 3/28* (2006.01)
(Continued)

(52) U.S. Cl.
CPC ............ *H01L 21/6838* (2013.01); *B41J 3/28* (2013.01); *B41J 3/407* (2013.01); *B41J 11/06* (2013.01);
(Continued)

(58) Field of Classification Search
CPC ..... B41J 29/02; B41J 3/28; B41J 3/407; B41J 25/304; B41J 25/005; H01L 51/56; H01L 21/6838; H01L 21/67784; H01L 21/68
See application file for complete search history.

(56) References Cited

U.S. PATENT DOCUMENTS

| 4,069,697 A | 1/1978 | Morrison et al. |
| 4,283,929 A | 8/1981 | Heiberger |

(Continued)

FOREIGN PATENT DOCUMENTS

| CN | 1909203 A | * | 2/2007 | ........... B65G 47/911 |
| CN | 101124133 A | | 2/2008 | |

(Continued)

OTHER PUBLICATIONS

Office Action dated May 8, 2021 in CN Patent Application No. 201680055770.3.
(Continued)

*Primary Examiner* — Christopher E Mahoney
*Assistant Examiner* — Kendrick X Liu
(74) *Attorney, Agent, or Firm* — Hauptman Ham, LLP

(57) ABSTRACT

The present teachings disclose various embodiments of a printing system for printing substrate, in which the printing system can be housed in a gas enclosure, where the environment within the enclosure can be maintained as a controlled printing environment. A controlled environment of the present teachings can include control of the type of gas environment within the gas enclosure, the size and level particulate matter within the enclosure, control of the temperature within the enclosure and control of lighting. Various embodiments of a printing system of the present teachings can include a Y-axis motion system and a Z-axis moving plate that are configured to substantially decrease excess thermal load within the enclosure by, for example, elimi-
(Continued)

nating or substantially minimizing the use of conventional electric motors.

20 Claims, 38 Drawing Sheets

Related U.S. Application Data continuation of application No. 15/836,617, filed on Dec. 8, 2017, now Pat. No. 10,414,181, which is a continuation of application No. 15/354,927, filed on Nov. 17, 2016, now Pat. No. 9,884,501, which is a continuation of application No. 14/738,785, filed on Jun. 12, 2015, now Pat. No. 9,505,245.

(60) Provisional application No. 62/092,721, filed on Dec. 16, 2014, provisional application No. 62/044,165, filed on Aug. 29, 2014, provisional application No. 62/037,494, filed on Aug. 14, 2014, provisional application No. 62/021,390, filed on Jul. 7, 2014, provisional application No. 62/021,563, filed on Jul. 7, 2014, provisional application No. 62/013,440, filed on Jun. 17, 2014, provisional application No. 62/013,433, filed on Jun. 17, 2014.

(51) Int. Cl.
| | | |
|---|---|---|
| *B41J 3/407* | (2006.01) | |
| *B41J 11/06* | (2006.01) | |
| *B41J 11/22* | (2006.01) | |
| *B41J 25/304* | (2006.01) | |
| *B41J 25/00* | (2006.01) | |
| *H01L 51/56* | (2006.01) | |
| *H01L 21/683* | (2006.01) | |
| *H01L 21/677* | (2006.01) | |
| *H01L 21/68* | (2006.01) | |

(52) U.S. Cl.
CPC ............ *B41J 11/22* (2013.01); *B41J 25/005* (2013.01); *B41J 25/304* (2013.01); *B41J 29/02* (2013.01); *H01L 21/67784* (2013.01); *H01L 21/68* (2013.01); *H01L 51/56* (2013.01)

(56) References Cited

U.S. PATENT DOCUMENTS

| | | | |
|---|---|---|---|
| 4,295,741 A | 10/1981 | Palma et al. | |
| 4,470,304 A | 9/1984 | Nusbickel, Jr. et al. | |
| 5,191,200 A | 3/1993 | Werf et al. | |
| 5,489,925 A | 2/1996 | Brooks et al. | |
| 5,890,580 A | 4/1999 | Hashimoto et al. | |
| 5,894,342 A | 4/1999 | Halup et al. | |
| 5,933,573 A | 8/1999 | Lukenich et al. | |
| 6,113,698 A | 9/2000 | Raaijmakers et al. | |
| 7,530,778 B2 | 5/2009 | Yassour et al. | |
| 7,604,439 B2 | 10/2009 | Yassour et al. | |
| 7,722,256 B2 | 5/2010 | Brackley et al. | |
| 8,225,735 B1 | 7/2012 | Galway | |
| 8,225,737 B2 | 7/2012 | Kitano et al. | |
| 8,307,778 B2 | 11/2012 | Inamasu et al. | |
| 8,986,780 B2 | 3/2015 | Bulovic et al. | |
| 9,505,245 B2 | 11/2016 | Lowrance et al. | |
| 9,884,501 B2 | 2/2018 | Lowrance et al. | |
| 10,355,208 B2 | 7/2019 | Vronsky | |
| 10,414,181 B2 | 9/2019 | Lowrance et al. | |
| 10,875,329 B2 * | 12/2020 | Lowrance .............. B41J 3/407 |
| 2002/0079057 A1 | 6/2002 | Yoshioka et al. | |
| 2003/0097929 A1 | 5/2003 | Watanabe et al. | |
| 2003/0169524 A1 | 9/2003 | Adin et al. | |
| 2003/0175414 A1 | 9/2003 | Hayashi | |
| 2004/0003738 A1 | 1/2004 | Imiolek et al. | |
| 2004/0036731 A1 | 2/2004 | Ready et al. | |
| 2004/0056244 A1 | 3/2004 | Marcus et al. | |
| 2004/0086631 A1 | 5/2004 | Han et al. | |
| 2004/0118309 A1 | 6/2004 | Fedor et al. | |
| 2004/0197179 A1 | 10/2004 | Achkire et al. | |
| 2005/0001579 A1 | 1/2005 | Touzov | |
| 2005/0031975 A1 | 2/2005 | Reuhman-Huisken et al. | |
| 2005/0040338 A1 | 2/2005 | Weiss et al. | |
| 2005/0045096 A1 | 3/2005 | Kojima | |
| 2006/0120833 A1 | 6/2006 | Bonora et al. | |
| 2006/0158470 A1 | 7/2006 | Vanheusden et al. | |
| 2006/0219605 A1 | 10/2006 | Devitt | |
| 2007/0031603 A1 | 2/2007 | Eron | |
| 2007/0195653 A1 * | 8/2007 | Yassour .................. B24B 37/30 |
| | | | 369/13.24 |
| 2007/0257033 A1 | 11/2007 | Yamada | |
| 2008/0229811 A1 | 9/2008 | Zhao et al. | |
| 2008/0273910 A1 | 11/2008 | Verlinden et al. | |
| 2008/0308037 A1 | 12/2008 | Bulovic et al. | |
| 2009/0031579 A1 | 2/2009 | Piatt et al. | |
| 2009/0051849 A1 | 2/2009 | Hwang et al. | |
| 2009/0051894 A1 | 2/2009 | Shibazaki et al. | |
| 2010/0201749 A1 | 8/2010 | Somekh et al. | |
| 2010/0266961 A1 | 10/2010 | Kawamura et al. | |
| 2011/0062641 A1 | 3/2011 | Sato et al. | |
| 2011/0106287 A1 | 5/2011 | Akagawa et al. | |
| 2011/0318503 A1 | 12/2011 | Adams et al. | |
| 2012/0044292 A1 | 2/2012 | Helsel et al. | |
| 2013/0040061 A1 | 2/2013 | Lowrance et al. | |
| 2013/0206058 A1 | 8/2013 | Mauck et al. | |
| 2013/0252533 A1 | 9/2013 | Mauck et al. | |
| 2013/0284946 A1 | 10/2013 | Schaede | |
| 2013/0294877 A1 | 11/2013 | Hosek | |
| 2014/0023112 A1 | 1/2014 | Millar et al. | |
| 2014/0374375 A1 * | 12/2014 | Zwiers ................ B41J 2/16544 |
| | | | 118/712 |
| 2015/0314325 A1 | 11/2015 | Ko et al. | |
| 2015/0360462 A1 | 12/2015 | Lowrance et al. | |
| 2016/0263921 A1 * | 9/2016 | Rigio ..................... B41J 25/001 |
| 2017/0129265 A1 | 5/2017 | Lowrance et al. | |
| 2018/0014410 A1 | 1/2018 | Darrow et al. | |
| 2018/0014411 A1 | 1/2018 | Vronsky et al. | |
| 2018/0160550 A1 | 6/2018 | Vronsky et al. | |
| 2018/0228034 A1 | 8/2018 | Darrow et al. | |
| 2018/0229497 A1 | 8/2018 | Darrow et al. | |
| 2018/0264862 A1 | 9/2018 | Lowrance et al. | |
| 2018/0315923 A1 | 11/2018 | Vronsky | |
| 2019/0270325 A1 | 9/2019 | Lowrance et al. | |
| 2019/0280204 A1 | 9/2019 | Vronsky | |

FOREIGN PATENT DOCUMENTS

| | | | | | |
|---|---|---|---|---|---|
| CN | 101622076 A | * | 1/2010 | ............ | B05D 3/105 |
| CN | 102057477 A | | 5/2011 | | |
| CN | 105431294 B | | 4/2018 | | |
| JP | 2003272847 A | | 9/2003 | | |
| JP | 2004181837 A | | 7/2004 | | |
| JP | 2005062819 A | | 3/2005 | | |
| JP | 2005132626 A | | 5/2005 | | |
| JP | 2006136794 A | * | 6/2006 | | |
| JP | 2006136794 A | | 6/2006 | | |
| JP | 2006524435 A | | 10/2006 | | |
| JP | 2007533153 A | | 11/2007 | | |
| JP | 2008147291 A | | 6/2008 | | |
| JP | 2008246953 A | * | 10/2008 | | |
| JP | 2010533057 A | | 10/2010 | | |
| JP | 2012187453 A | | 10/2012 | | |
| JP | 2013012754 A | | 1/2013 | | |
| JP | WO-2013031223 A1 | * | 3/2013 | ......... | G03F 7/70716 |
| JP | 2014502220 A | | 1/2014 | | |
| JP | 2014529489 A | | 11/2014 | | |
| JP | 2014233704 A | | 12/2014 | | |
| JP | 2016506024 A | | 2/2016 | | |
| JP | 2018535508 A | | 11/2018 | | |
| KR | 20080034564 A | | 4/2008 | | |
| KR | 1020110107801 A | | 10/2011 | | |
| TW | I579538 B | | 3/2004 | | |
| TW | 200420179 A | | 10/2004 | | |

(56) References Cited

FOREIGN PATENT DOCUMENTS

| TW | 200508140 A | 3/2005 |
|---|---|---|
| TW | 201238784 B | 4/2016 |
| WO | 2014084888 A1 | 6/2014 |

OTHER PUBLICATIONS

Notice of Reasons for Rejection dated Jul. 31, 2019 in JP Patent Application No. 2018-515261.
Extended EP Search dated Apr. 10, 2019 in EP Application No. 168494292.
Notice of Reasons for Rejection dated Dec. 7, 2020 in JP Patent Application No. 2020-037664.
Notice of Reasons for Refusal dated Oct. 23, 2020 in JP Patent Application No. 2019171343.
Applicant Interview Summary dated Mar. 17, 2016 to U.S. Appl. No. 14/738,785.
Examination Report dated Feb. 26, 2018 to TW Patent Application No. 104119382.
Examination Report dated Oct. 9, 2018 to TW Patent Application No. 10729318.
Extended EP Search Report dated Feb. 12, 2018 to EP Patent Application No. 15809195.9.
Final Office Action dated Apr. 21, 2016, to U.S. Appl. No. 14/738,785.
First Office Action dated May 8, 2019, to CN Patent Application No. 201580032675.7.
International Search Report and Written Opinion dated Apr. 24, 2018 to PCT Application No. PCT/US18/16929.
International Search Report and Written Opinion dated Dec. 19, 2016 to PCT Application No. PCT/US16/52663.
International Search Report and Written Opinion dated Sep. 17, 2015 to PCT Application PCT/US2015/35700.
International Search Report and Written Opinion dated Sep. 22, 2017 for International Patent Application No. PCT/US/2017/040968.
International Search Report and Written Opinion dated Sep. 26, 2017 for International Patent Application No. PCT/US2017/040970.
JP Office Action dated Jun. 15, 2020 for JP Patent Application No. 2019-95159.
Non-Final Office Action dated Apr. 14, 2020 for U.S. Appl. No. 16/416,523.
Non-Final Office Action dated Dec. 5, 2018 to U.S. Appl. No. 15/816,443.
Non-Final Office action dated Dec. 5, 2018 to U.S. Appl. No. 15/828,335.
Non-Final Office Action dated Jul. 16, 2020 for U.S. Appl. No. 16/424,460.
Non-Final Office Action dated Oct. 6, 2015 to U.S. Appl. No. 14/738,785.
Notice of Allowance dated Dec. 4, 2017 to U.S. Appl. No. 15/642,037.
Notice of Allowance dated Feb. 21, 2019 to U.S. Appl. No. 15/836,617.
Notice of Allowance dated Mar. 6, 2019 to U.S. Appl. No. 15/772,038.
Notice of Allowance dated Nov. 27, 2017 to U.S. Appl. No. 15/642,188.
Notice of Allowance dated Jun. 10, 2019 for U.S. Appl. No. 15/836,617.
Notice of Allowance dated Oct. 3, 2017 for U.S. Appl. No. 15/354,927.
Notice of Allowance dated Sep. 10, 2020 for U.S. Appl. No. 16/416,523.
Notice of Allowance dated Sep. 20, 2016 for U.S. Appl. No. 14/738,785.
Office Action dated Jul. 30, 2019 to JP Patent Application No. 2016-569718.
Official Action dated Jul. 31, 2019 to JP Patent Application No. 2018-515261.
Provisional Rejection dated Aug. 14, 2018 to KR Patent Application No. 10-2017-7000812.
Second Office Action and Search Report dated Jan. 6, 2020 to CN Patent Application No. 201580032675.7.
Supplemental Notice of Allowability dated Dec. 11, 2017 to U.S. Appl. No. 15/642,188.
XL-80 Laser System Training Course Manual (Part 1), Renishaw apply innovation, training manual, Dec. 2008; pp. 2.1-2.26.
Second Office Action dated Aug. 11, 2022 for KR Patent Application No. 10-2021-7036957.
Request for Submission of an Opinion dated Jun. 19, 2019 for KR Patent Application No. 10-2017-7000812.

\* cited by examiner

PRINTING SYSTEM ASSEMBLIES AND METHODS

CROSS-REFERENCE TO RELATED APPLICATIONS

This application is a continuation of U.S. patent application Ser. No. 16/416,523, filed on May 20, 2019, which is a continuation of U.S. patent application Ser. No. 15/836,617, filed on Dec. 8, 2017, now U.S. Pat. No. 10,414,181, issued on Sep. 17, 2019, which is a continuation of U.S. Patent Application No. 354,927, filed on Nov. 17, 2016, now U.S. Pat. No. 9,884,501, issued on Feb. 6, 2018, which is a continuation of U.S. patent application Ser. No. 14/738,785, filed on Jun. 12, 2015, now U.S. Pat. No. 9,505,245, issued on Nov. 29, 2016, which claims priority from U.S. Provisional Application No. 62/092,721, filed on Dec. 16, 2014; U.S. Provisional Application No. 62/044,165, filed on Aug. 29, 2014; U.S. Provisional Application No. 62/037,494, filed on Aug. 14, 2014; U.S. Provisional Application No. 62/021,390, filed on Jul. 7, 2014; U.S. Provisional Application No. 62/021,563, filed on Jul. 7, 2014; U.S. Provisional Application No. 62/013,433, filed on Jun. 17, 2014; and U.S. Provisional Application No. 62/013,440, filed on Jun. 17, 2014, all of which are incorporated herein by reference in their entirety.

FIELD

The present teachings relate to various embodiments of a printing system that can be maintained in a gas enclosure system defining an interior that has an inert, substantially low-particle environment.

OVERVIEW

Interest in the potential of organic light-emitting diode (OLED) display technology has been driven by OLED display technology attributes that include demonstration of display panels that have highly saturated colors, are high-contrast, ultrathin, fast-responding, and energy efficient. Additionally, a variety of substrate materials, including flexible polymeric materials, can be used in the fabrication of OLED display technology. Though the demonstration of displays for small screen applications, primarily for cell phones, has served to emphasize the potential of the technology, challenges remain in scaling high volume manufacturing across a range of substrate formats in high yield.

With respect to scaling of formats, a Gen 5.5 substrate has dimensions of about 130 cm×150 cm and can yield about eight 26" flat panel displays. In comparison, larger format substrates can include using Gen 7.5 and Gen 8.5 mother glass substrate sizes. A Gen 7.5 mother glass has dimensions of about 195 cm×225 cm, and can be cut into eight 42" or six 47" flat panel displays per substrate. The mother glass used in Gen. 8.5 is approximately 220 cm×250 cm, and can be cute to six 55" or eight 46" flat panel displays per substrate. One indication of the challenges that remain in scaling of OLED display manufacturing to larger formats is that the high-volume manufacture of OLED displays in high yield on substrates larger than Gen 5.5 substrates has proven to be substantially challenging.

In principle, an OLED device may be manufactured by the printing of various organic thin films, as well as other materials, on a substrate using an OLED printing system. Such organic materials can be susceptible to damage by oxidation and other chemical processes. Housing an OLED printing system in a fashion can be scaled for various substrate sizes and can be done in an inert, substantially low-particle printing environment can present a variety of engineering challenges. Manufacturing tools for high throughout large-format substrate printing, for example, such as printing of Gen. 7.5 and Gen 8.5 substrates, require substantially large facilities. Accordingly, maintaining a large facility under an inert atmosphere, requiring gas purification to remove reactive atmospheric species, such as water vapor or oxygen, as well as organic solvent vapors, as well as maintaining a substantially low-particle printing environment, has proven to be significantly challenging.

As such, challenges remain in scaling high volume manufacturing of OLED display technology across a range of substrate formats in high yield. Accordingly, there exists a need for various embodiments a gas enclosure system of the present teachings that can house an OLED printing system, in an inert, substantially low-particle environment, and can be readily scaled to provide for fabrication of OLED panels on a variety of substrates sizes and substrate materials. Additionally, various gas enclosure systems of the present teachings can provide for ready access to an OLED printing system from the exterior during processing and ready access to the interior for maintenance with minimal downtime.

BRIEF DESCRIPTION OF THE DRAWINGS

A better understanding of the features and advantages of the present disclosure will be obtained by reference to the accompanying drawings, such are intended to illustrate, not limit, the present teachings. In the drawings, which are not necessarily drawn to scale, like numerals may describe similar components in different views. Like numerals having different letter suffixes may represent different instances of similar components.

FIG. 19A is a front top perspective view of a printhead device, while FIG. 19C is a front top perspective view of a mounting plate for a printhead device, while

DETAILED DESCRIPTION OF THE DISCLOSURE

The present teachings disclose various embodiments of a printing system for printing a substrate, in which the printing system can be housed in a gas enclosure, where the environment within the enclosure can be maintained as a controlled printing environment. A controlled environment of the present teachings can include control of the type of gas environment within the gas enclosure, the size and level particulate matter within the enclosure, control of the temperature within the enclosure and control of lighting. Various embodiments of a printing system of the present teachings can include a Y-axis motion system and a Z-axis moving plate assembly that are configured to substantially decrease excess thermal load within the gas enclosure, for example, by eliminating or substantially minimizing the use of conventional electric motors. Additionally, various embodiments of a Y-axis motion system of the present teachings can include a gripper motion control assembly of a Y-axis motion system configured to provide dynamic rotation of the orientation of a substrate about the theta-Z ($\theta$-Z) axis during Y-axis travel to maintain a high degree of precision for substrate orientation parallel to the axis of travel.

Various embodiments of a gas enclosure assembly can be sealably constructed with various components that provide a gas circulation and filtration system, a particle control system, a gas purification system, and a thermal regulation system and the like to form various embodiments of a gas enclosure system that can sustain an inert gas environment that is substantially low-particle for processes requiring such an environment. Various embodiments of a gas enclosure can have a printing system enclosure and an auxiliary enclosure constructed as a section of a gas enclosure assembly, which can be sealably isolated from the printing system enclosure of a gas enclosure assembly, which can be sealably isolated from the printing system enclosure of a gas enclosure. Various embodiments of a printing system of the present teachings can have a printhead management system enclosed in an auxiliary enclosure. Embodiments of printhead management system of the present teachings can include various devices and apparatuses for maintenance and calibration of a printhead; the various devices and apparatuses each mounted on a motion system platform for the fine positioning of the various devices and apparatuses relative to a printhead.

Figure 1A:
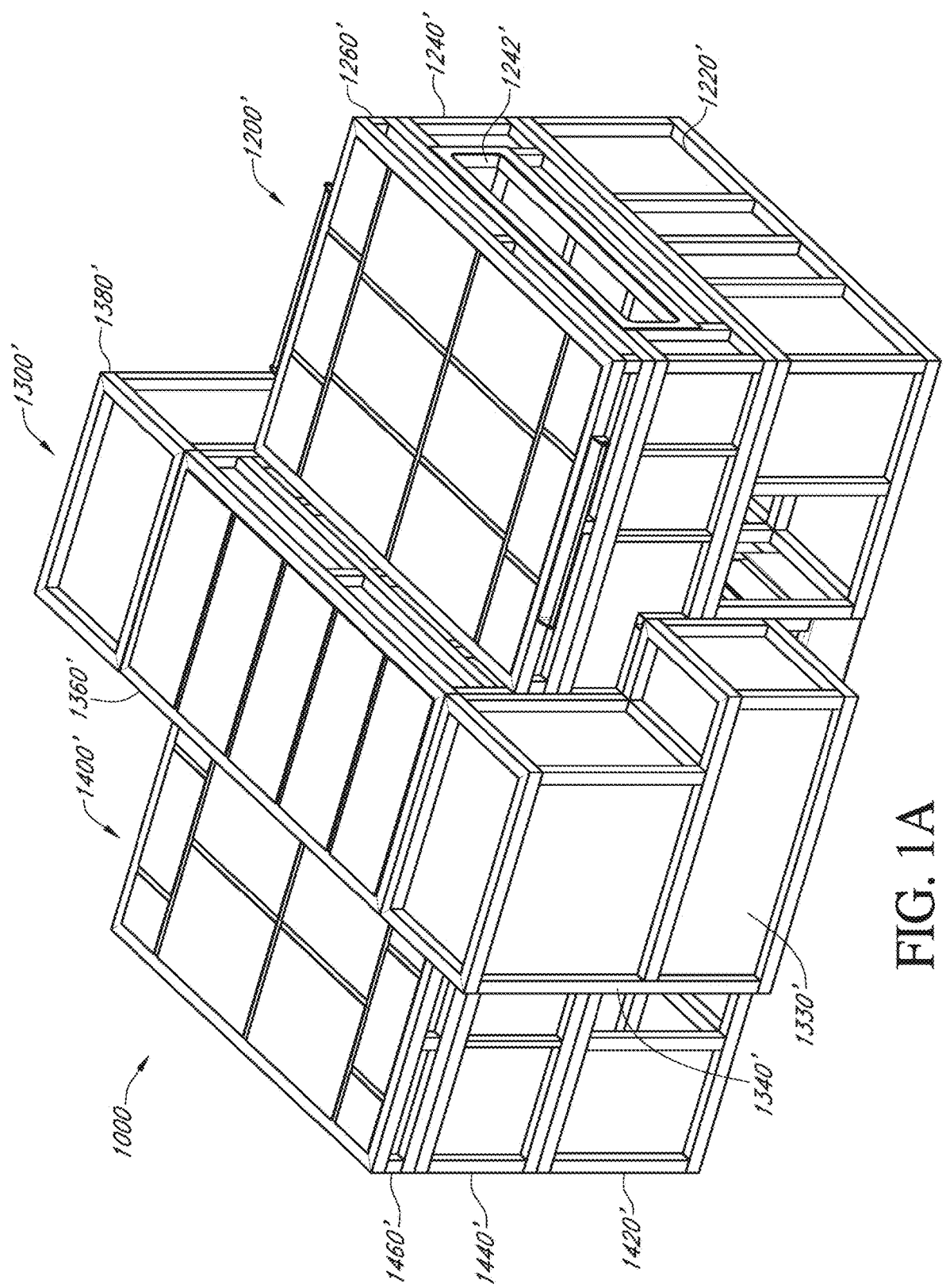
FIG. 1A is a front perspective view of a gas enclosure assembly in accordance with various embodiments of the present teachings.
Figure 1B:
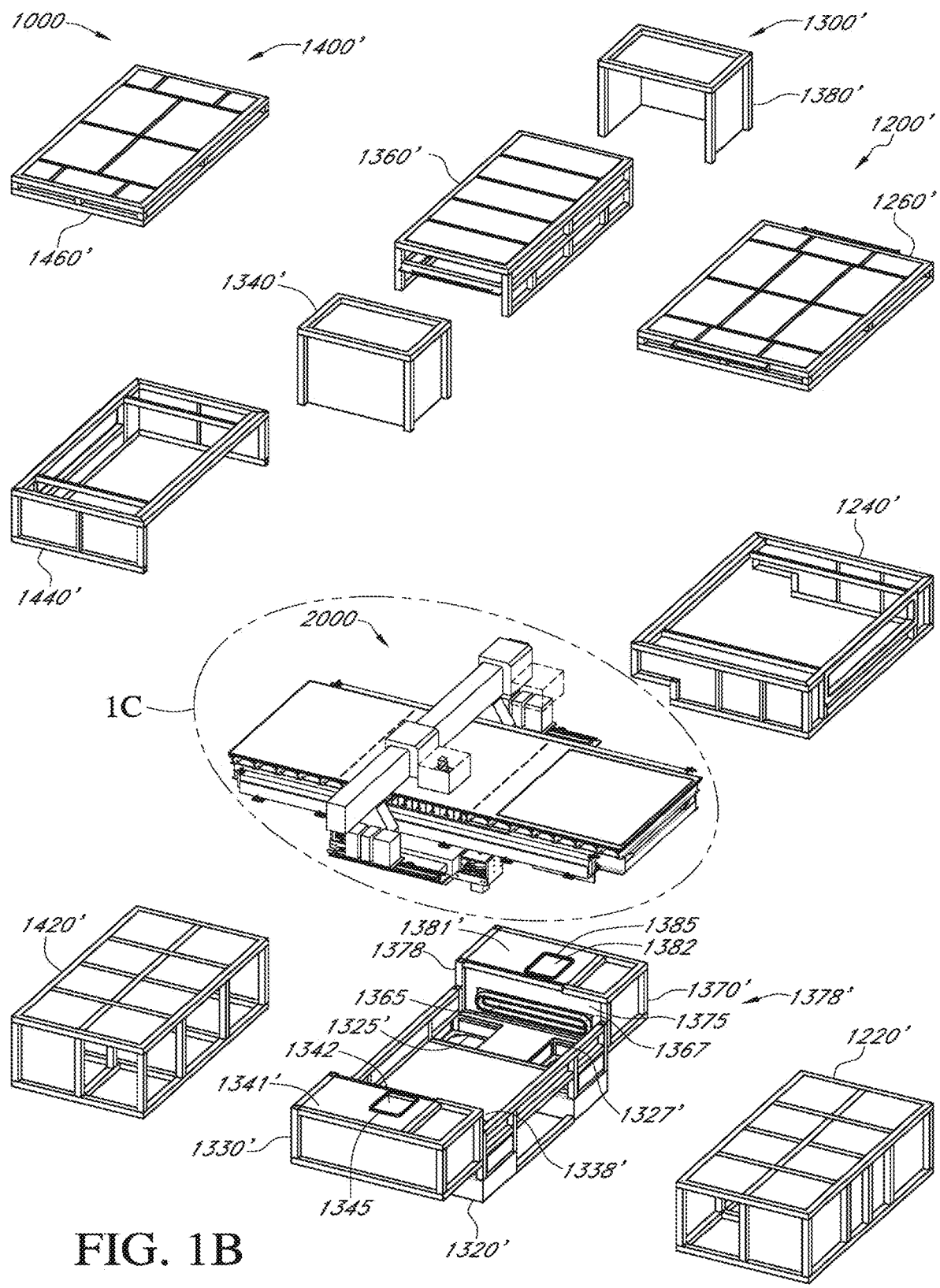
FIG. 1B depicts an exploded view of various embodiments of a gas enclosure assembly as depicted in FIG. 1B.
Figure 1C:
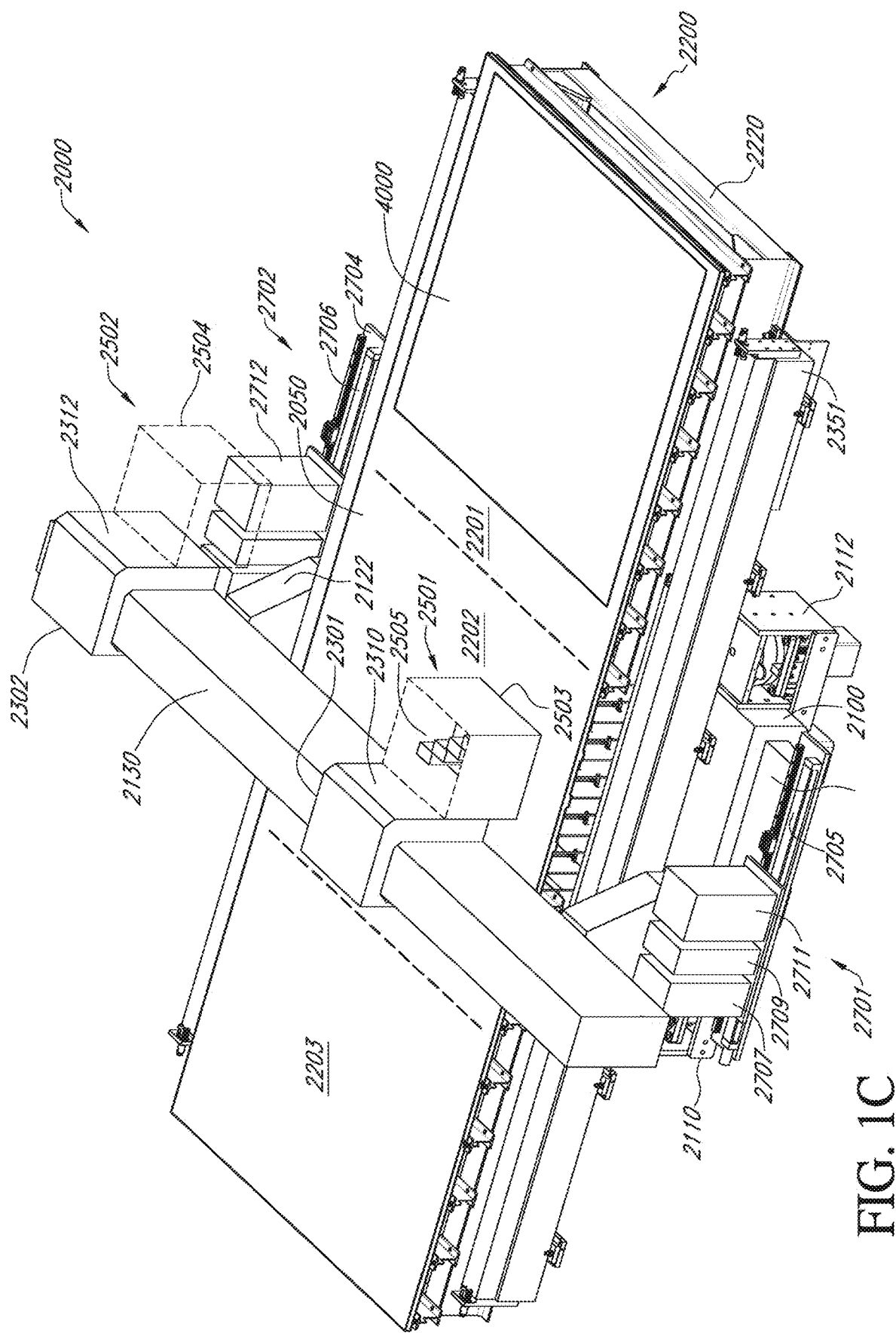
FIG. 1D is an expanded perspective view of an auxiliary enclosure of a gas enclosure system according to various embodiments of the present teachings.

A printing system, such as printing system 2000 of FIG. 1B, shown in expanded view in FIG. 1C, can be comprised of several devices and apparatuses, which allow the reliable placement of ink drops onto specific locations on a substrate. Printing requires relative motion between the printhead assembly and the substrate. This can be accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. For various embodiments of systems and methods of the present teachings, an Y-axis motion system can be based on an air-bearing gripper system.

For clearer perspective regarding substrate sizes that can be used in manufacturing of various OLED devises, generations of mother glass substrate sizes have been undergoing evolution for flat panel displays fabricated by other-than OLED printing since about the early 1990s. The first generation of mother glass substrates, designated as Gen 1, is approximately 30 cm×40 cm, and therefore could produce a 15" panel. Around the mid-1990s, the existing technology for producing flat panel displays had evolved to a mother glass substrate size of Gen 3.5, which has dimensions of about 60 cm×72 cm. In comparison, a Gen 5.5 substrate has dimensions of about 130 cm×150 cm.

As generations have advanced, mother glass sizes for Gen 7.5 and Gen 8.5 are in production for other-than OLED printing fabrication processes. A Gen 7.5 mother glass has dimensions of about 195 cm×225 cm, and can be cut into eight 42" or six 47" flat panels per substrate. The mother glass used in Gen 8.5 is approximately 220×250 cm, and can be cut to six 55" or eight 46" flat panels per substrate. The promise of OLED flat panel display for qualities such as truer color, higher contrast, thinness, flexibility, transparency, and energy efficiency have been realized, at the same time that OLED manufacturing is practically limited to G 3.5 and smaller. Currently, OLED printing is believed to be the optimal manufacturing technology to break this limitation and enable OLED panel manufacturing for not only mother glass sizes of Gen 3.5 and smaller, but at the largest mother glass sizes, such as Gen 5.5, Gen 7.5, and Gen 8.5. One of the features of OLED panel display technology includes that a variety of substrate materials can be used, for example, but not limited by, a variety of glass substrate materials, as well as a variety of polymeric substrate materials. In that regard, sizes recited from the terminology arising from the use of glass-based substrates can be applied to substrates of any material suitable for use in OLED printing.

Manufacturing tools that in principle can allow for the printing of a variety of substrate sizes that includes large-format substrate sizes, can require substantially large facilities for housing such OLED manufacturing tools. Accordingly, maintaining an entire large facility under an inert atmosphere presents engineering challenges, such as continual purification of a large volume of an inert gas. Various embodiments of a gas enclosure system can have a circulation and filtration system internal a gas enclosure assembly in conjunction with a gas purification system external a gas enclosure that together can provide continuous circulation of a substantially low-particulate inert gas having substantially low levels of reactive species throughout a gas enclosure system. According to the present teachings, an inert gas may be any gas that does not undergo a chemical reaction under a defined set of conditions. Some commonly used non-limiting examples of an inert gas can include nitrogen, any of the noble gases, and any combination thereof. Additionally, providing a large facility that is essentially hermetically sealed to prevent contamination of various reactive atmospheric gases, such as water vapor and oxygen, as well as organic solvent vapors generated from various printing process poses an engineering challenge. According to the present teachings, an OLED printing facility would maintain levels for each species of various reactive species, including various reactive atmospheric gases, such as water vapor and oxygen, as well as organic solvent vapors at 100 ppm or lower, for example, at 10 ppm or lower, at 1.0 ppm or lower, or at 0.1 ppm or lower.

The need for printing an OLED panel in a facility in which the levels of each of a reactive species should be maintained at targeted low levels can be illustrated in reviewing the information summarized in Table 1. The data summarized on Table 1 resulted from the testing of each of a test coupon comprising organic thin film compositions for each of red, green, and blue, fabricated in a large-pixel, spin-coated device format. Such test coupons are substantially easier to fabricate and test for the purpose of rapid evaluation of various formulations and processes. Though test coupon testing should not be confused with lifetime testing of a printed panel, it can be indicative of the impact of various formulations and processes on lifetime. The results shown in the table below represent variation in the process step in the fabrication of test coupons in which only the spin-coating environment varied for test coupons fabricated in a nitrogen environment where reactive species were less than 1 ppm compared to test coupons similarly fabricated but in air instead of a nitrogen environment.

It is evident through the inspection of the data in Table 1 for test coupons fabricated under different processing environments, particularly in the case of red and blue, that printing in an environment that effectively reduces exposure of organic thin film compositions to reactive species may have a substantial impact on the stability of various ELs, and hence on lifetime. The lifetime specification is of particular significance for OLED panel technology, as this correlates directly to display product longevity; a product specification for all panel technologies, which has been challenging for OLED panel technology to meet. In order to provide panels meeting requisite lifetime specifications, levels of each of a reactive species, such as water vapor, oxygen, as well as organic solvent vapors, can be maintained at 100 ppm or lower, for example, at 10 ppm or lower, at 1.0 ppm or lower, or at 0.1 ppm or lower with various embodiments of a gas enclosure system of the present teachings.

TABLE 1

Impact of inert gas processing on lifetime for OLED panels

| Color | Process Environment | V @ 10 mA/cm$^2$ | Cd/A | CIE (x, y) @ 1000 Cd/m$^2$ | T95 | T80 | T50 |
|---|---|---|---|---|---|---|---|
| Red | Nitrogen | 6 | 9 | (0.61, 0.38) | 200 | 1750 | 10400 |
|  | Air | 6 | 8 | (0.60, 0.39) | 30 | 700 | 5600 |
| Green | Nitrogen | 7 | 66 | (0.32, 0.63) | 250 | 3700 | 32000 |
|  | Air | 7 | 61 | (0.32, 0.62) | 250 | 2450 | 19700 |
| Blue | Nitrogen | 4 | 5 | (0.14, 0.10) | 150 | 750 | 3200 |
|  | Air | 4 | 5 | (0.14, 0.10) | 15 | 250 | 1800 |

In addition to providing an inert environment, maintaining a substantially low-particle environment for OLED printing is of particular importance, as even very small particles can lead to a visible defect on an OLED panel. Particle control in a gas enclosure system can present significant challenges not presented for processes that can be done, for example, in atmospheric conditions under open air, high flow laminar flow filtration hoods. For example, of a manufacturing facility can require a substantial length of various service bundles that can be operatively connected from various systems and assemblies to provide optical, electrical, mechanical, and fluidic connections required to operate, for example, but not limited by, a printing system. Such service bundles used in the operation of a printing system and located proximal to a substrate positioned for printing can be an ongoing source of particulate matter. Additionally, components used in a printing system, such as fans or linear motion systems that use friction bearing, can be particle generating components. Various embodiments of a gas circulation and filtration system of the present teachings can be used in conjunction with particle control components to contain and exhaust particulate matter. Additionally, by using a variety of intrinsically low-particle generating pneumatically operated components, such as, but not limited by, substrate floatation tables, air bearings, and pneumatically operated robots, and the like, a low particle environment for various embodiments of a gas enclosure system can be maintained.

Regarding maintaining a substantially low-particle environment, various embodiments of a gas circulation and filtration system can be designed to provide a low particle inert gas environment for airborne particulates meeting the standards of International Standards Organization Standard (ISO) 14644-1:1999, "Cleanrooms and associated controlled environments—Part 1: Classification of air cleanliness," as specified by Class 1 through Class 5. However, controlling airborne particulate matter alone is not sufficient for providing a low-particle environment proximal to a substrate during, for example, but not limited by, a printing process, as particles generated proximal to a substrate during such a process can accumulate on a substrate surface before they can be swept through a gas circulation and filtration system.

Accordingly, in conjunction with a gas circulation and filtration system, various embodiments of a gas enclosure system of the present teachings can have a particle control system that can include components that can provide a low-particle zone proximal to a substrate during processing in a printing step. A particle control system for various embodiments of a gas enclosure system of the present teachings can include a gas circulation and filtration system, a low-particle-generating X-axis linear bearing system for moving a printhead assembly relative to a substrate, a service bundle housing exhaust system, and a printhead assembly exhaust system. For example, a gas enclosure system can have a gas circulation and filtration system internal a gas enclosure assembly.

Various embodiments of systems and methods of the present teachings can maintain a substantially low-particle environment providing for an average on-substrate distribution of particles of a particular size range of interest that does not exceed an on-substrate deposition rate specification. An on-substrate deposition rate specification can be set for each of a particle size range of interest of between about 0.1 μm and greater to about 10 μm and greater. In various embodiments systems and methods of the present teachings, an on-substrate particle deposition rate specification can be expressed as a limit of the number of particles deposited per square meter of substrate per minute for each of a target particle size range.

Various embodiments of an on-substrate particle deposition rate specification can be readily converted from a limit of the number of particles deposited per square meter of substrate per minute to a limit of the number of particles deposited per substrate per minute for each of a target particle size range. Such a conversion can be readily done through a known relationship between substrates, for example, of a specific generation-sized substrate and the corresponding area for that substrate generation. For example, Table 2 below summarizes aspect ratios and areas for some known generation-sized substrates. It should be understood that a slight variation of aspect ratio and hence size may be seen from manufacturer to manufacturer. However, regardless of such variation, a conversion factor for a specific generation-sized substrate and an area in square meters can be obtained any of a variety of generation-sized substrates.

TABLE 2

Correlation between area and substrate size

| Generation ID | X (mm) | Y (mm) | Area (m2) |
|---|---|---|---|
| Gen 3.0 | 550 | 650 | 0.36 |
| Gen 3.5 | 610 | 720 | 0.44 |
| Gen 3.5 | 620 | 750 | 0.47 |
| Gen 4 | 680 | 880 | 0.60 |
| Gen 4 | 730 | 920 | 0.67 |
| Gen 5 | 1100 | 1250 | 1.38 |
| Gen 5 | 1100 | 1300 | 1.43 |
| Gen 5.5 | 1300 | 1500 | 1.95 |
| Gen 6 | 1500 | 1850 | 2.78 |
| Gen 7.5 | 1950 | 2250 | 4.39 |
| Gen 8 | 2160 | 2400 | 5.18 |
| Gen 8 | 2160 | 2460 | 5.31 |
| Gen 8.5 | 2200 | 2500 | 5.50 |
| Gen 9 | 2400 | 2800 | 6.72 |
| Gen 10 | 2850 | 3050 | 8.69 |

Additionally, an on-substrate particle deposition rate specification expressed as a limit of the number of particles deposited per square meter of substrate per minute can be readily converted to any of a variety of unit time expressions. It will be readily understood that an on-substrate particle deposition rate specification normalized to minutes can be readily converted to any other expression of time through know relationships of time, for example, but not limited by, such as second, hour, day, etc. Additionally, units of time specifically relating to processing can be used. For example, a print cycle can be associated with a unit of time. For various embodiments of a gas enclosure system according to the present teachings a print cycle can be a period of time in which a substrate is moved into a gas enclosure system for printing and then removed from a gas enclosure system after printing is complete. For various embodiments of a gas enclosure system according to the present teachings a print cycle can be a period of time from the initiation of the alignment of a substrate with respect to a printhead assembly to the delivery of a last ejected drop of ink onto the substrate. In the art of processing, total average cycle time or TACT can be an expression of a unit of time for a particular process cycle. According to various embodiments of systems and methods of the present teachings, TACT for a print cycle can be about 30 seconds. For various embodiments of systems and methods of the present teachings, TACT for a print cycle can be about 60 seconds. In various embodiments of systems and methods of the present teachings, TACT for a print cycle can be about 90 seconds. For various embodiments of systems and methods of the present teachings, TACT for a print cycle can be about 120 seconds. In various embodiments of systems and methods of the present teachings, TACT for a print cycle can be about 300 seconds.

With respect to airborne particulate matter and particle deposition within a system, a substantial number of variables can impact developing a general model that may adequately compute, for example, an approximation of a value for particle fallout rate on a surface, such as a substrate, for any particular manufacturing system. Variables such as the size of particles, the distribution of particles of particular size; surface area of a substrate and the time of exposure of a substrate within a system can vary depending on various manufacturing systems. For example, the size of particles and the distribution of particles of particular size can be substantially impacted by the source and location of particle-generating components in various manufacturing systems. Calculations based on various embodiments of gas enclosure systems of the present teachings suggest that without various particle control systems of the present teachings, on-substrate deposition of particulate matter per print cycle per square meter of substrate can be between more than about 1 million to more than about 10 million particles for particles in a size range of 0.1 μm and greater. Such calculations suggest that that without various particle control systems of the present teachings, on-substrate deposition of particulate matter per print cycle per square meter of substrate can be between more than about 1000 to about more than about 10,000 particles for particles in a size range of about 2 μm and greater.

Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 10 μm in size. Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 5 μm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 2 μm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 1 μm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.5 μm in size. For various embodiments of a gas enclosure system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 μm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.1 μm in size.

It is contemplated that a wide variety of ink formulations can be printed within the inert, substantially low-particle environment of various embodiments of a gas enclosure system of the present teachings. During the manufacture of an OLED display, an OLED pixel can be formed to include an OLED film stack, which can emit light of a specific peak wavelength when a voltage is applied. An OLED film stack structure between an anode and a cathode can include a hole injection layer (HIL), a hole transport layer (HTL), an emissive layer (EL), an electron transport layer (ETL) and an electron injection layer (EIL). In some embodiments of an OLED film stack structure, an electron transport layer (ETL) can be combined with an electron injection layer (EIL) to form an ETL/EIL layer. According to the present teachings, various ink formulations for an EL for various color pixel EL films of an OLED film stack can be printed using, for example, inkjet printing. Additionally, for example, but not limited by, the HIL, HTL, EML, and ETL/EIL layers can have ink formulations that can be printed using inkjet printing.

It is further contemplated that an organic encapsulation layer can be printed on a substrate printing. It is contemplated that an organic encapsulation layer can be printed using inkjet printing, as inkjet printing can provide several advantages. First, a range of vacuum processing operations can be eliminated because such inkjet-based fabrication can be performed at atmospheric pressure. Additionally, during an inkjet printing process, an organic encapsulation layer can be localized to cover portions of an OLED substrate over and proximal to an active region, to effectively encapsulate an active region, including lateral edges of the active region. The targeted patterning using inkjet printing results in eliminating material waste, as well as eliminating additional processing typically required to achieve patterning of an organic layer. An encapsulation ink can comprise a in the polymer including, for example, but not limited by, an acrylate, methacrylate, urethane, or other material, as well as copolymers and mixtures thereof, which can be cured using thermal processing (e.g. bake), UV exposure, and combinations thereof. As used herein polymer and copolymer can include any form of a polymer component that can be formulated into an ink and cured on a substrate to form an organic encapsulation layer. Such polymeric components can include polymers, and copolymers, as well as precursors thereof, for example, but not limited by, monomers, oligomers, and resins.

Various embodiments of a gas enclosure assembly can have various frame members that are constructed to provide contour for a gas enclosure assembly. Various embodiments of a gas enclosure assembly of the present teachings can accommodate an OLED printing system, while optimizing the working space to minimize inert gas volume, and also allowing ready access to an OLED printing system from the exterior during processing. In that regard, various gas enclosure assemblies of the present teachings can have a contoured topology and volume. As will be discussed in more detail subsequently herein, various embodiments of a gas enclosure can be contoured around a printing system base, upon which a substrate support apparatus can be mounted. Further, a gas enclosure can be contoured around a bridge structure of a printing system used for the X-axis movement of a carriage assembly. As a non-limiting example, various embodiments of a contoured gas enclosure according to the present teachings can have a gas enclosure volume of between about 6 m3 to about 95 m3 for housing various embodiments of a printing system capable of printing substrate sizes from Gen 3.5 to Gen 10. By way a further non-limiting example, various embodiments of a contoured gas enclosure according to the present teachings can have a gas enclosure volume of between about 15 m3 to about 30 m3 for housing various embodiments of a printing system capable of printing, for example, Gen 5.5 to Gen 8.5 substrate sizes. Such embodiments of a contoured gas enclosure can be between about 30% to about 70% savings in volume in comparison to a non-contoured enclosure having non-contoured dimensions for width, length and height.

FIG. 1A depicts a perspective view gas enclosure assembly 1000 in accordance with various embodiments of a gas enclosure assembly of the present teachings. Gas enclosure assembly 1000 can include front panel assembly 1200, middle panel assembly 1300 and rear panel assembly 1400. Front panel assembly 1200 can include front ceiling panel assembly 1260, front wall panel assembly 1240, which can have opening 1242 for receiving a substrate, and front base panel assembly 1220. Rear panel assembly 1400 can include rear ceiling panel assembly 1460, rear wall panel assembly 1440 and rear base panel assembly 1420. Middle panel assembly 1300 can include first middle enclosure panel assembly 1340, middle wall and ceiling panel assembly 1360 and second middle enclosure panel assembly 1380, as well as middle base panel assembly 1320.

Additionally, as depicted in FIG. 1A, middle panel assembly 1300 can include first printhead management system substantially low particle environment, as well as a second printhead management system auxiliary panel assembly (not shown). Various embodiments of an auxiliary enclosure constructed as a section of a gas enclosure assembly can be sealably isolated from the working volume of a gas enclosure system. For various embodiments of systems and methods of the present teachings, an auxiliary enclosure can be less than or equal to about 1% of the enclosure volume of a gas enclosure system. In various embodiments of systems and methods of the present teachings, an auxiliary enclosure can be can be less than or equal to about 2% of the enclosure volume of a gas enclosure system. For various embodiments of systems and methods of the present teachings, an auxiliary enclosure can be less than or equal to about 5% of the enclosure volume of a gas enclosure system. In various embodiments of systems and methods of the present teachings, an auxiliary enclosure can be less than or equal to about 10% of the enclosure volume of a gas enclosure system. In various embodiments of systems and methods of the present teachings, an auxiliary enclosure can be less than or equal to about 20% of the enclosure volume of a gas enclosure system. Should the opening of an auxiliary enclosure to an ambient environment containing reactive gases be indicated for performing, for example, a maintenance procedure, isolating an auxiliary enclosure from the working volume of a gas enclosure can prevent contamination of the entire volume of a gas enclosure. Further, given the relatively small volume of an auxiliary enclosure in comparison to the printing system enclosure portion of a gas enclosure, the recovery time for an auxiliary enclosure can take significantly less time than recovery time for an entire printing system enclosure.

As depicted in FIG. 1B, gas enclosure assembly 1000 can include front base panel assembly 1220, middle base panel assembly 1320, and rear base panel assembly 1420, which when fully-constructed form a contiguous base or pan on which Printing system 2000 can be mounted. In a similar fashion as described for gas enclosure assembly 100 of FIG. A, the various frame members and panels comprising front panel assembly 1200, middle panel assembly 1300, and rear panel assembly 1400 of gas enclosure assembly 1000 can be joined around Printing system 2000 to form a printing system enclosure. Front panel assembly 1200 can be contoured around printing system 2000 mounted to form a first tunnel enclosure section of a gas enclosure. Similarly, rear panel assembly 1400 can be contoured around printing system 2000 to form a second tunnel enclosure section of a gas enclosure. Additionally, middle panel assembly 1300 can be contoured around a bridge section of a printing system 2000 to form a bridge enclosure section of a gas enclosure. Together, a first tunnel enclosure section, a second tunnel section and a bridge enclosure section can form a printing enclosure section. As will be discussed in more detail herein, according to the present teachings, an auxiliary enclosure can be sealably isolated from a printing system enclosure during, for example, a printing process for performing various measurement and maintenance tasks, with little or no interruption to the printing process.

Further, a fully constructed gas enclosure assembly, such as gas enclosure assembly 1000, when integrated with various environmental control systems can form various embodiments of a gas enclosure system including various embodiments of an OLED printing system, such as Printing system 2000. According to various embodiments of a gas enclosure system of the present teachings, environmental control of an interior volume defined by a gas enclosure assembly can include control of lighting, for example, by the number and placement of lights of a specific wavelength, control of particulate matter using various embodiments of a particle control system, control of reactive gas species using various embodiments of a gas purification system, and temperature control of a gas enclosure assembly using various embodiments of a thermal regulation system.

A printing system, such as printing system 2000 of FIG. 1B, shown in expanded view in FIG. 1C, can be comprised of several devices and apparatuses, which allow the reliable placement of ink drops onto specific locations on a substrate. These devices and apparatuses can include, but are not limited to, a printhead assembly, ink delivery system, a motion system for providing relative motion between a printhead assembly and a substrate, substrate support apparatus, substrate loading and unloading system, and printhead management system.

A printhead assembly can include at least one inkjet head, with at least one orifice capable of ejecting droplets of ink at a controlled rate, velocity, and size. The inkjet head is fed by an ink supply system which provides ink to the inkjet head. As shown in an expanded view of FIG. 1C, Printing system 2000 can have a substrate, such as substrate 2050, which can be supported by a substrate support apparatus, such as a chuck, for example, but not limited by, a vacuum chuck, a substrate floatation chuck having pressure ports, and a substrate floatation chuck having vacuum and pressure ports. In various embodiments of systems and methods of the present teachings, a substrate support apparatus can be a substrate floatation table. As will be discussed in more detail subsequently herein, substrate floatation table 2200 of FIG. 1C can be used for supporting substrate 2050, and in conjunction with a Y-axis motion system, can be part of a substrate conveyance system providing for the frictionless conveyance of substrate 2050. A Y-axis motion system of the present teachings can include first Y-axis support beam 2351 and second Y-axis support beam 2352, which can include a gripper system (not shown) for holding a substrate, as will be discussed in more detail herein. Y-axis motion can be provided by either a linear air bearing or linear mechanical system. Substrate floatation table 2200 of Printing system 2000 shown in FIG. 1B and FIG. 1C can define the travel of substrate 2050 through gas enclosure assembly 1000 of FIG. 1A during a printing process.

FIG. 1C illustrates generally an example of substrate floatation table 2200 for a printing system 2000 that can include a floating conveyance of a substrate, which can have a porous medium to provide floatation. In the example of FIG. 1C, a handler or other conveyance can be used to position a substrate 2050 in an input region 2201 of a substrate floatation table 2200, such as located on a conveyor. The conveyer can position the substrate 2050 at a specified location within the printing system such as using either mechanical contact (e.g., using an array of pins, a tray, or a support frame configuration), or using gas cushion to controllably float the substrate 2050 (e.g., an "air bearing" table configuration). A printing region 2202 of the substrate floatation table 2200 can be used to controllably deposit one or more layers on the substrate 2050 during fabrication. The printing region 2202 can also be coupled to an output region 2203 of the substrate floatation table 2200. The conveyer can extend along the input region 2201, the printing region 2202, and the output region 2203 of the substrate floatation table 2200, and the substrate 2050 can be repositioned as desired for various deposition tasks, or during a single deposition operation. The controlled environments nearby the input region 2201, the printing region 2202, and the output region 2203 can be commonly-shared.

The printing system 2000 of FIG. 1C can include one or more printhead devices 2505, each printhead device having one or more printheads; e.g., nozzle printing, thermal jet or ink-jet type. The one or more printhead devices 2505 can be coupled to or otherwise traversing an overhead carriage, such as first X-axis carriage assembly 2301. For various embodiments of printing system 2000 of the present teachings, one or more printheads of one or more printhead devices 2505 can be configured to deposit one or more patterned organic layers on the substrate 2050 in a "face up" configuration of the substrate 2050. Such layers can include one or more of an electron injection or transport layer, a hole injection or transport layer, a blocking layer, or an emission layer, for example. Such materials can provide one or more electrically functional layers.

According to the floatation schemes shown in FIG. 1C, in an example where the substrate 2050 is supported exclusively by the gas cushion, a combination of positive gas pressure and vacuum can be applied through the arrangement of ports or using a distributed porous medium. Such a zone having both pressure and vacuum control can effectively provide a fluidic spring between the conveyor and a substrate. A combination of positive pressure and vacuum control can provide a fluidic spring with bidirectional stiffness. The gap that exists between the substrate (e.g., substrate 2050) and a surface can be referred to as the "fly height," and such a height can be controlled or otherwise established by controlling the positive pressure and vacuum port states. In this manner, the substrate Z-axis height can be carefully controlled in, for example, the printing region 2202. In some embodiments, mechanical retaining techniques, such as pins or a frame, can be used to restrict lateral translation of the substrate while the substrate is supported by the gas cushion. Such retaining techniques can include using spring loaded structures, such as to reduce the instantaneous forces incident the sides of the substrate while the substrate is being retained; this can be beneficial as a high force impact between a laterally translating substrate and a retaining means can cause substrate chipping or even catastrophic breakage.

Elsewhere, as illustrated generally in FIG. 1C, such as where the fly height need not be controlled precisely, pressure-only floatation zones can be provided, such as along the conveyor in the input or output regions 2100 or 2300, or elsewhere. A "transition" zone can be provided such as where a ratio of pressure to vacuum nozzles increases or decreases gradually. In an illustrative example, there can be an essentially uniform height between a pressure-vacuum zone, a transition zone, and a pressure only zone, so that within tolerances, the three zones can lie essentially in one plane. A fly height of a substrate over pressure-only zones elsewhere can be greater than the fly height of a substrate over a pressure-vacuum zone, such as in order to allow enough height so that a substrate will not collide with a floatation table in the pressure-only zones. In an illustrative example, an OLED panel substrate can have a fly height of between about 150 micrometers ($\mu$) to about 300$\mu$ above pressure-only zones, and then between about 30$\mu$ to about 50$\mu$ above a pressure-vacuum zone. In an illustrative example, one or more portions of the substrate floatation table 2200 or other fabrication apparatus can include an "air bearing" assembly provided by NewWay® Air Bearings (Aston, Pa., United States of America).

A porous medium can be used to establish a distributed pressurized gas cushion for floating conveyance or support of the substrate 2050 during one or more of printing, buffering, drying, or thermal treatment. For example, a porous medium "plate" such as coupled to or included as a portion of a conveyor can provide a "distributed" pressure to support the substrate 2050 in a manner similar to the use of individual gas ports. The use of a distributed pressurized gas cushion without using large gas port apertures can in some instances further improve uniformity and reduce or minimize the formation of mura or other visible defects, such as in those instances where the use of relatively large gas ports to create a gas cushion leads to non-uniformity, in spite of the use of a gas cushion.

A porous medium can be obtained such as from Nano TEM Co., Ltd. (Niigata, Japan), such as having physical dimensions specified to occupy an entirety of the substrate 2050, or specified regions of the substrate such as display regions or regions outside display regions. Such a porous medium can include a pore size specified to provide a desired pressurized gas flow over a specified area, while reducing or eliminating mura or other visible defect formation.

Printing requires relative motion between the printhead assembly and the substrate. This can be accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. A printhead management system can be comprised of several subsystems which allow for such measurement tasks, such as the checking for nozzle firing, as well as the measurement of drop volume, velocity and trajectory from every nozzle in a printhead, and maintenance tasks, such as wiping or blotting the inkjet nozzle surface of excess ink, priming and purging a printhead by ejecting ink from an ink supply through the printhead and into a waste basin, and replacement of printheads. Given the variety of components that can comprise an OLED printing system, various embodiments of OLED printing system can have a variety of footprints and form factors.

With respect to FIG. 1C, printing system base 2100, can include first riser 2120 and second riser 2122, upon which bridge 2130 is mounted. For various embodiments of Printing system 2000, bridge 2130 can support first X-axis carriage assembly 2301 and second X-axis carriage assembly 2302, which can control the movement of first printhead assembly 2501 and second printhead assembly 2502, respectively across bridge 2130. For various embodiments of printing system 2000, first X-axis carriage assembly 2301 and second X-axis carriage assembly 2302 can utilize a linear air bearing motion system, which are intrinsically low-particle generating. According to various embodiments of a printing system of the present teachings, an X-axis carriage can have a Z-axis moving plate mounted thereupon. In FIG. 1C, first X-axis carriage assembly 2301 is depicted with first Z-axis moving plate 2310, while second X-axis carriage assembly 2302 is depicted with second Z-axis moving plate 2312. Though FIG. 1C depicts two carriage assemblies and two printhead assemblies, for various embodiments of Printing system 2000, there can be a single carriage assembly and a single printhead assembly. For example, either of first printhead assembly 2501 and second printhead assembly 2502 can be mounted on an X,Z-axis carriage assembly, while a camera system for inspecting features of substrate 2050 can be mounted on a second X,Z-axis carriage assembly. Various embodiments of Printing system 2000 can have a single printhead assembly, for example, either of first printhead assembly 2501 and second printhead assembly 2502 can be mounted on an X,Z-axis carriage assembly, while a UV lamp for curing an encapsulation layer printed on substrate 2050 can be mounted on a second X,Z-axis carriage assembly. For various embodiments of Printing system 2000, there can be a single printhead assembly, for example, either of first printhead assembly 2501 and second printhead assembly 2502, mounted on an X,Z-axis carriage assembly, while a heat source for curing an encapsulation layer printed on substrate 2050 can be mounted on a second carriage assembly.

In FIG. 1C, each printhead assembly, such as first printhead assembly 2501 and second printhead assembly 2502 of FIG. 1C, can have a plurality of printheads mounted in at least one printhead device, as depicted in partial view for first printhead assembly 2501, which depicts a plurality of printhead devices 2505. A printhead device can include, for example, but not limited by, fluidic and electronic connections to at least one printhead; each printhead having a plurality of nozzles or orifices capable of ejecting ink at a controlled rate, velocity and size. For various embodiments of printing system 2000, a printhead assembly can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 pL to about 200 pL.

According to various embodiments of a gas enclosure system of the present teachings, given the sheer number of printhead devices and printheads, first printhead management system 2701 and second printhead management system 2702 can be housed in an auxiliary enclosure, which can be isolated from a printing system enclosure during a printing process for performing various measurement and maintenance tasks with little or no interruption to the printing process. As can be seen in FIG. 1C, first printhead assembly 2501 can be seen positioned relative to first printhead management system 2701 for ready performance of various measurement and maintenance procedures that can be performed by first printhead management system apparatuses 2707, 2709 and 2711. Apparatuses 2707, 2709, and 2011 can be any of a variety of subsystems or modules for performing various printhead management functions. For example apparatuses 2707, 2709, and 2011 can be any of a drop measurement module, a printhead replacement module, a purge basin module, and a blotter module. As depicted in FIG. 1C, first printhead management system 2701 can have apparatuses 2707, 2709 and 2711, which can be mounted on linear rail motion system 2705 for positioning relative to first printhead assembly 2501. Similarly, various apparatuses housed within second printhead management system 2702 can be mounted on linear rail motion system 2706 for positioning relative to first printhead assembly 2502.

With respect to various embodiments of a gas enclosure assembly having an auxiliary enclosure that can be closed off from, as well as sealably isolated from a first working volume, for example, a printing system enclosure, reference is made again to FIG. 1B. As depicted in FIG. 1C, there can be four isolators on Printing system 2000; first isolator set 2110 (second not shown on opposing side) and second isolator set 2112 (second not shown on opposing side), which support substrate floatation table 2200 of Printing system 2000. For gas enclosure assembly 1000 of FIG. 1B, first isolator set 2110 and second isolator set 2112 can be mounted in each of a respective isolator well panel, such as first isolator wall panel 1325 and second isolator wall panel 1327 of middle base panel assembly 1320. For gas enclosure assembly 1000 of FIG. 1B, middle base assembly 1320 can include first printhead management system auxiliary panel assembly 1330, as well as second printhead management system auxiliary panel assembly 1370. FIG. 1B of gas enclosure assembly 1000 depicts first printhead management system auxiliary panel assembly 1330 that can include first back wall panel assembly 1338. Similarly, also depicted is second printhead management system auxiliary panel assembly 1370 that can include second back wall panel assembly 1378. First back wall panel assembly 1338 of first printhead management system auxiliary panel assembly 1330 can be constructed in a similar fashion as shown for second back wall panel assembly 1378. Second back wall panel assembly 1378 of second printhead management system auxiliary panel assembly 1370 can be constructed from second back wall frame assembly 1378 having second seal-support panel 1375 sealably mounted to second back wall frame assembly 1378. Second seal-support panel 1375 can have second passage 1365, which is proximal to a second end of base 2100 (not shown). Second seal 1367 can be mounted on second seal-support panel 1375 around second passage 1365. A first seal can be similarly positioned and mounted around a first passage for first printhead management system auxiliary panel assembly 1330. Each passage in auxiliary panel assembly 1330 and auxiliary panel assembly 1370 can accommodate a printhead management system platform, such as first and second printhead management system platforms 2703 and 2704 of FIG. 1C pass through the passages. According to the present teachings, in order to sealably isolate auxiliary panel assembly 1330 and auxiliary panel assembly 1370 the passages, such as second passage 1365 of FIG. B must be sealable. It is contemplated that various seals, such as an inflatable seal, a bellows seal and a lip seal can be used for sealing a passage, such as second passage 1365 of FIG. 1B, around a printhead management system platform affixed to a printing system base.

First printhead management system auxiliary panel assembly 1330 and second printhead management system auxiliary panel assembly 1370 can include first printhead assembly opening 1342 of first floor panel assembly 1341 and second printhead assembly opening 1382 of second floor panel assembly 1381; respectively. First floor panel assembly 1341 is depicted in FIG. 1B as part of first middle enclosure panel assembly 1340 of middle panel assembly 1300. First floor panel assembly 1341 is a panel assembly in common with both first middle enclosure panel assembly 1340 and first printhead management system auxiliary panel assembly 1330. Second floor panel assembly 1381 is depicted in FIG. 1B as part of second middle enclosure panel assembly 1380 of middle panel assembly 1300. Second floor panel assembly 1381 is a panel assembly in common with both second middle enclosure panel assembly 1380 and second printhead management system auxiliary panel assembly 1370.

As previously discussed herein, first printhead assembly 2501 can be housed in first printhead assembly enclosure 2503, and second printhead assembly 2502 can be housed in second printhead assembly enclosure 2504. According to systems and methods of the present teachings, first printhead assembly enclosure 2503 and second printhead assembly enclosure 2504 can have an opening at the bottom that can have a rim (not shown), so that various printhead assemblies can be positioned for printing during a printing process. Additionally, the portions of first printhead assembly enclosure 2503 and second printhead assembly enclosure 2504 forming a housing can be constructed as previously described for various panel assemblies, so that the frame assembly members and panels are capable of providing a hermetically-sealed enclosure.

A compressible gasket which can additionally be used for the hermetic sealing of various frame members, can be affixed around each of first printhead assembly opening 1342 and second printhead assembly opening 1382, or alternatively around the rim of first printhead assembly enclosure 2503 and second printhead assembly enclosure 2504.

According to the present teachings, compressible gasket material can be selected from, for example, but not limited by, any in the class of closed-cell polymeric materials, also referred to in the art as expanded rubber materials or expanded polymer materials. Briefly, a closed-cell polymer is prepared in a fashion whereby gas is enclosed in discrete cells; where each discrete cell is enclosed by the polymeric material. Properties of compressible closed-cell polymeric gasket materials that are desirable for use in gas-tight sealing of frame and panel components include, but are not limited by, that they are robust to chemical attack over a wide range of chemical species, possess excellent moisture-barrier properties, are resilient over a broad temperature range, and they are resistant to a permanent compression set. In general, compared to open-cell-structured polymeric materials, closed-cell polymeric materials have higher dimensional stability, lower moisture absorption coefficients, and higher strength. Various types of polymeric materials from which closed-cell polymeric materials can be made include, for example, but not limited by, silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof.

In addition to close-cell compressible gasket materials, another example of a class of compressible gasket material having desired attributes for use in constructing embodiments of a gas enclosure assembly according to the present teachings includes the class of hollow-extruded compressible gasket materials. Hollow-extruded gasket materials as a class of materials have the desirable attributes, including, but not limited by, that they are robust to chemical attack over a wide range of chemical species, possess excellent moisture-barrier properties, are resilient over a broad temperature range, and they are resistant to a permanent compression set. Such hollow-extruded compressible gasket materials can come in a wide variety of form factors, such as for example, but not limited by, U-cell, D-cell, square-cell, rectangular-cell, as well as any of a variety of custom form factor hollow-extruded gasket materials. Various hollow-extruded gasket materials can be fabricated from polymeric materials that are used for closed-cell compressible gasket fabrication. For example, but not limited by, various embodiments of hollow-extruded gaskets can be fabricated from silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof. Compression of such hollow cell gasket materials should not exceed about 50% deflection in order to maintain the desired attributes. It is contemplated that various types of inflatable seals can be utilized for sealing a printhead assembly using first printhead assembly docking gasket 1345 and second printhead assembly docking gasket 1385. Such inflatable seals may provide rapid sealing and unsealing during processing, as well as being fabricated from low-contamination materials, such as low particle generating, low outgassing polymeric materials, such as silicones, neoprenes and butyl rubber materials.

As depicted in FIG. 1B, first printhead assembly docking gasket 1345 and second printhead assembly docking gasket 1385 can be affixed around first printhead assembly opening 1342 and second printhead assembly opening 1382, respectively. During various printhead measurement and maintenance procedures, first printhead assembly 2501 and second printhead assembly 2502 can be positioned by first X,Z-axis carriage assembly 2301 and second X,Z-axis carriage assembly 2302, respectively, over first printhead assembly opening 1342 of first floor panel assembly 1341 and second printhead assembly opening 1382 of second floor panel assembly 1381, respectively. In that regard, for various printhead measurement and maintenance procedures, first printhead assembly 2501 and second printhead assembly 2502 can be positioned over first printhead assembly opening 1342 of first floor panel assembly 1341 and second printhead assembly opening 1382 of second floor panel assembly 1381, respectively, without covering or sealing first printhead assembly opening 1342 and second printhead assembly opening 1382. First X,Z-axis carriage assembly 2301 and second X,Z-axis carriage assembly 2302 can dock first printhead assembly enclosure 2503 and second printhead assembly enclosure 2504, respectively, with first printhead management system auxiliary panel assembly 1330 and second printhead management system auxiliary panel assembly 1370, respectively. In various printhead measurement and maintenance procedures, such docking may effectively close first printhead assembly opening 1342 and second printhead assembly opening 1382 without the need for sealing first printhead assembly opening 1342 and second printhead assembly opening 1382. For various printhead measurement and maintenance procedures, the docking can include the formation of a gasket seal between each of the printhead assembly enclosures and the printhead management system panel assemblies. In conjunction with sealably closing passages, such as second passage 1365 and a complementary first passage of FIG. 1B, when first printhead assembly enclosure 2503 and second printhead assembly enclosure 2504 are docked with first printhead management system auxiliary panel assembly 1330 and second printhead management system auxiliary panel assembly 1370 to sealably close first printhead assembly opening 1342 and second printhead assembly opening 1382, the combined structures so formed are hermetically sealed.

Additionally, according to the present teachings, an auxiliary enclosure can be isolated from, for example, another interior enclosure volume, such as the printing system enclosure, as well as the exterior of a gas enclosure assembly, by using a structural closure to sealably close a passageway, such as first printhead assembly opening 1342 and second printhead assembly opening 1382 of FIG. 1B. According to the present teachings, a structural closure can include a variety of sealable coverings for an opening or passageway; such opening or passageway including non-limiting examples of an enclosure panel opening or passageway. According to systems and methods of the present teachings, a gate can be any structural closure that can be used to reversibly cover or reversibly sealably close any opening or passageway using pneumatic, hydraulic, electrical, or manual actuation. As such, first printhead assembly opening 1342 and second printhead assembly opening 1382 of FIG. 1B can be reversibly covered or reversibly sealably closed using a gate.

In the expanded view of Printing system 2000 of FIG. 1C, various embodiments of a printing system can include substrate floatation table 2200, supported by substrate floatation table base 2220. Substrate floatation table base 2220 can be mounted on printing system base 2100. Substrate floatation table 2200 of OLED printing system can support substrate 2050, as well as defining the travel over which substrate 2050 can be moved through gas enclosure assembly 1000 during the printing of an OLED substrate. A Y-axis motion system of the present teachings can include first Y-axis support beam 2351 and second Y-axis support beam 2352, which can include a gripper system (not shown) for holding a substrate, which will be discussed in more detail herein. Y-axis motion can be provided by either a linear air bearing or linear mechanical system. In that regard, in conjunction with a motion system; as depicted in FIG. 1C, a Y-axis motion system, substrate floatation table 2200 can provide frictionless conveyance of substrate 2050 through a printing system.

Figure 1D:
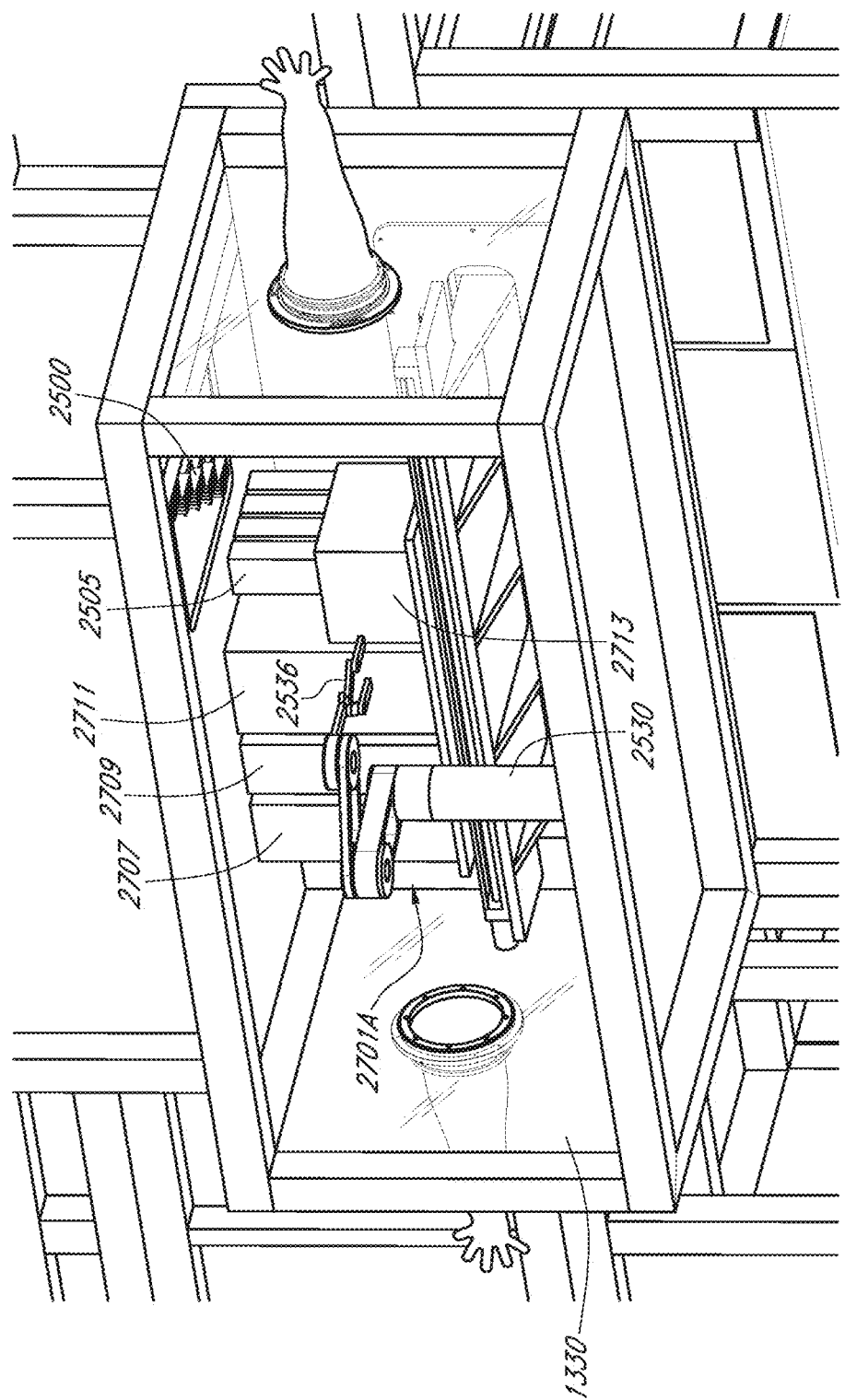

FIG. 1D depicts an expanded view of first printhead management system 2701 housed within first printhead management system auxiliary panel assembly 1330 in accordance with various embodiments of a gas enclosure assembly and system of the present teachings. As depicted in FIG. 1D auxiliary panel assembly 1330 is shown as a cut-away view to more clearly see the details of first printhead management system 2701. Various embodiments of a printhead management system according to the present teachings, such as first printhead management system 2701 of FIG. 1D, apparatuses 2707, 2709, and 2011 can be a variety of subsystems or modules for performing various functions. For example, apparatuses 2707, 2709, and 2011 can be a drop measurement module, a printhead purge basin module and a blotter module. As depicted in FIG. 1D, printhead replacement module 2713 can provide locations for docking at least one printhead device 2505. In various embodiments of first printhead management system 2701, first printhead management system auxiliary panel assembly 1330 can be maintained to the same environmental specifications that gas enclosure assembly 1000 (see FIG. 1A) is maintained. First printhead management system auxiliary panel assembly 1330 can have handler 2530 positioned for the carrying out tasks associated with various printhead management procedures. For example, each subsystem can have various parts that are consumable by nature, and require replacement, such as replacing blotter paper, ink, and waste reservoirs. Various consumable parts can be packaged for ready insertion, for example, in a fully automated mode using a handler. As a non-limiting example, blotter paper can be packaged in a cartridge format, which can be readily inserted for use into a blotting module. By way of another non-limiting example ink can be packaged in a replaceable reservoir, as well as a cartridge format for use in a printing system. Various embodiments of a waste reservoir can be packaged in a cartridge format, which can be readily inserted for use into a purge basin module. Additionally, parts of various components of a printing system subject to on-going use can require periodic replacement. During a printing process, expedient management of a printhead assembly, for example, but not limited by, an exchange of a printhead device or printhead, can be desirable. A printhead replacement module can have parts, such as a printhead device or printhead, which can be readily inserted for use into a printhead assembly. A drop measurement module used for checking for nozzle firing, as well as the measurement based on optical detection of drop volume, velocity and trajectory from every nozzle can have a source and a detector, which can require periodic replacement after use. Various consumable and high-usage parts can be packaged for ready insertion, for example, in a fully automated mode using a handler. Handler 2530 can have end effector 2536 mounted to arm 2534. Various embodiments of an end effector configuration can be used, for example, a blade-type end effector, a clamp-type end effector, and a gripper-type end effector. Various embodiments of an end effector can include mechanical grasping and clamping, as well as pneumatic or vacuum-assisted assemblies to either actuate portions of the end effector or otherwise retain a printhead device or a printhead from a printhead device.

Regarding the replacement of a printhead device or printhead, printhead replacement module 2713 of printhead management system 2701 FIG. 1D can include a docking station for a printhead device having at least one printhead, as well as a storage receptacle for a printhead. As each printhead assembly (see FIG. 1B) can include between about 1 to about 60 printhead devices, and as each printhead device can have between about 1 to about 30 printheads, then various embodiments of a printing system of the present teachings can have between about 1 to about 1800 printheads. In various embodiments of printhead replacement module 2713, while a printhead device is docked, each printhead mounted to the printhead device can be maintained in an operable condition while not in use in a printing system. For example, when placed in a docking station, each printhead on each printhead device can be connected to an ink supply and an electrical connection. Electrical power can be provided to each printhead on each printhead device, so that a periodic firing pulse to each nozzle of each printhead can be applied while docked in order to ensure that the nozzles remain primed and do not clog. Handler 2530 of FIG. 1D can be positioned proximal to printhead assembly 2500. Printhead assembly 2500 can be docked over first printhead management system auxiliary panel assembly 1330, as depicted in FIG. 1D. During a procedure for exchanging a printhead, handler 2530 can remove a target part; either a printhead or printhead device having at least one printhead, from printhead assembly 2500. Handler 2530 can retrieve a replacement part, such as a printhead device or a printhead, from printhead replacement module 2713, and complete the replacement process. The removed part can be placed in printhead replacement module 2713 for retrieval.

Figure 2A:
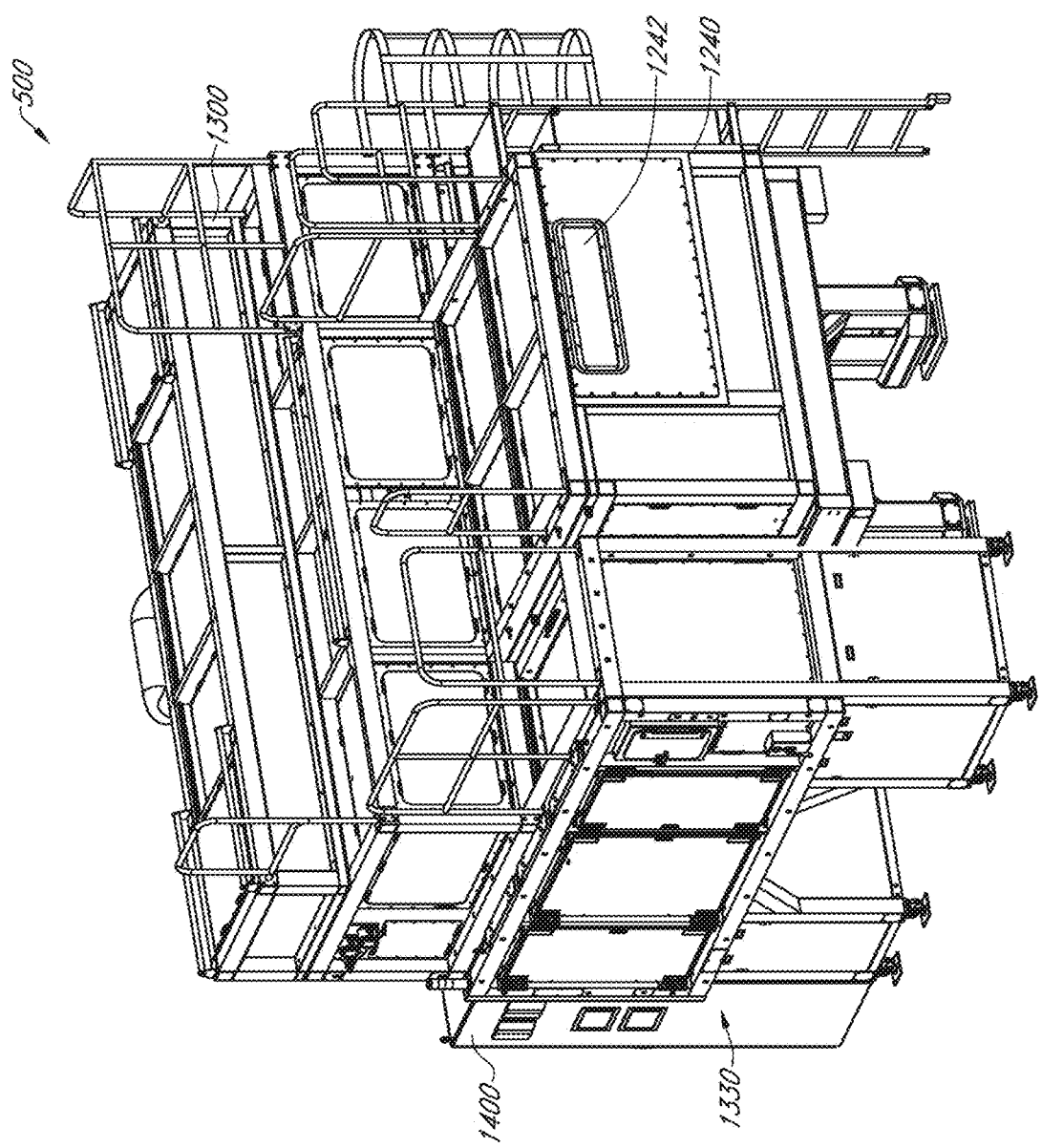
FIG. 2A is a front perspective view of a gas enclosure assembly in accordance with various embodiments of the present teachings.

In FIG. 2A, gas enclosure system 500 can have first tunnel enclosure section 1200, which can have inlet gate 1242 for receiving a substrate, bridge enclosure section 1300, and second tunnel enclosure section 1400, which together can form a printing system enclosure. Additionally, gas enclosure system 500 can have auxiliary enclosure 1330. Auxiliary enclosure 1330 can be sealably isolated from the printing system enclosure of gas enclosure system 500. For example, during a printing process, auxiliary enclosure 1330 can be sealably isolated from the printing system enclosure of gas enclosure system 500 for performing various measurement and maintenance tasks, with little or no interruption to the printing process. As will be discussed in more detail subsequently herein in discussion of FIG. 8, purified inert gas from a purification system, such as purification system 3130 of FIG. 8, can circulate into a printing system enclosure of gas enclosure system 500, as well as auxiliary enclosure 1300.

For various embodiments of a printing system of the present teachings, a printhead assembly can include between about 1 to about 60 printhead devices. Recalling, a printhead device can include, for example, but not limited by, fluidic and electronic connections to at least one printhead; each printhead having a plurality of nozzles or orifices capable of ejecting ink at a controlled rate, velocity and size, where each printhead device can have between about 1 to about 30 printheads in each printhead device. A printhead, for example, an industrial inkjet head, can have between about 16 to about 2048 nozzles, which can expel a droplet volume of between about 0.1 pL to about 200 pL. Given the sheer number of printhead devices and printheads, an auxiliary enclosure can house various embodiments of a printhead management system. According to the present teachings, an auxiliary enclosure can be isolated from a printing system enclosure during a printing process for performing various measurement and maintenance tasks, for example, but not limited by, using various devices and apparatuses of a printhead management system. As such, various measurement and maintenance tasks can be performed with little or no interruption to the printing process.

Figure 2B:
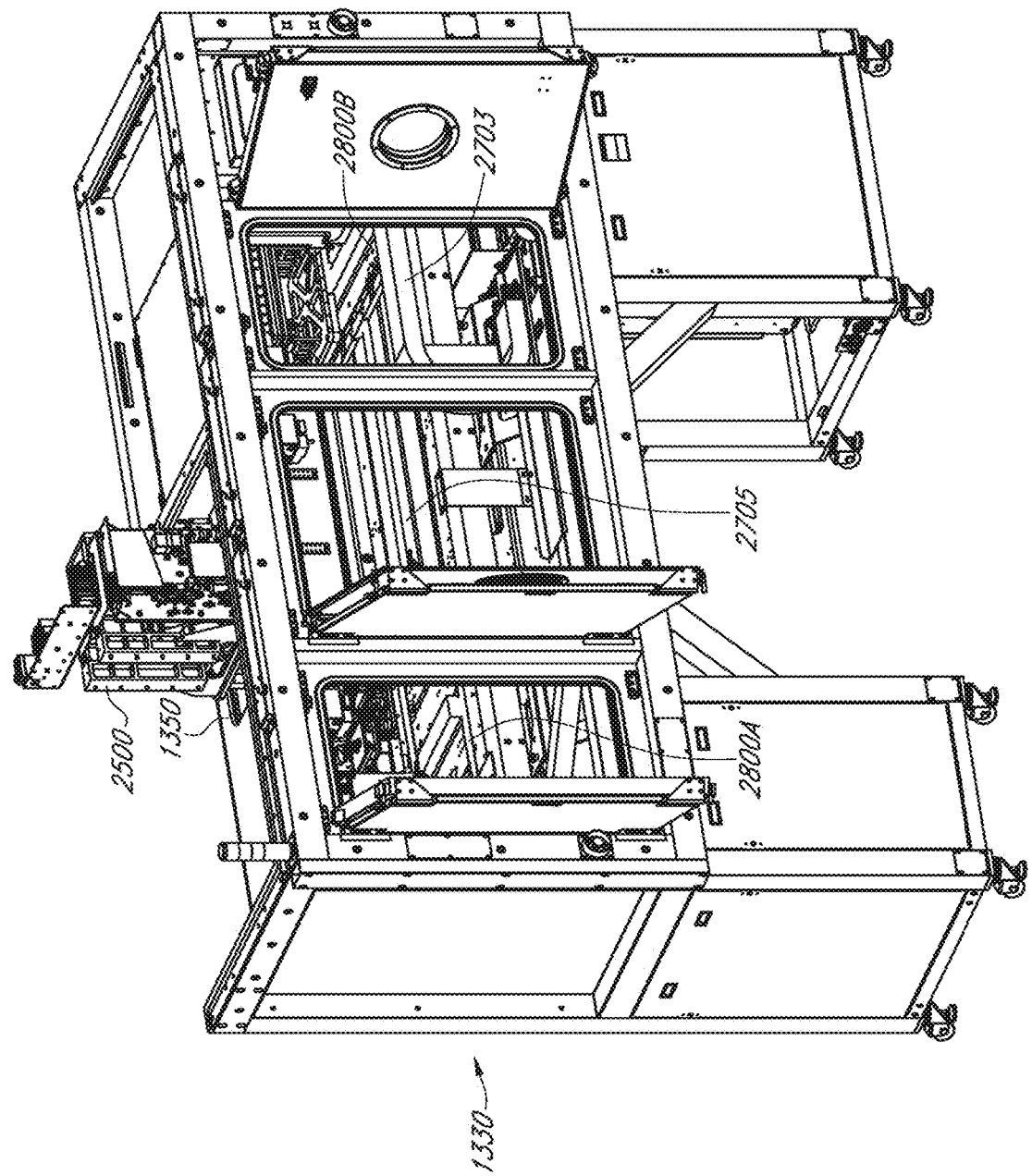
FIG. 2B is a partially exploded perspective view of an auxiliary enclosure of a gas enclosure system according to various embodiments of the present teachings.

FIG. 2B depicts a perspective view of auxiliary enclosure 1330 of a gas enclosure system according to various embodiments of the present teachings. Auxiliary enclosure 1330 can be an embodiment of an auxiliary enclosure that can be utilized with, for example, but not limited by, various gas enclosure systems of the present teachings, such as gas enclosure system 1000 of FIG. 1A and gas enclosure system 500 of FIG. 2A. As shown in FIG. 2B, auxiliary enclosure 1330 can have printhead management system platform 2703, which can have linear rail system 2705 for positioning various devices and apparatuses used for various measurement and maintenance procedures relative to various printhead devices of a printhead assembly. For example, in the partially exploded view of FIG. 2B, printhead assembly 2500 is shown positioned over printhead assembly opening 1350. Printhead assembly 2500 can have a plurality of printhead devices, such as 2505A, 2505B, and 2505C, shown in FIG. 2C. First motion system platform 2800A and second motion system platform 2800B can be used to position various devices and apparatuses used for various measurement and maintenance procedures mounted on the motion system platforms relative to each of the plurality of printhead devices of printhead assembly 2500.

Figure 2C:
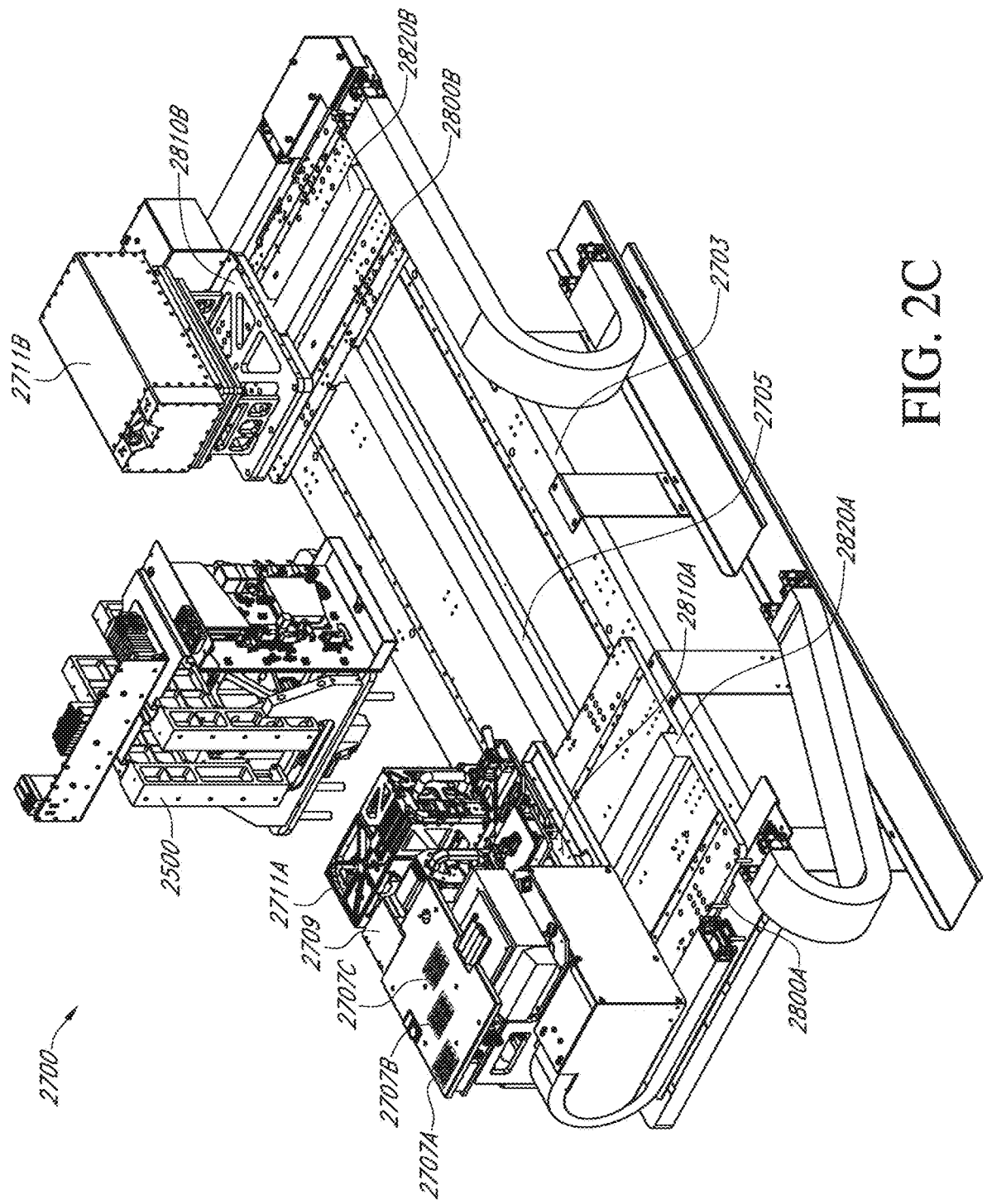
FIG. 2C is a partially exploded top perspective view of an auxiliary enclosure of a gas enclosure system according to various embodiments of the present teachings.

The partially exploded view of FIG. 2C depicts a top perspective view of printhead management system 2700 in relationship to printhead assembly 2500. As depicted in FIG. 2C, first motion system platform 2800A and second motion system platform 2800B can be moved along an Y-axis direction on linear rail system 2705. In that fashion, linear rail system 2705 can position various devices and apparatuses mounted on the motion system platforms relative to each of printhead devices 2505A, 2505B, and 2505C of printhead assembly 2500. First motion system platform 2800A can support first X-axis motion system platform 2810A, which can have first X-axis linear rail system 2820A. First X-axis linear rail system 2820A can move various apparatuses mounted upon first X-axis motion system platform 2810A in a direction orthogonal to the direction of first motion system platform 2800A on linear rail system 2705. Similarly, second motion system platform 2800B can support second X-axis motion system platform 2810B, which can have second X-axis linear rail system 2820B. Second X-axis linear rail system 2820B can move various apparatuses mounted upon second X-axis motion system platform 2810B in a direction orthogonal to the direction of second motion system platform 2800B on linear rail system 2705. In that regard, the X,Y motion of first motion system platform 2800A and first X-axis motion system platform 2810A, as well as the X,Y motion of second motion system platform 2800B and second X-axis motion system platform 2810B can provide accurate X,Y positioning of various devices and apparatuses relative to each of printhead devices 2505A, 2505B, and 2505C.

As depicted in FIG. 2C, various devices mounted on first X-axis motion system platform 2810A of first motion system platform 2800A can include purge basins 2707A, 2707B and 2707C for each of printhead device 2505A, 2505B, and 2505C, as well as blotting station 2709. Depicted in FIG. 2C for providing calibration information are first drop measurement module 2711A, mounted on first X-axis motion system platform 2810A of first motion system platform 2800A and second drop measurement module 2711B, mounted on second X-axis motion system platform 2810B of second motion system platform 2800B. First drop measurement system 2711A can be based on, for example, but not limited by, printing drops from each nozzle of each printhead of each printhead device on a film under specified conditions, and then imaging the film. Information such as drop volume, speed and trajectory can be obtained through image analysis of data so obtained. Alternatively, second drop measurement system 2711B can be based on, for example, but not limited by, and optical measurement system. For example, drop volume, velocity and trajectory for each drop from each nozzle of each printhead of each printhead device can be determined using a laser light scattering technique, such as phase Doppler analysis (PDA) and phase Doppler interferometry (PDI).

Figure 3:
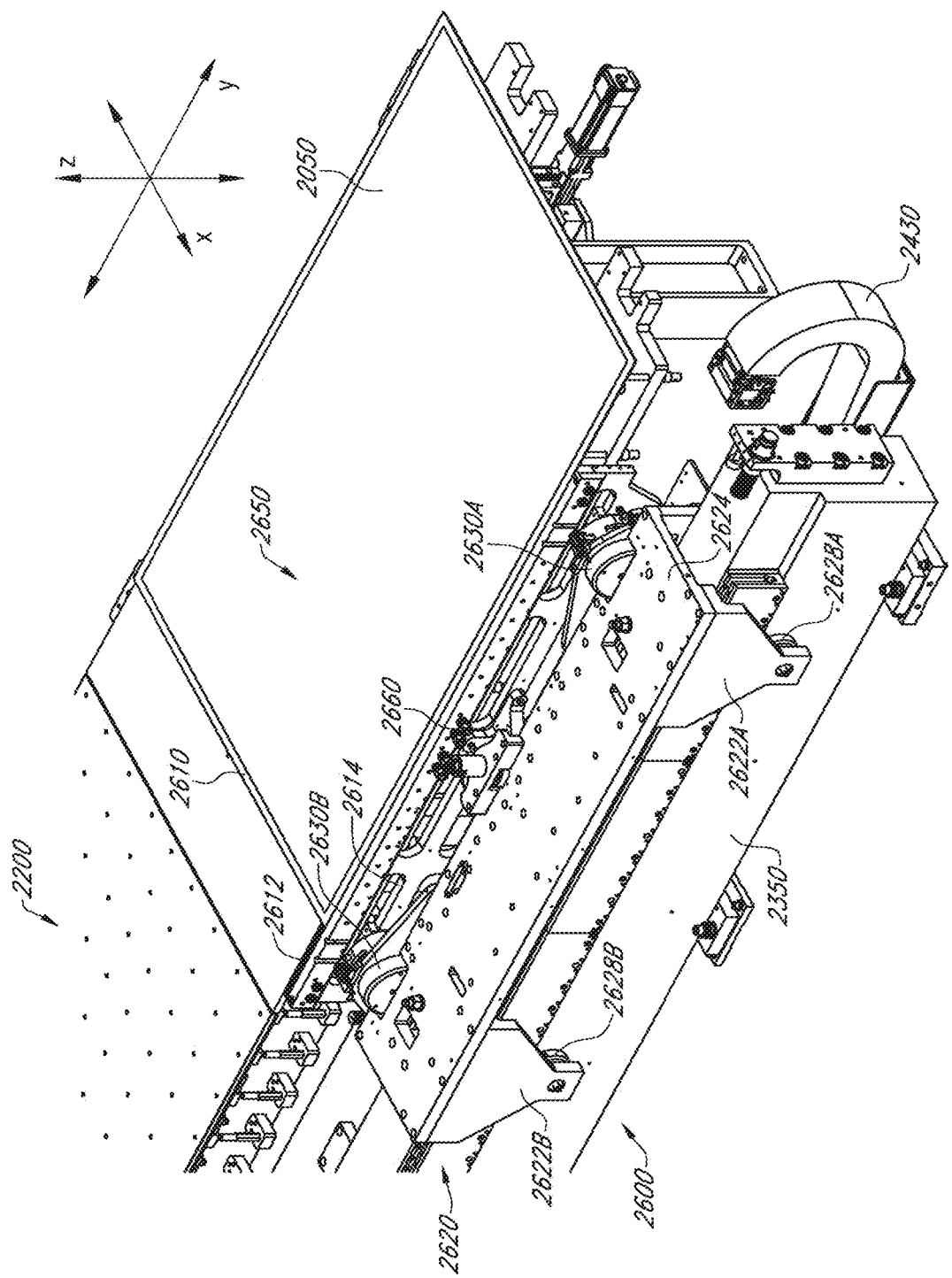
FIG. 3 is an expanded iso view of a printing system according to the present teaching, showing a Y-axis motion system.

FIG. 3 depicts a Y-axis motion system according to the present teachings, depicted in FIG. 3 as mounted upon Y-axis beam 2350, which can be, for example, a granite beam. As depicted in the coordinate system, a substrate, such as 2050, which is mounted on floatation table 2200, can travel in a +/−Y-axis direction. Floatation table 2200 provides frictionless, low-particle generating substrate support of substrate 2050 with precision Z-axis fly height, while Y-axis motion system 2600 provides frictionless, low-particle Y-axis conveyance of substrate 2050 relative to a printhead assembly, such as printhead assembly 2501 of FIG. 1C.

Various embodiments of low-particle generating Y-axis motion systems of the present teachings utilized in conjunction with a floatation table can be compared to, for example, a chuck mounted on a large turntable. In the case of a chuck mounted on a large turntable, large motors would be required in the operation of the large turntable, which would result in significant heat dissipation, as well as particle generation due to the movement of solid parts against solid parts. In the case of various embodiments of a gripper system of the present teachings, the only inertia in the system is the mass of a substrate and the gripper assembly, so that any linear motor required for Y-axis movement is substantially smaller than for a chuck mounted on a turntable.

Moreover, the inventors have discovered that Y-axis beam 2350, even though manufactured to provide surfaces that are both flat and parallel to a high degree, may produce excursions in travel that may be unacceptable for the intended use for the precision of orientation of a substrate with respect to the theta-Z (θ-Z) axis during Y-axis travel. For example, but not limited by, printing an ink into a pixel of an OLED device substrate is a process requiring precision orientation of a substrate in the axis of travel for which a beam manufactured to high tolerances of flatness and parallelism may still produce unacceptable excursions in substrate orientation during travel. As such, various embodiments of a Y-axis motion system 2600 of the present teachings utilizing an air bearing motion system for conveying Y-axis carriage assembly 2620 can provide reliable, accurate low-particle generating Y-axis conveyance of a substrate, providing operation at high speed with fast acceleration and deceleration, as well as obviating the need for dissipation of excess heat contamination in a gas enclosure system. Additionally, gripper motion control assembly 2650 of Y-axis motion system 2600 can provide dynamic rotation of the orientation of a substrate about the theta-Z (θ-Z) axis during Y-axis travel to maintain a high degree of precision for substrate orientation parallel to the axis of travel. Accordingly, gripper motion control assembly 2650 of Y-axis motion system 2600 can maintain substrate orientation with a high degree of precision parallel to the Y-axis direction of travel in a horizontal plane determined, for example, by the fly height of a substrate.

As shown in FIG. 3, various embodiments of linear Y-axis motion system 2600 can include substrate gripper assembly 2610, Y-axis carriage assembly 2620, as well as gripper motion control assembly 2650. In FIG. 3, gripper assembly 2610, can include a substrate gripping surface, for example, but not limited by, such as vacuum chuck bar 2612, which can be supported on substrate gripper frame 2614. Substrate gripper frame 2614 can be mounted to Y-axis carriage assembly 2620 of a Y-axis motion system assembly 2600. In FIG. 3, first air-bearing puck 2628A and second air-bearing puck 2628B of Y-axis carriage assembly 2620 are indicated mounted to first saddle arm 2622A and second saddle arm 2622B, respectively, which are part of a plurality of air-bearings supporting Y-axis carriage assembly 2620. Y-axis carriage assembly 2620 can be translated in a +/−Y-axis direction using a brushless linear motor. As will be discussed in more detail subsequently herein, gripper motion control assembly 2650 can utilize a dual voice coil motor assembly, such as voice coil motor assemblies, 2630A and 2630B, as well as pivot assembly 2660. Various embodiments of a gripper motion control assembly can include at least one voice coil motor and air bushing center pivot in conjunction with a position sensor and motion controller. Various embodiments of a Y-axis motion system of the present teachings based on voice coil motors are highly reliable, and can provide orientation accuracies of less than one micron. Additionally, the direct coupling of the substrate to such a gripper assembly of a Y-axis motion system allows for frictionless high speed operation with fast acceleration, as well as fast deceleration, using a linear brushless motor for the conveyance of Y-axis carriage assembly 2620, as well as dynamic rotation of the orientation of a substrate about the theta-Z (θ-Z) axis during Y-axis travel using gripper motion control assembly 2650 to maintain a high degree of precision for substrate orientation parallel to the axis of travel. As such, various embodiments of a Y-axis motion system utilizing an air-bearing gripper system can provide precision low-particle generating conveyance of substrate 2050 supported on floatation table 2200 through a printing system, such as printing system 2000 of FIG. 1C. Such a frictionless Y-axis motion system for moving a substrate can utilize either one or two Y-axis rails. Service bundle carrier 2430 can be used for the management of various service bundles, which can include, for example, but not limited by optical cables, electrical cables, wires, tubing and the like. Various embodiments of service bundles according to the present teachings can be connected to a printing system to provide various optical, electrical, mechanical and fluidic connections required to operate a functioning printing system.

Figure 4A:
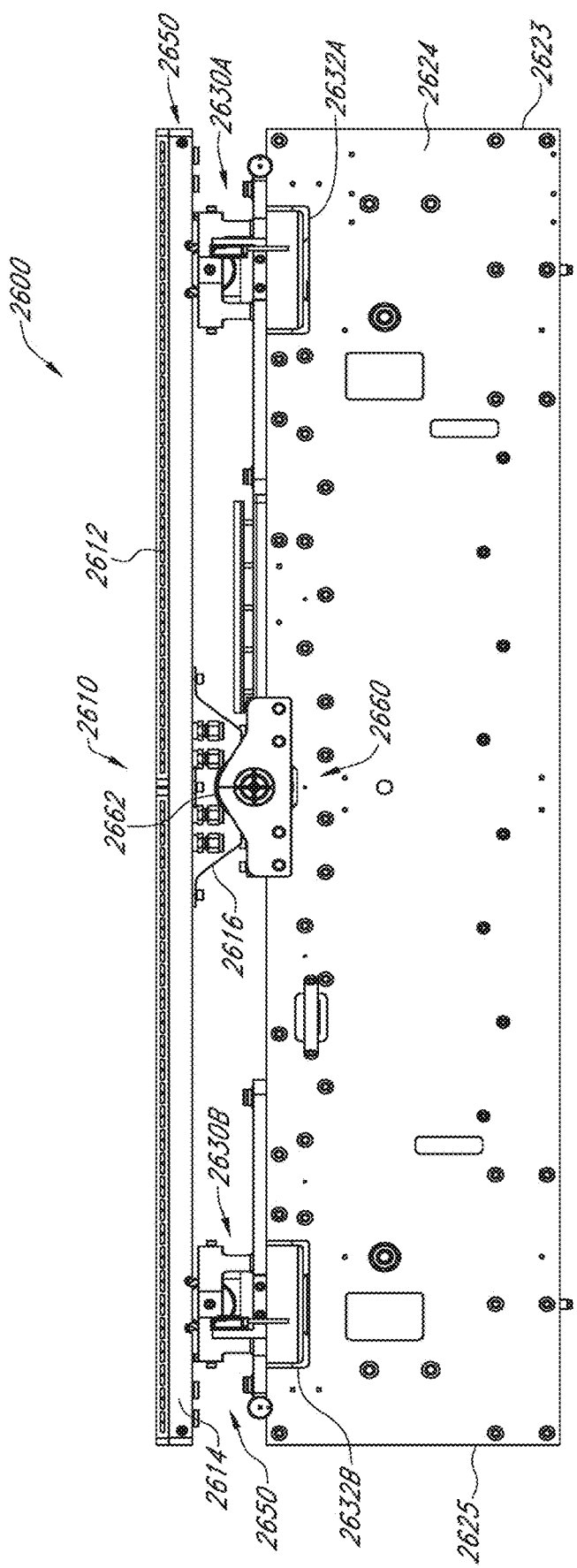
FIG. 4A is a top view of a Y-axis motion system according to various embodiments of systems and methods of the present teachings.
Figure 4B:
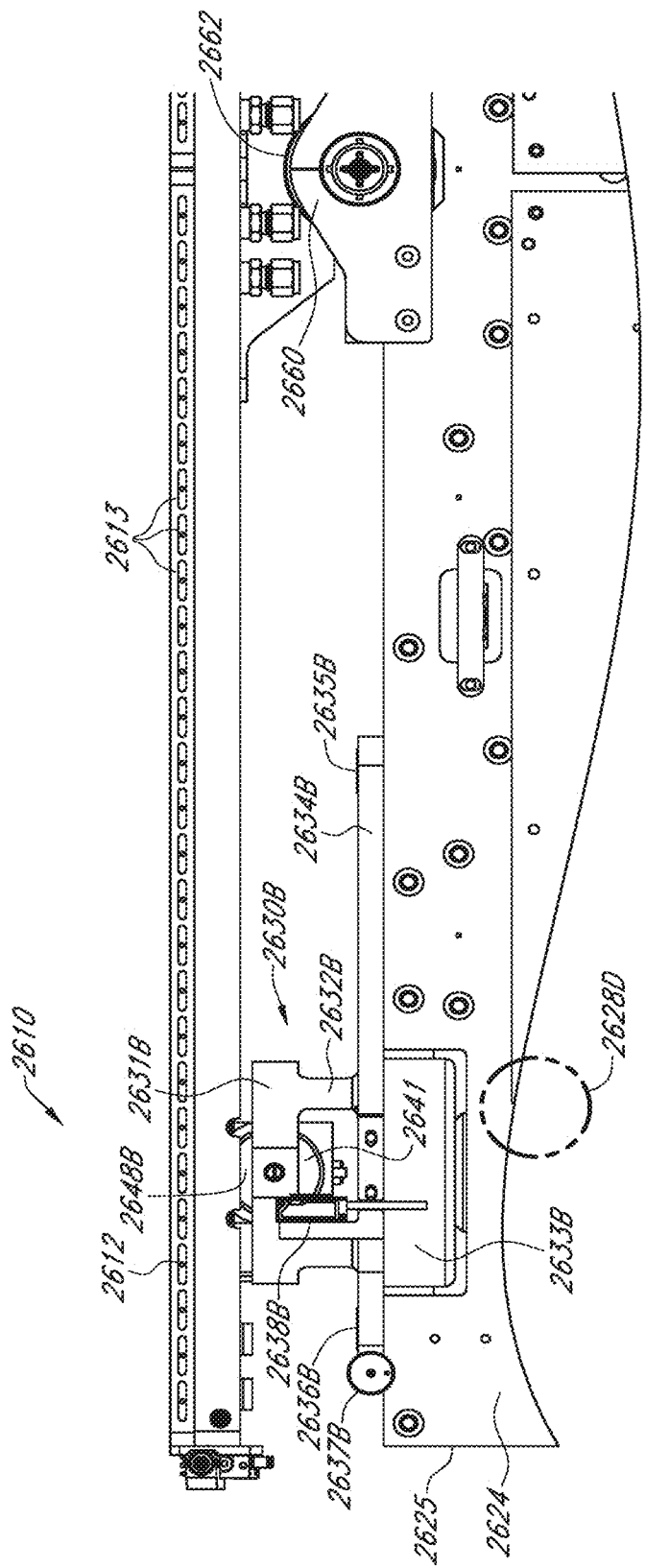
FIG. 4B is an expanded partial top view of FIG. 4A.

FIG. 4A is a top view of Y-axis motion system 2600, showing gripper assembly 2610, Y-axis carriage assembly top plate 2624, and gripper motion control assembly 2650. Gripper assembly 2610 can include vacuum chuck bar 2612, mounted on gripper frame 2614. Y-axis carriage assembly top plate 2624 is depicted in FIG. 4A having first end 2623 and second end 2625. Gripper assembly 2610 and Y-axis carriage assembly 2620 can be adjoined through the subassemblies of gripper motion control assembly 2650. For example, first voice coil assembly 2630A and second voice coil assembly 2630B have first and second voice coil housing 2632A and 2623B, respectively, which can be secured to Y-axis carriage assembly 2620 on one side of the voice coil assembly housing and to gripper assembly 2610 on the opposing side of the voice coil housing. Additionally, center pivot 2660 can include air bearing housing 2662, which can be secured to boss 2616 of gripper assembly 2610. FIG. 4B is a partial top view of air-bearing Y-axis motion system 2600 of FIG. 4A, depicting an expanded top view of second end 2625 of Y-axis motion system 2600. In FIG. 4B, an expanded top view of gripper assembly 2610, as well as an expanded top view of voice coil assembly 2630B are particularly apparent. Various embodiments of vacuum chuck bar 2612 mounted on gripper frame 2614 can include a plurality of vacuum sockets 2613, of which three of the plurality are indicated in FIG. 4B. Vacuum sockets 2613 are spaced at intervals along the length of vacuum chuck bar 2612, so that vacuum chuck bar 2612 can readily engage and release a substrate obviating the need for two-sided mechanical gripping of a substrate, such as that of a 2-fingered or 3-fingered gripping device. In addition to first air-bearing puck 2628A and second air-bearing puck 2628B of FIG. 3 for supporting Y-axis carriage assembly 2620, second upper puck 2628O can be mounted to the underside of Y-axis carriage assembly top plate 2624 (see FIG. 3 and FIG. 4B). A first upper puck (not shown) can be mounted symmetrically under the opposing first end 2623 of Y-axis carriage assembly top plate 2624 proximal to first saddle arm 2622A (see FIG. 4A).

As will be discussed in more detail herein, in addition to air-bearing pucks for supporting Y-axis carriage assembly 2620, voice coil air-bearing 2641 of second voice coil assembly 2630B depicted in FIG. 4B, along with a voice coil air-bearing (not shown) associated with first voice coil assembly 2630A (see FIG. 4A) can be utilized for the vertical stabilization of gripper assembly 2610. In the top view rendering of FIG. 4B, a single air bearing is visible. As a preload of a voice coil air-bearing in voice coil assembly, such as voice coil assembly 2630A and 2630B of FIG. 4A can ensure a requisite system stiffness. As depicted in the top view of FIG. 4B, various embodiments of a Y-axis motion system of the present teaching can include a single air bearing. Various embodiments of systems and methods utilizing a single air bearing in a voice coil assembly can preload the air bearing using, for example, but not limited by, gravity, vacuum or magnetic preload. Various embodiments of a Y-axis motion system may utilize an opposing second air bearing to provide bearing preload. Various embodiments of a voice coil motor assembly of the present teachings, such voice coil assembly 2630B of FIG. 4B, can include voice coil housing 2633B that can be adjoined to Y-axis carriage 2620. As will be discussed in more detail herein, voice coil gripper frame mounting block 2648B of voice coil assembly 2630B can be used to affix a voice coil assembly to gripper frame 2614. Voice coil assembly 2630B can also include voice coil shaft 2634B, which can have pivot screw 2635B and holding screw 2636B, as well as set screw 2637B. Additionally, voice coil assembly 2630B can have linear encoder 2638B. Finally, center pivot 2660 is an air-bushing that is configured to provide an axis of rotation for reliable and accurate theta-Z (θ-Z) rotation for embodiments of gripper motion control system 2650 of the present teachings. Though the parts of voice coil assembly 2630B have been described, voice coil assembly 2630A can be similarly described.

Figure 5A:
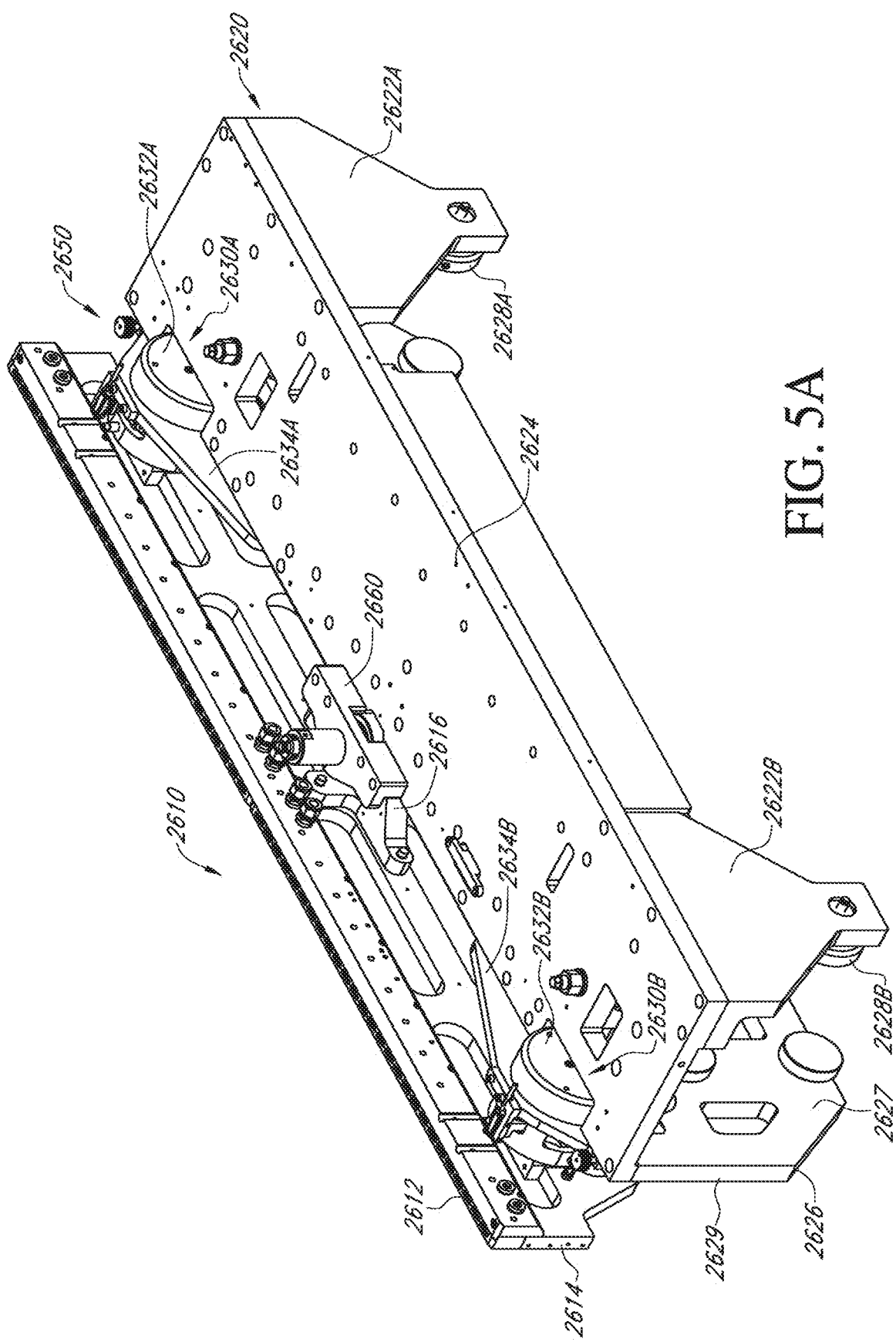
FIG. 5A is an iso view of a Y-axis motion system according to various embodiments of systems and methods of the present teachings.

FIG. 5A is an isometric view of a carriage assembly, gripper motion control assembly, and gripper assembly of a Y-axis motion system according to various embodiments of systems and methods of the present teachings. As depicted in FIG. 5A FIG. 5A depicts Y-axis carriage assembly 2620 with first and second saddle arms 2622A and 2622B, respectively; the saddle arms having first puck 2628A and second puck 2628B mounted thereupon, respectively; so that the pucks are proximal to Y-axis beam 2350 (see FIG. 3). First and second saddle arms 2622A and 2622B, as well as Y-axis carriage assembly side frame 2626 can be joined to Y-axis carriage assembly top plate 2624. Y-axis carriage assembly side frame 2626 can have first side 2627, which is proximal to Y-axis beam 2350 (see FIG. 3), and second side 2629, which is proximal to gripper frame 2614. Gripper motion control assembly 2650 can include first and second voice coil assemblies, 2630A and 2630B, respectively, as well as center pivot assembly 2660. As previously discussed herein, gripper motion control assembly 2650 is adjoined to both the Y-axis carriage assembly 2620 and the gripper assembly 2610; effectively adjoining the Y-axis carriage assembly and gripper assembly thereby (see also FIG. 4B). As a substrate, such as substrate 2050 of FIG. 3, is held by vacuum chuck bar 2612 mounted to gripper frame 2614, dynamic angular (δ-Z) adjustment to offset the effects of imperfections in a Y-axis beam can be done for a substrate by gripper motion control assembly 2650 as Y-axis carriage assembly 2620 travels over Y-axis beam 2350 (see FIG. 3). Accordingly, a substrate during Y-axis travel can be maintained with high precision with respect the orientation of a substrate about the theta-Z (θ-Z) axis during Y-axis travel using gripper motion control assembly 2650 to maintain a high degree of precision for substrate orientation parallel to the axis of travel. Various embodiments of gripper motion control assembly 2650 can maintain the orientation of a substrate parallel to the Y-axis of travel to within +/−4300 microradians. Accordingly, gripper motion control assembly 2650 of Y-axis motion system 2600 can maintain substrate orientation with a high degree of precision parallel to the Y-axis direction of travel in a horizontal plane determined, for example, by the fly height of a substrate.

Figure 5B:
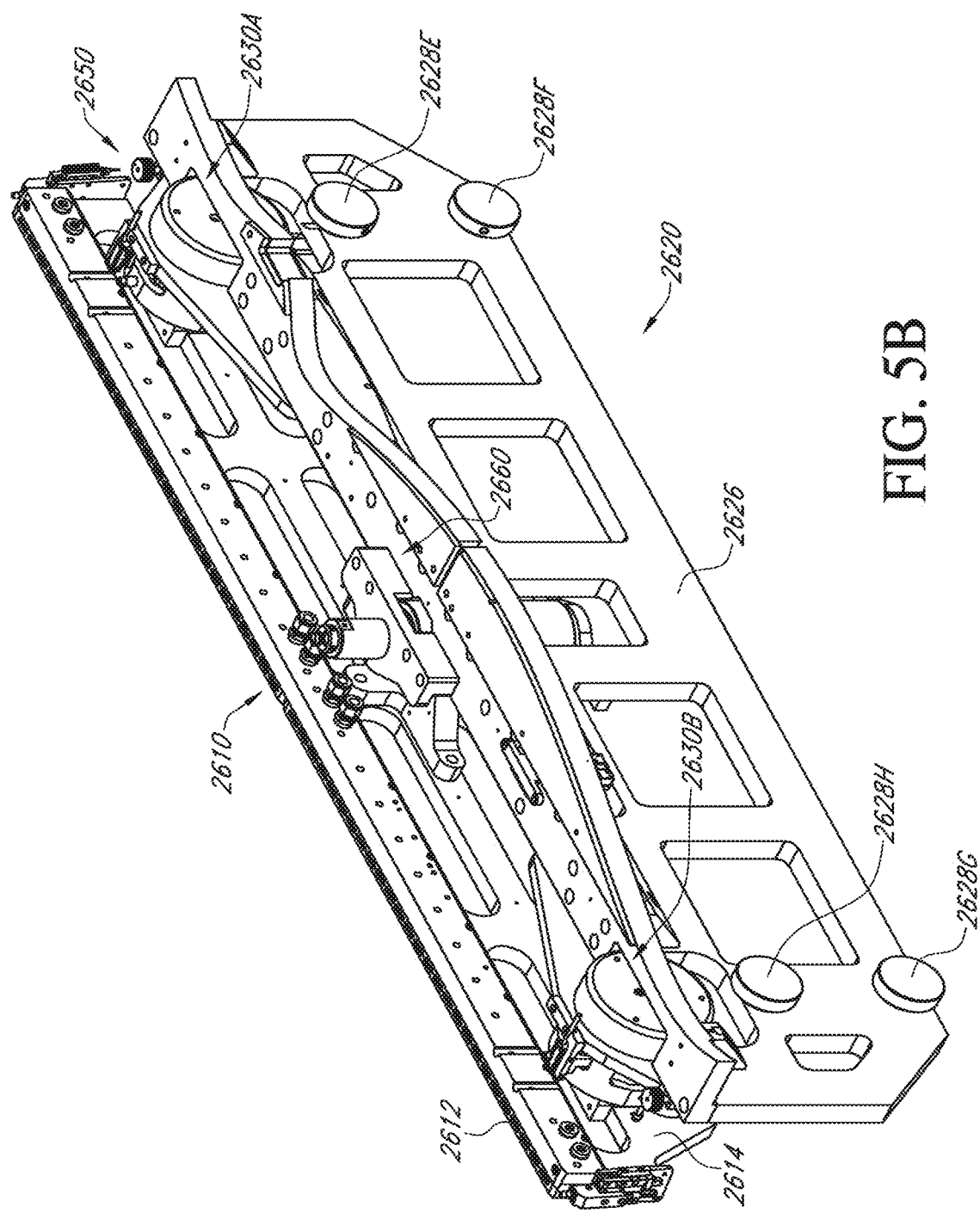
FIG. 5B is a long section view of FIG. 5A.

FIG. 5B depicts a long section perspective view through Y-axis carriage assembly 2620 of FIG. 5A, which illustrates generally gripper assembly 2610 mounted to Y-axis carriage assembly 2620. In FIG. 5B, first and second voice coil motor assemblies, 2630A and 2630B, respectively, as well as vacuum chuck bar 2612 on gripper frame 2614, and center pivot 2660 are indicated. In FIG. 3 and FIG. 5A, first air-bearing puck 2628A and second air-bearing puck 2628B of Y-axis carriage assembly 2620 are indicated. In FIG. 4B, a first and second air-bearing puck under Y-axis carriage assembly top plate 2624 were described. As shown in FIG. 5B, Y-axis carriage assembly side frame 2626 can have a plurality of air-bearing pucks mounted thereupon, such as air-bearing pucks 2628E through 2640H. In addition to the air bearing pucks located on the saddle arms and top plate of a carriage assembly proximal to Y-axis beam 2350, a plurality of air-bearing pucks mounted on Y-axis carriage assembly side frame 2626 can provide bearing support between side frame 2626 and the corresponding side of Y-axis beam 2350. Various embodiments of a Y-axis motion system of the present teaching, for example, as generally illustrated in FIG. 3 through FIG. 5B can provide for a low-particle generating, low heat-generating conveyance of substrate through a printing system.

Figure 6:
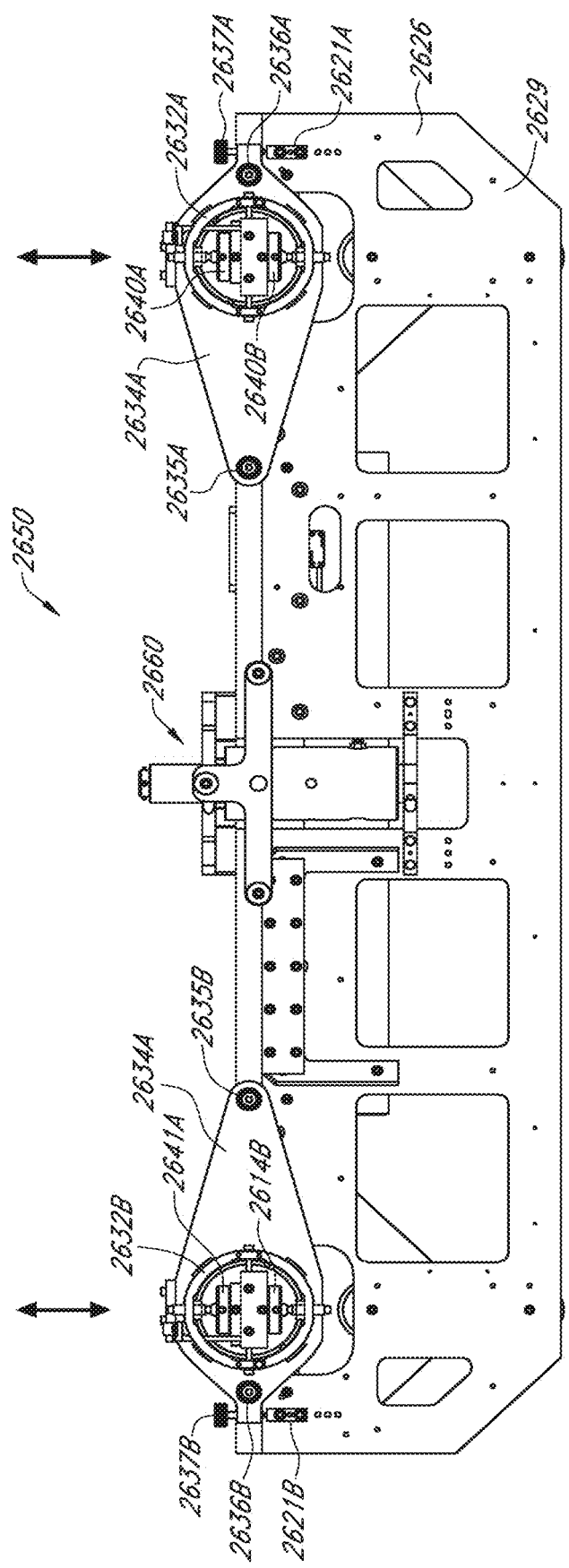
FIG. 6 is a side view of a carrier assembly side frame with a gripper motion control assembly mounted thereupon.

FIG. 6 depicts the second side 2627 of Y-axis carriage assembly side frame 2626, which is the side proximal to gripper frame 2614, and illustrates generally a Y-axis moving system subassembly including gripper motion control assembly 2650 without gripper frame 2614 mounted. First and second voice coil assemblies 2630A and 2630B can be mounted at opposing top ends of second side 2627 of Y-axis carriage assembly side frame 2626, while center pivot 2660 can be mounted in the top center portion of second side 2627 of Y-axis carriage assembly side frame 2626. First and second voice coil assemblies 2630A and 2630B can include first voice coil assembly shaft 2634A and second voice coil assembly shaft 2634B, respectively, as well as first voice coil assembly housing 2632A and second voice coil assembly housing 2632B. Each of first voice coil assembly shaft 2634A and second voice coil assembly shaft 2634B can have a set screw; first voice coil assembly set screw 2635A and second voice coil assembly set screw 2637B, respectfully, each set screw having a shank extending into voice coil assembly set screw hole 2621A and 2621B, respectively. Additionally, as depicted in FIG. 6, each voice coil assembly shaft; first voice coil assembly shaft 2634A and second voice coil assembly shaft 2634B can have a pivot screw and a holding screw; pivot screw 2635A and holding screw 2636A for first voice coil assembly shaft 2634A and pivot screw 2635B and holding screw 2636B for first voice coil assembly shaft 2634B. For the initial adjustment of the horizontal position of a gripper assembly and substrate relative to a floatation table, for both first and second voice coil assemblies 2630A and 2630B, the pivot screw and holding screw can be loosened, until the horizontal position of gripper assembly and substrate are correctly adjusted, and then the pivot screw and holding screw are tightened. Adjusting voice coil assemblies 2630A and 2630B equally can be done to make an adjustment in a gripper assembly's position in +/−Z relative to a floatation table (see FIG. 3), while adjusting voice coil assemblies 2630A and 2630B unequally can be done to make an adjustment in a gripper assembly's position in theta-X (θ-X) relative to a floatation table (see FIG. 3). As previously discussed herein, various embodiments of voice coil assemblies of the present teachings utilize a pair of air bearings, which an upper or top air bearing, such as air bearing 2640A of first voice coil assembly 2630A and air bearing 2641A of second voice coil assembly 2630B, as well as an opposing bottom air bearing, such as air bearing 2640B of first voice coil assembly 2630A and air bearing 2641B of second voice coil assembly 2630B. Each bottom air bearing is used to preload each upper or top air bearing.

Figure 7A:
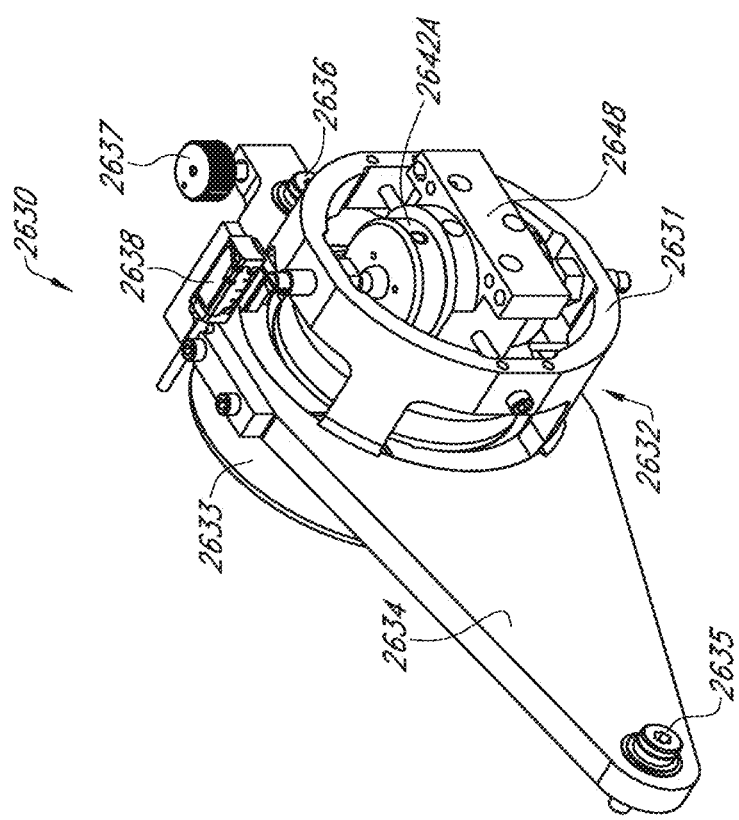
FIG. 7A is an iso view of a voice coil assembly according to various embodiments of systems and methods of the present teachings.
Figure 7B:
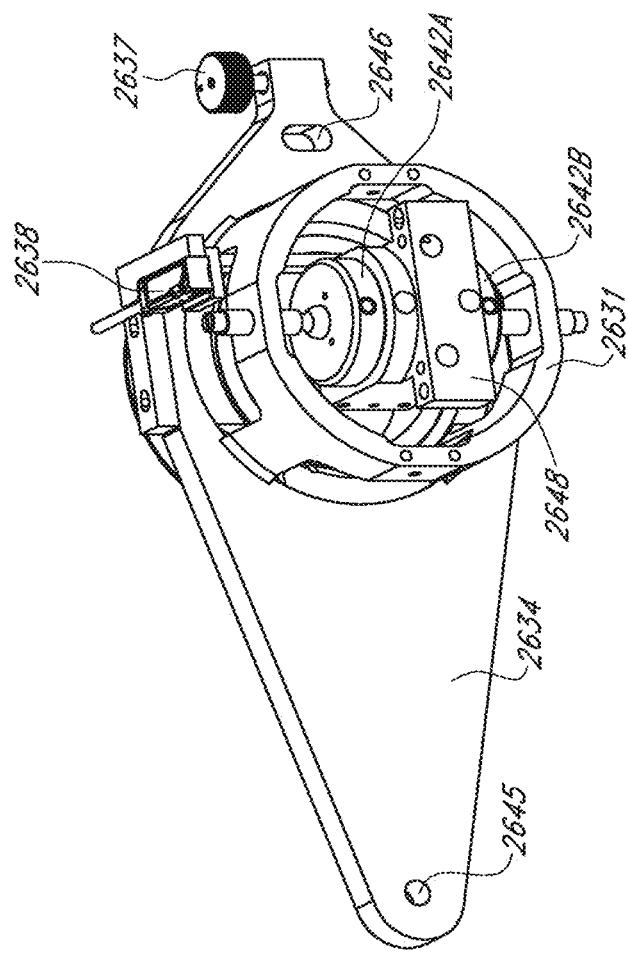
FIG. 7B is a side view of a voice coil assembly.

FIG. 7A illustrates generally an isometric view of a voice coil assembly according to the present teachings. A voice coil assembly can include a voice coil housing 2632, which can have first voice coil housing side first 2631 and opposing voice coil housing second side 2633, as well as voice coil shaft 2634. Voice coil shaft 2634 can include pivot screw 2635 and holding screw 2636, as well as set screw 2637, all of which can be used in the initial vertical adjustment of the of a gripper assembly relative to a flotation table, as previously discussed herein with respect to FIG. 6. In FIG. 7B, pivot screw 2635 and holding screw 2636 have been removed, so that pivot through hole 2645, which accommodates pivot screw 2635, and through slot 2646, which accommodates holding screw 2636, are apparent. Voice coil assembly 2630 can have a pair of air bearings such as upper air bearing 2642A and opposing or lower air bearing 2642B, for which the lower air bearing is used to preload the upper air bearing. Voice coil assembly 2630 can include voice coil gripper frame mounting block 2648, which can be used to affix a voice coil assembly to a gripper frame (see FIG. 4B). Additionally, a voice coil assembly of the present teachings can include liner encoder 2638, which is oriented in the X direction. Various embodiments of a Y-axis motion system of the present teachings utilize a linear encoder head that allows the voice coils to be oriented within 1-2 microns in the X direction relative to a carriage assembly, providing for dynamic adjustment in theta-Z (θ-Z) during the conveyance of a substrate on a Y-axis beam utilizing various embodiments of a Y-axis motion system of the present teachings. Additionally, for various embodiments of gripper motion control assembly 2650 of FIG. 6, a master-slave control system can be used for controlling the first voice coil assembly 2630A and second voice coil assembly 2630B of FIG. 6, so that if one voice coil responds to correct a theta-Z (θ-Z) orientation, the other voice coil is controlled in an equal and offsetting fashion. Various embodiments of gripper motion control assembly 2650 can maintain the orientation of a substrate parallel to the Y-axis of travel to within +/−4300 microradians. Accordingly, gripper motion control assembly 2650 of Y-axis motion system 2600 can maintain substrate orientation with a high degree of precision parallel to the Y-axis direction of travel in a horizontal plane determined, for example, by the fly height of a substrate.

Figure 8:
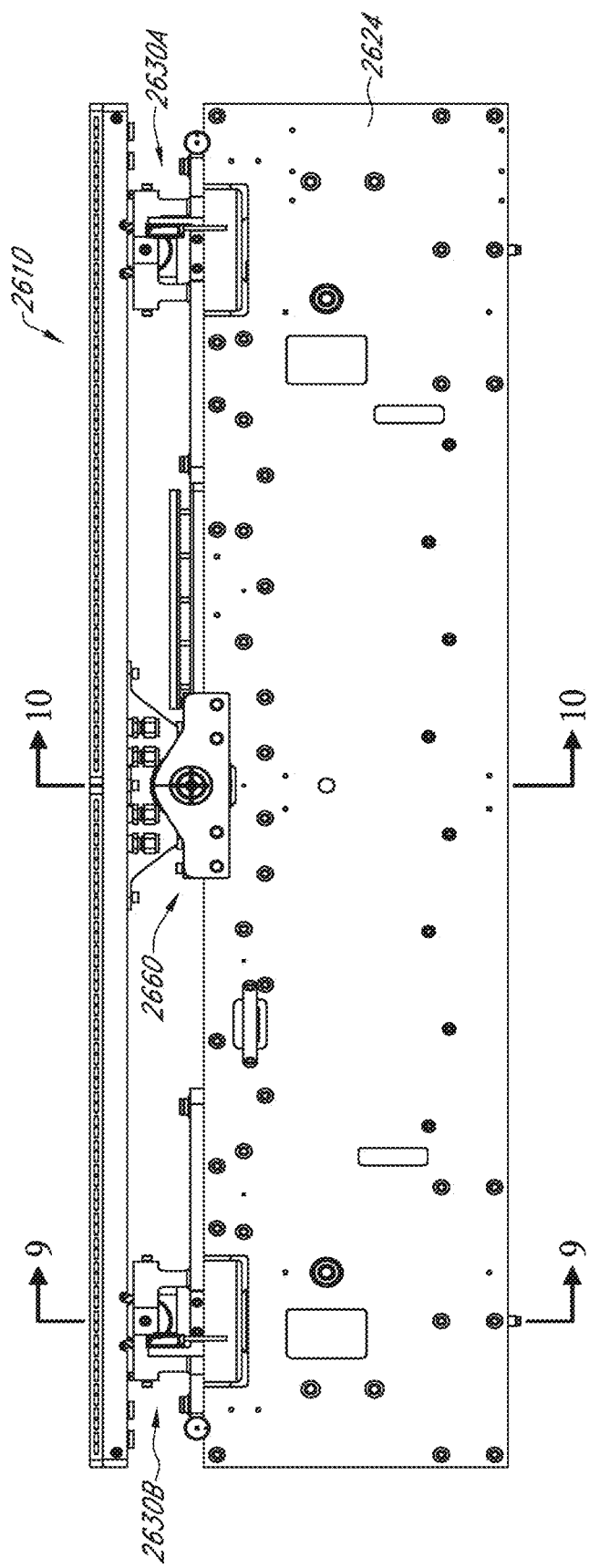
FIG. 8 is a top view of a Y-axis motion system according to various embodiments of systems and methods of the present teachings, indicating two section views.
Figure 9:
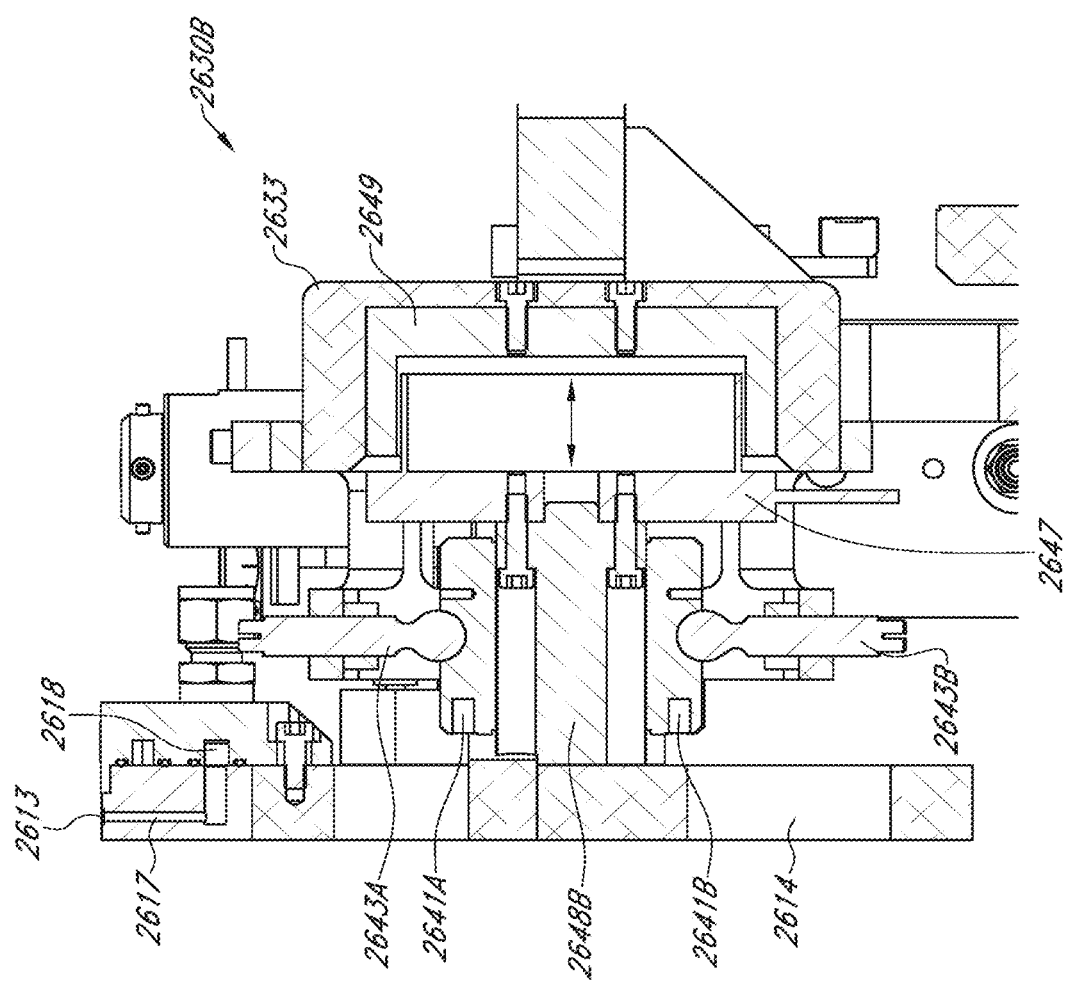
FIG. 9 is a section view of a voice coil assembly, an indicated in FIG. 8.

FIG. 8 is a top view of Y-axis motion system 2600, showing gripper assembly 2610, Y-axis carriage assembly top plate 2624, and gripper motion control assembly 2650, similar to FIG. 4A, which indicates the position of cross-section views for FIG. 8 and FIG. 9.

FIG. 9 illustrates generally a cross section view through a voice coil assembly; specifically designated in FIG. 8, as a cross-section view through voice coil assembly 2630B, though any description given herein regarding the section view of FIG. 9 applies equally to voice coil assembly 2630A. Voice coil gripper frame mounting block 2648B is depicted in FIG. 9 positioned between first air bearing 2641A and second air bearing 2641B of voice coil assembly 2630B. Associated with each of first air bearing 2641A and second air bearing 2641B is an air bearing spherical pivot; 2643A and 2643B, respectively. Air bearing spherical pivot; 2643A associated with first air bearing 2641A and air bearing spherical pivot 2643B associated with first air bearing 2641B allow each air bearing to float in theta-X (θ-X) and theta-Y (θ-Y), so that first air bearing 2641A and second air bearing 2641B remain in a parallel disposition with respect to mounting block 2648B. In addition to being positioned between first air bearing 2641A and second air bearing 2641B, voice coil gripper frame mounting block 2648B is also affixed to voice coil holder 2647. Voice coil holder 2647 and voice coil magnet base are housed inside voice coil housing second side 2633. Voice coil holder 2647 is depicted in FIG. 9 as associated with coil magnet base 2649. During operation, the force of movement of voice coil magnet base 2649 is translated to voice coil magnet holder 2647, which is translated to voice coil gripper frame mounting block 2648B, and then to gripper frame 2614 thereby. As previously discussed herein, various embodiments of a gripper motion control assembly 2650 can use a master-slave control of the two voice coil assemblies, so that the two voice coils act synchronously to maintain a gripper assembly orientation relative to the direction of travel. Also depicted in FIG. 9 are vacuum manifold 2618 of gripper assembly 2610, which is in flow communication with vacuum groove 2617. As depicted in FIG. 9, the plurality of vacuum sockets depicted in FIG. 4B can be in flow communication with vacuum manifold 2618 via vacuum groove 2617.

Figure 10:
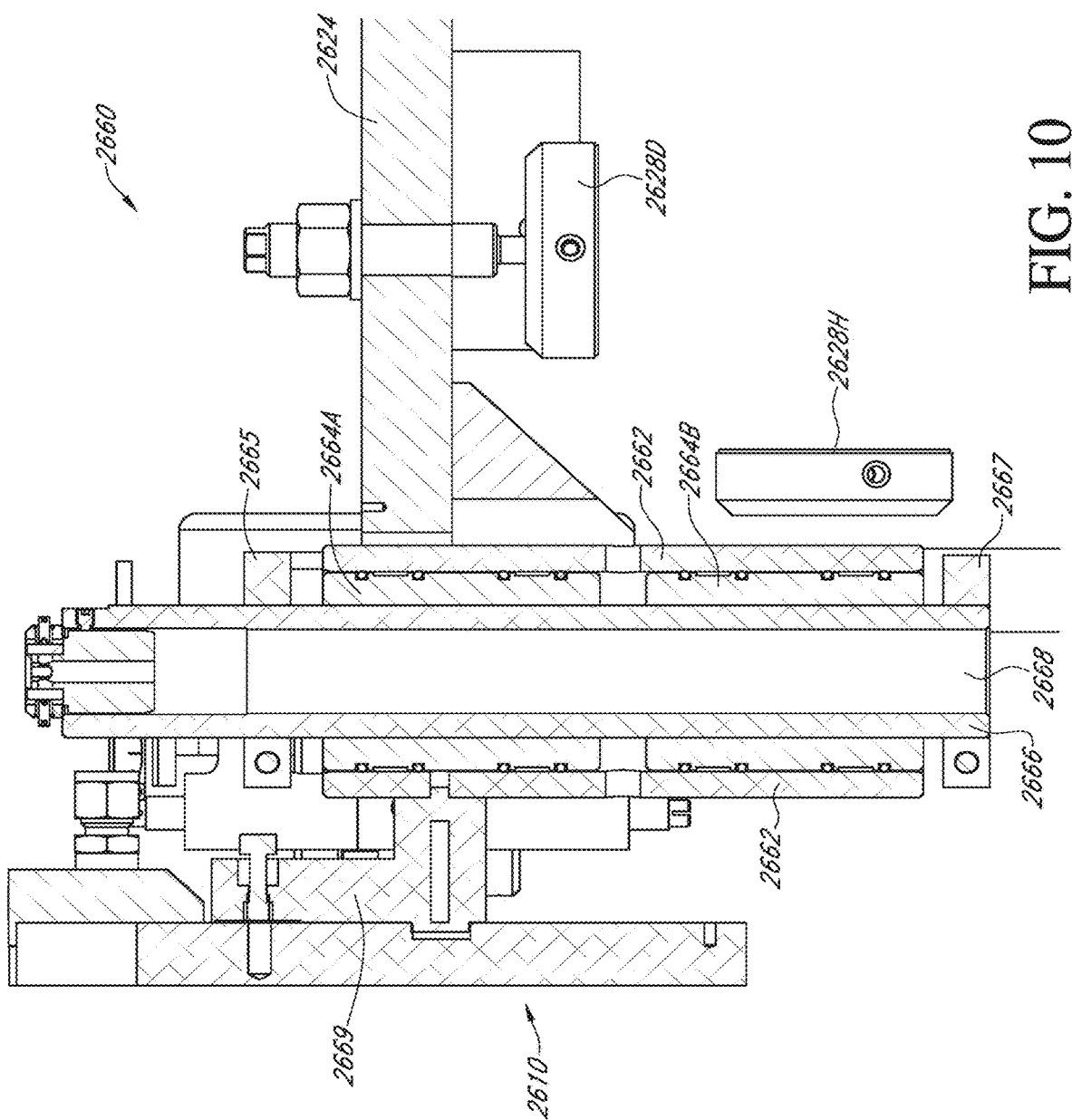
FIG. 10 is a section view of a center pivot assembly, as indicated in FIG. 8.

FIG. 10 illustrates generally a cross section view through center pivot assembly 2660 as designated in FIG. 8. Pivot assembly 2660 can include air bushing housing 2662, which can house first air bushing 2664A and second air busing 2664B. First air bushing 2664A and second air busing 2664B can be configured around center shaft 2666; the use of two air bushings imparting a requisite system stiffness. First air bushing 2664A and second air busing 2664B can be fabricated from a porous material, such as porous graphite, to ensure an even flow of a gas, such as an inert gas, can be evenly distributed around center shaft 2666. Center shaft 2666 can be held by upper clamp 2665 and lower clamp 2667, which can be secured to carriage assembly top plate 2624. Center pivot adaptor plate 2669 can be configured to affixed air bushing housing 2662 to gripper frame 2614. In that regard, any theta-Z (θ-Z) rotation of air bushing assembly 2660 as a result of carriage assembly movement will be translated to gripper assembly 2610 in response. Also depicted in FIG. 10 are carriage assembly air bearing 2638D (see FIG. 4B) and carriage assembly air bearing 2638H (see FIG. 5B).

As previously discussed herein, maintaining a controlled environment within the printing enclosure is paramount for various processes related to the manufacture of various OLED devices. According to various embodiments of a gas enclosure system of the present teachings, environmental control of an interior volume defined by a gas enclosure assembly can include control of lighting, for example, by the number and placement of lights of a specific wavelength, control of particulate matter using various embodiments of a particle control system, control of reactive gas species using various embodiments of a gas purification system, and temperature control of a gas enclosure assembly using various embodiments of a thermal regulation system, as will be discussed in more detail subsequently herein. One aspect of thermal regulation relates to minimizing heat loads within an enclosed printing system, for example, as given by the design of the Y-axis motion system as previously described herein.

Figure 11:
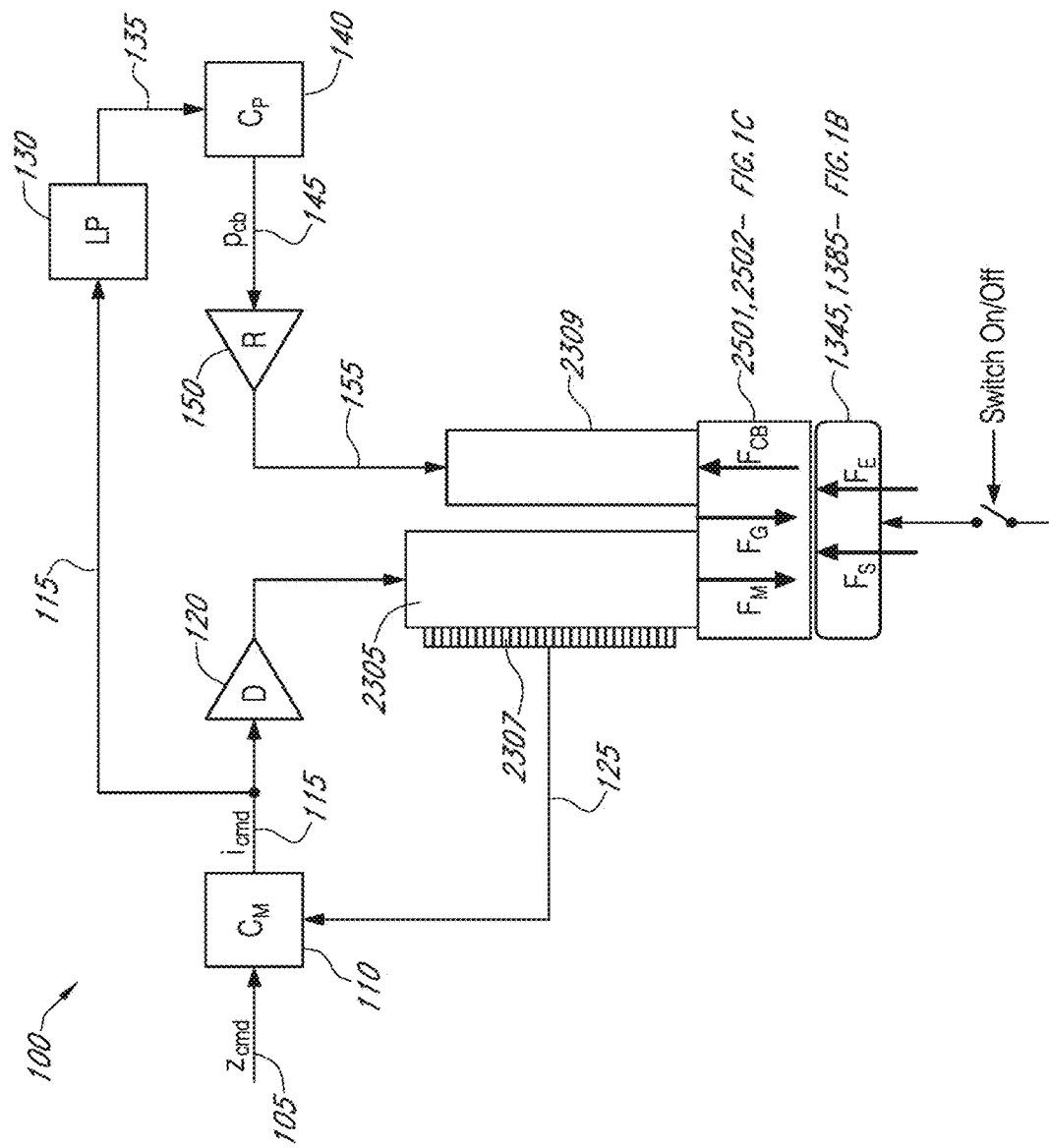
FIG. 11 is a schematic representation of a closed-loop control circuit providing pneumatic counterbalance to a Z-axis motor according to various embodiments of systems and methods of the present teachings.

In addition to the Y-axis motion system, and with respect to the schematic shown in FIG. 11, minimizing the heat load can also include minimizing the heat load of a motor used for controlling the movement of the Z-axis moving plate by utilizing a pneumatic counterbalance. In FIG. 11, control loop 100 can be used to ensure that current driving Z-axis motor 2305 can be optimized during operation; particularly under load, as increasing the current to Z-axis motor 2305 will increase the motor temperature. One disadvantage of such motor heating can be the loss of printing accuracy due to thermal expansion of the motor and motor assembly. Additionally, as previously noted herein, control of heat dissipation is one aspect of environmental control of an enclosed printing system. Accordingly, control loop 100 of FIG. 11 is shown to include pneumatic counterbalance system 2309, which can compensate for the load on Z-axis motor 2305 by providing an automated counterbalancing force against a load to minimize motor current, thereby minimizing motor heating.

In FIG. 11, $Z_{cmd}$ input 105 is a commanded Z-axis position for a printhead assembly, such as first printhead assembly 2501 and second printhead assembly 2502 of FIG. 1C. Referring to FIG. 1C, recalling, first printhead assembly 2501 and second printhead assembly 2502 can be mounted on first Z-axis moving plate 2310 and second Z-axis moving plate 2312, respectively. First Z-axis moving plate 2310 and second Z-axis moving plate 2312, are mounted to first X-axis carriage assembly 2301 and second X-axis carriage assembly 2302, respectively. In that regard, each printhead assembly can be positioned in an X,Z direction relative to a substrate, such as substrate 2050 of FIG. 1C. During an exemplary process step, for example, but not limited by, a printing process, $Z_{cmd}$ input 105 can be received by motor controller $C_M$ 110 and a current associated with a commanded Z-axis position, $i_{cmd}$ 115, can be sent to a motor drive D 120, so that Z-axis linear motor 2305 can move a Z-axis moving plate, such as first Z-axis moving plate 2310 and second Z-axis moving plate 2312 of FIG. 1C. The exact position of a Z-axis moving plate in the Z-axis direction can be measured using encoder 2303, which information regarding the exact Z-axis position can then be fed back into motor controller $C_M$ 110 until a commanded position has been reached. Additionally, $i_{cmd}$ 115, can be sent to low-pass filter LP 130, which can act to filter current spikes, and additionally to gate the controller response. Low-pass filter output 135 can be sent to pneumatic controller $C_P$ 140. Pneumatic controller $C_P$ 140 can then compute the counterbalance pressure $P_{CB}$ that optimizes $i_{cmd}$ 115. During an exemplary process step, for example, but not limited by, the docking of a printhead assembly to a docking gasket as previously discussed herein, there is a motor force, $F_M$, required to counter a seal force, $F_S$ as indicated in FIG. 11. While the extra motor force enables a seal to be maintained, it requires increased motor current, which can result in increased heating of the motor.

As depicted in FIG. 11, to minimize the motor heating that would result from increasing current in order to maintain motor force, $F_M$ during sealing of a printhead assembly against a docking gasket, pneumatic counterbalance force, $F_{CB}$, can be utilized. Vertical seal force $F_S$ can be detected by continuously detecting current of motor 2305. The magnitude and direction of seal force $F_S$ can be reported to pneumatic controller $C_P$ 140, which can calculate the required pneumatic counterforce required, and can send commanded counterbalance pressure $P_{CB}$ 145 to pressure regulator R 150. Pressure regulator R 150 can then supply the commanded pressure to pneumatic counterbalance system 2309 in order to exert pneumatic counterforce $F_{CB}$. According to the present teachings, control loop 100 acts in a fashion so that sum of all forces; sealing force $F_S$, intrinsic tool environment force $F_E$, pneumatic counterforce $F_{CB}$, motor force $F_M$, and gravitational force $F_G$ acting on the Z-axis assembly, is zero.

Figure 12A:
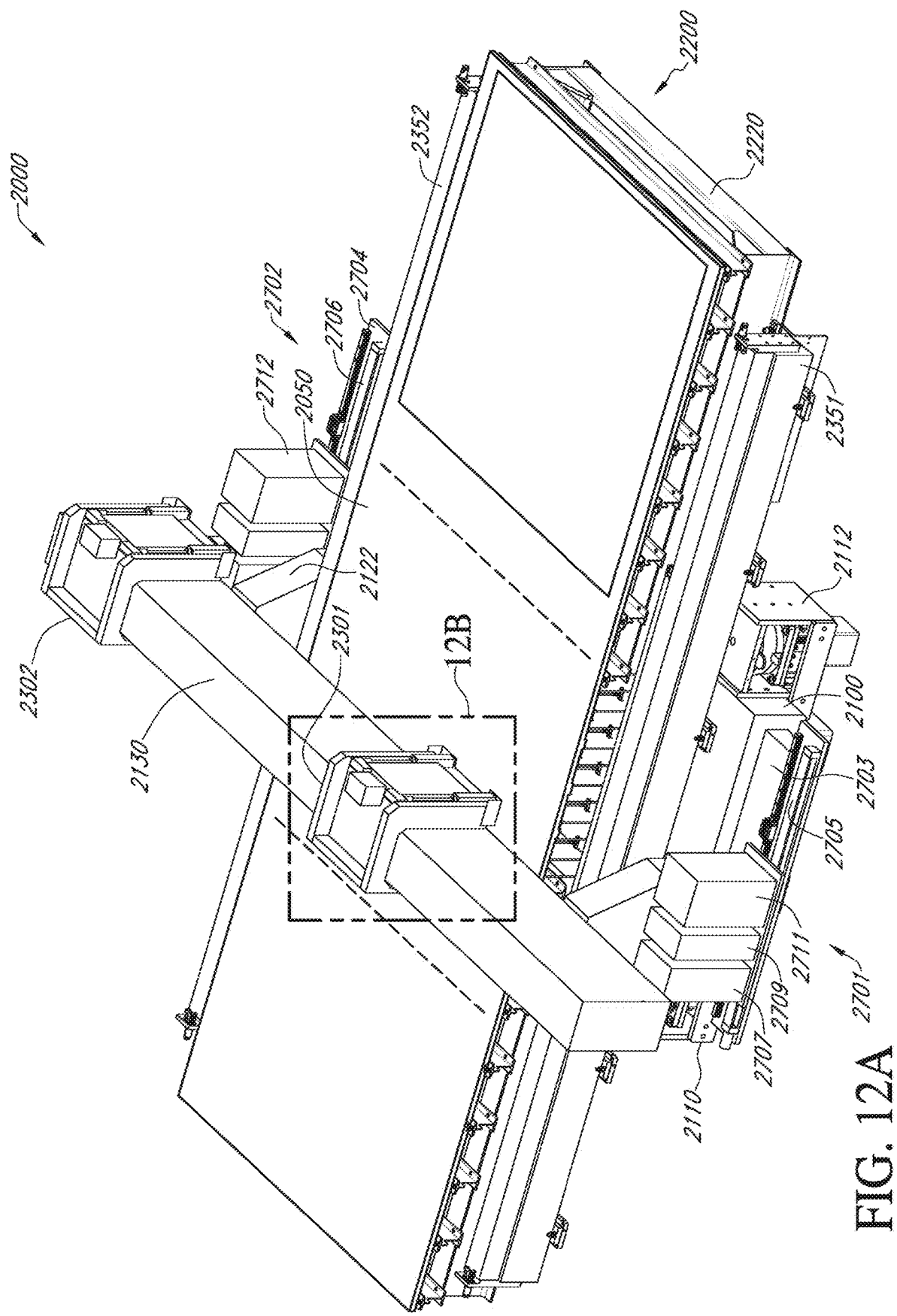
FIG. 12A is an iso perspective view of a Z-axis moving plate with pneumatic lift elements and FIG. 12 is a front perspective view of a Z-axis moving plate with pneumatic lift elements in accordance with various embodiments of the present teachings.
Figure 12B:
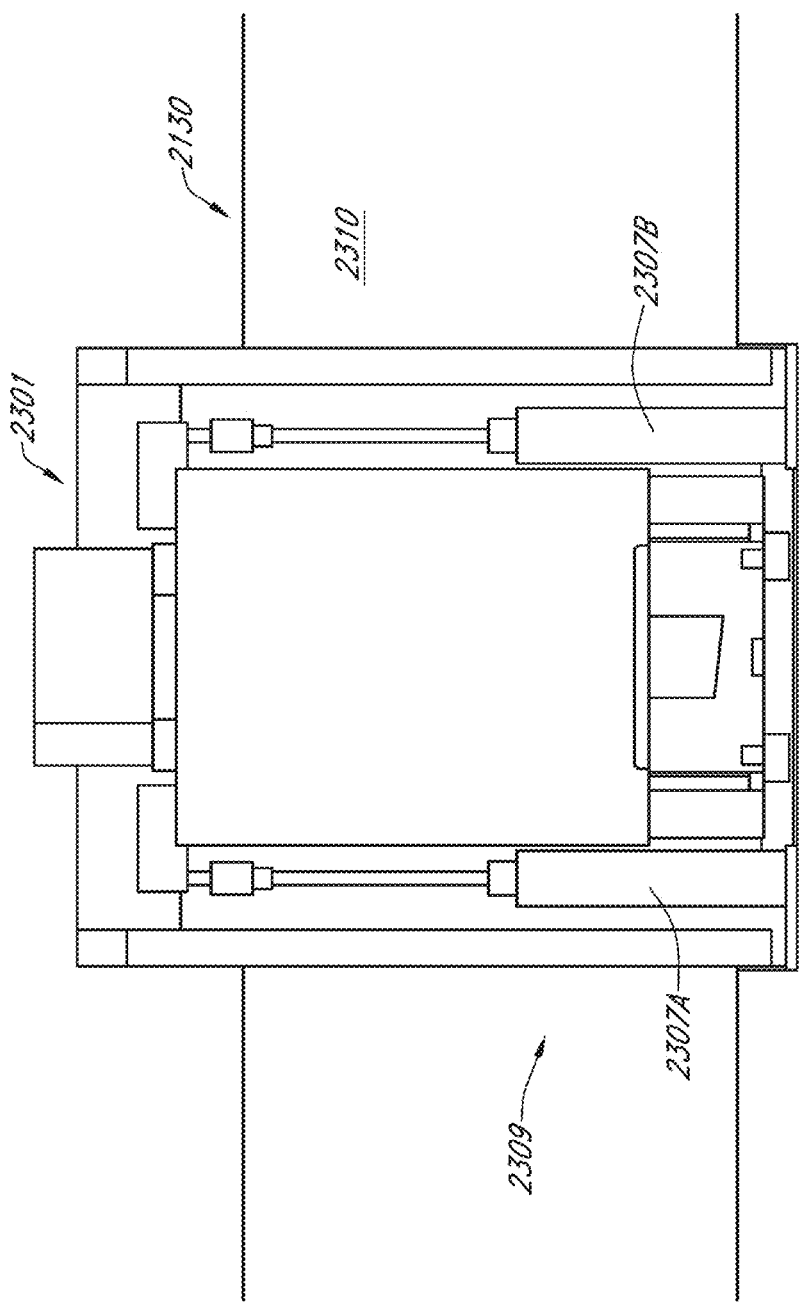

FIG. 12A depicts printing system 2000, showing first X-axis carriage assembly 2301 and second X-axis carriage assembly 2302 without a printhead assembly mounted thereupon. In FIG. 12B, a front view of X-axis carriage assembly 2301 mounted to bridge 2130 is depicted in which pneumatic counterbalance system 2309 can include first pneumatic cylinder 2307A and second pneumatic cylinder 2307B. Though an example of use of control loop 100 was given for a process of docking a printhead assembly with a gasket, control loop 100 can be utilized for numerous purposes. For example, during a printing operation, a pneumatic counterbalance system, such as pneumatic counterbalance system 2309, can operate in response to various embodiments of a pneumatic counterbalance control loop to support a Z-axis moving plate and any associated load in order to minimize the current to a motor 2305 of FIG. 11 during printing. Additionally, various embodiments of a pneumatic counterbalance control loop, such as control loop 100 of FIG. 11, can be used for parameter monitoring of a printing system. For example, the glide of Z-axis moving plate may change over time, producing increased friction due to wear and aging. The increased load to a Z-axis moving plate motor as a result of increased friction can be offset using various embodiments of a pneumatic counterbalance control loop and associated systems. By way of another non-limiting example, changes in pressure monitored by pneumatic controller $C_P$ can be monitored as a quality metric to initiate unscheduled maintenance on the Z-axis motion system before a failure is evident. It should be noted that while some examples were given with respect to a specific carriage assembly, various embodiments of a pneumatic counterbalance control loop and associated systems are generally applicable to any carriage assembly and any load of the present teachings.

Figure 13:
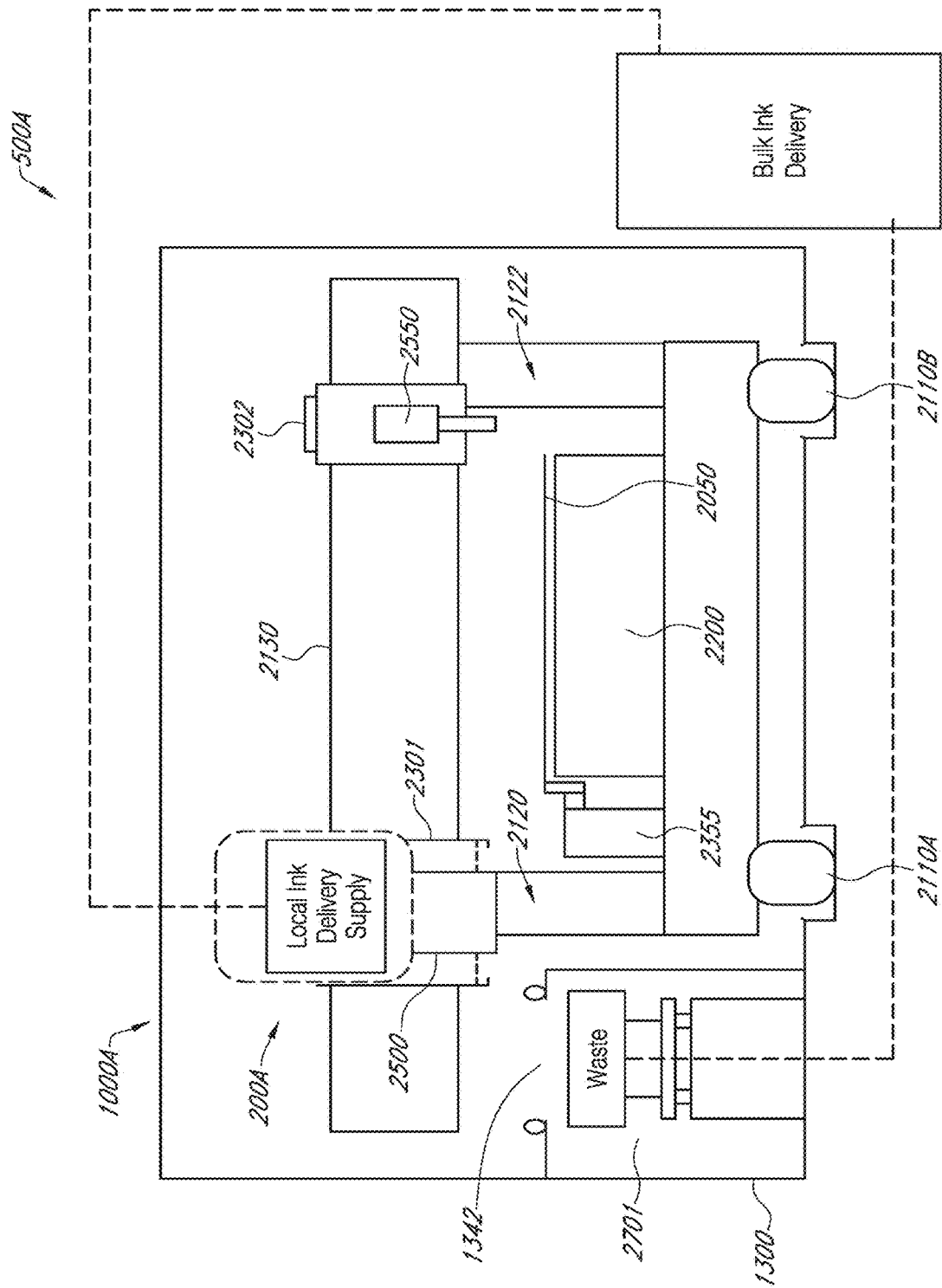
FIG. 13 is a schematic representation of an enclosed printing system that can utilize various embodiments of an ink delivery system according to the present teachings.

As depicted in FIG. 13, gas enclosure 1000 can house printing system 2000A. Gas enclosure system 500A having features as described for various embodiments of gas enclosure system 500 of FIG. 18, while printing system 2000A can have all the features described for printing system 2000 of FIG. 17. Printing system 2000A can have printing system base 2100, which can be supported by at least two sets of isolators such as isolator set 2110 that includes isolators 2110A and 2110B of FIG. 13. Y-axis motion system 2350 can be mounted on printing system base 2100. Substrate 2050 can be floatingly supported by substrate floatation table 2200. Printing system base 2100 can support first riser 2120 and second riser 2122, upon which bridge 2130 can be mounted. Printing system bridge 2130 can support first X-axis carriage assembly 2301, upon which printhead device assembly 2500 can be mounted, and second X-axis carriage assembly 2302, upon which camera assembly 2550 can be mounted. Additionally, gas enclosure 1000A can have auxiliary panel assembly 1330, which can enclose printhead management system 2701, as well as a waste containment system for the bulk ink delivery system. Auxiliary panel assembly 1330 can be in flow communication with the remaining working volume of gas 1000A through printhead assembly opening 1342. Various embodiments of a bulk ink delivery system can be external to gas enclosure 1000A and in flow communication with various embodiments of a local ink delivery system, which can be proximal to printhead device assembly 2500 on first X-axis carriage assembly 2301.

Figure 14:
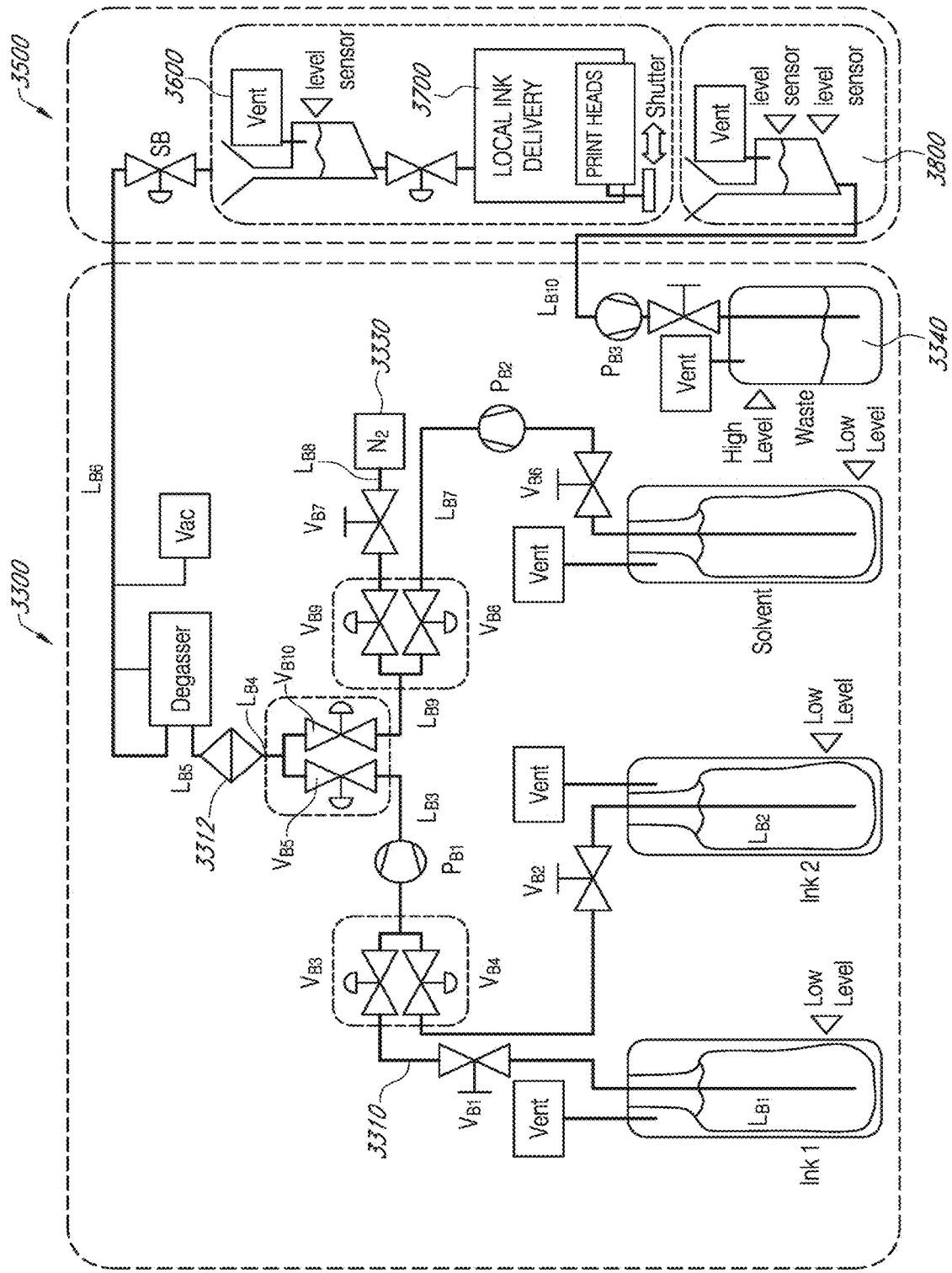
FIG. 14 is a schematic representation of a bulk ink delivery system according to various embodiments of the present teachings.

FIG. 14 is a schematic depiction of various embodiments of bulk ink delivery system 3300, which can be in flow communication with local ink delivery system 3500. Bulk ink delivery system (BIDS) 3300 can have bulk ink supply system 3310, which can include first BIDS ink supply line $L_{B1}$ in flow communication with a first ink source, as well as a second BIDS ink supply line $L_{B2}$ in flow communication with a second ink source. First BIDS ink supply line $L_{B1}$ and second BIDS ink supply line $L_{B2}$ can have first BIDS ink supply safety valve $V_{B1}$ and second BIDS ink supply safety valve $V_{B2}$, respectively. First BIDS ink supply safety valve $V_{B1}$ and second BIDS ink supply safety valve $V_{B2}$ can be used to isolate the first ink supply source and second ink supply source from lines upstream, for example, when the ink supply containers need to be changed or refilled. First BIDS ink supply valve $V_{B3}$ is open when first ink supply container, Ink 1, is in use. Similarly, second BIDS ink supply valve $V_{B4}$ is open when second ink supply container, Ink 2, is in use.

Though two ink supply sources are indicated in FIG. 14, a plurality of ink supply containers can be included in bulk ink supply system 3310, and can act as sequential supply sources of ink. For example, as shown in FIG. 14, when the level of ink in first ink supply container, Ink 1, is at the low level indicator, first BIDS ink supply safety valve $V_{B1}$ can be closed and first BIDS ink supply valve $V_{B3}$ can be closed, so that first ink supply container, Ink 1, can be isolated and either refilled or replaced. Following the isolation of Ink 1, second BIDS ink supply safety valve $V_{B2}$ can be opened and second BIDS ink supply valve $V_{B4}$ can be opened so that second ink supply container, Ink 2, can act as the source of ink supply for a gas enclosure system, such as gas enclosure system 500A of FIG. 13. First BIDS ink supply line $L_{B1}$, and second BIDS ink supply line $L_{B2}$ can be joined at a T-junction using two valves, as shown in FIG. 14, or a 3-way valve can be used. Either one of first BIDS ink supply line $L_{B1}$, or second BIDS ink supply line can be in flow communication with third BIDS line $L_{B3}$, depending on which ink supply source is in use. Third BIDS line $L_{B3}$ can be in flow communication with first BIDS pump $P_{B1}$, which can be a pneumatic piston syringe or metering pump compatible with the chemistry of the ink used. During processes requiring ink flow from bulk ink supply system 3310, fifth BIDS valve $V_{B5}$ is in an open position, allowing flow between third BIDS line $L_{B3}$ and forth BIDS line $L_{B4}$. Forth BIDS line $L_{B4}$ passes through filter 3312 and is in flow communication with fifth BIDS line $L_{B5}$, which is in flow communication with a degasser for removing dissolved gases in an ink from a bulk in supply source of bulk ink supply system 3310. Finally, after being degassed, ink can flow through sixth BIDS line $L_{B6}$, which is in flow communication with local ink delivery system 3500. Sixth BIDS line LBG can be controlled at the outlet by a suckback valve located in local ink delivery system 3500, as shown in FIG. 14.

In addition to bulk ink supply system 3310, bulk ink delivery system 3300 can have BIDS maintenance system 3330 that can include a solvent line, seventh BIDS solvent line $L_{B7}$, as well as an inert gas line, eighth BIDS gas line $L_{B8}$, depicted in FIG. 14 as utilizing a nitrogen source. Seventh BIDS solvent line $L_{B7}$, can have can be in flow communication with second BIDS pump $P_{B2}$, which can be a pneumatic piston syringe or metering pump compatible with the chemistry of the solvent used. Seventh BIDS solvent line $L_{B7}$ and eighth BIDS gas line $L_{B8}$ can have first BIDS maintenance system safety valve $V_{B6}$ and second BIDS maintenance system safety valve $V_{B7}$, respectively, which are in a normally closed position during processing, but can be selectively opened during, for example, but not limited by, a maintenance procedure. For example, during a maintenance procedure, the BIDS valves associated with bulk ink supply system 3310, BIDS valves $V_{B1}$ through $V_{B5}$, would remain in a closed position. If a maintenance procedure utilizing a solvent is implemented, then BIDS valves $V_{B6}$, $V_{B8}$, and $V_{B10}$ can be opened, so that solvent line, seventh BIDS solvent line $L_{B7}$ can be in flow communication with sixth BIDS line $L_{B6}$, which is in flow communication with local ink delivery system 3500, as previously described. Additionally, if during a maintenance procedure an inert gas is utilized, then BIDS valves $V_{B7}$, $V_{B9}$, and $V_{B10}$ can be opened, so that inert gas line, eighth BIDS gas line $L_{B8}$, can be in flow communication with sixth BIDS line $L_{B6}$, which is in flow communication with local ink delivery system 3500, as previously described. It should be mentioned that, similarly to that described for bulk ink supply system 3310, seventh BIDS solvent line $L_{B7}$, and eighth BIDS gas line $L_{B8}$ can be joined at a T-junction using two valves, as shown in FIG. 14, to be in flow communication with ninth BIDS line $L_{B9}$. Likewise, third BIDS line $L_{B3}$, and ninth BIDS line $L_{B9}$ can be joined at a T-junction using two valves, as shown in FIG. 14, to be in flow communication with forth BIDS line $L_{B4}$. In either case, a 3-way valve can be used in an equivalent fashion to a T-junction using two valves.

As depicted in FIG. 14, local ink delivery system 3500 according to various systems and methods of the present teachings can include local ink supply system 3600, printhead ink delivery system 3700 and local ink waste assembly 3800. For various embodiments of the present teachings, local ink supply system 3600 can be in flow communication with bulk ink delivery system 3300 via sixth BIDS line $L_{B6}$, while local ink waste assembly 3800 can be in flow communication with bulk ink delivery system waste assembly 3340 through tenth BIDS line $L_{B10}$. Tenth BIDS line $L_{B10}$, can have third BIDS pump $P_{B3}$, which can be a pneumatic piston syringe or metering pump compatible with the chemistry of the waste being removed from printhead ink delivery system 3700.

Figure 15:
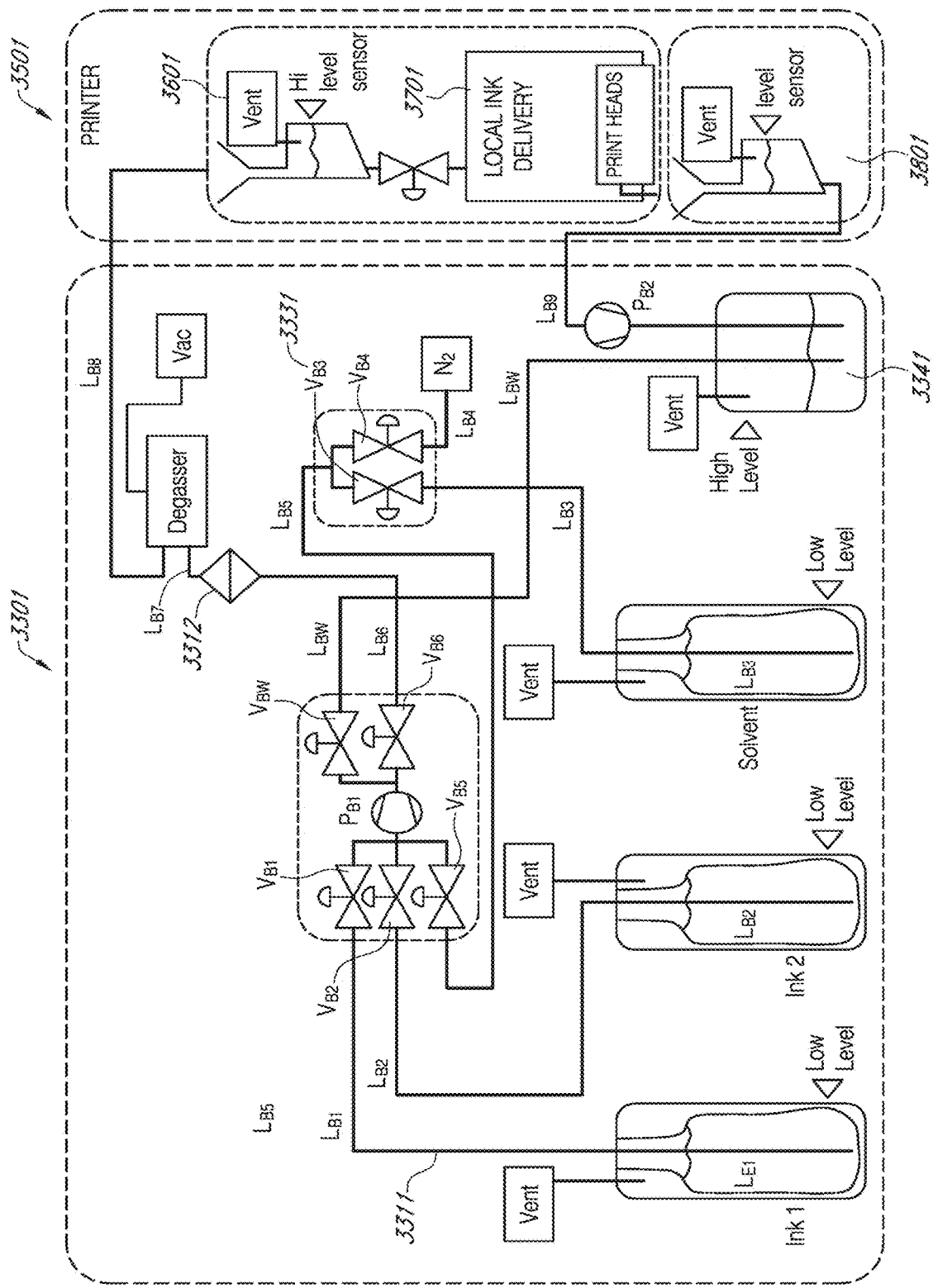
FIG. 15 is a schematic representation of a bulk ink delivery system according to various embodiments of the present teachings.

In FIG. 15, a schematic depiction of various embodiments of bulk ink delivery system 3301 is shown. Bulk ink delivery system 3301 can be in flow communication with local ink delivery system 3501. For various embodiments of bulk ink delivery system 3301, pump $P_{B1}$ can be a metering pump that can effectively pump both liquid and gaseous fluids. In that regard, both bulk ink supply system 3311 and maintenance system 3331 of bulk ink delivery system 3301 can utilize metering pump $P_{B1}$ for flow control. As depicted in FIG. 15, metering pump $P_{B1}$ provides a controllable manifold system that has three input lines, with the potential for three output lines; of which two are indicated in FIG. 15, all of which are controlled using metering pump valves as indicated. The number of controllable input and output lines can vary, according to various embodiments of metering pumps. Various embodiments of metering pumps utilized in embodiments of bulk ink delivery systems of the present teachings can have attributes that can include, for example, but not limited by, capable of controlling both liquid and gaseous fluids, corrosion resistant polymeric surfaces in contact with fluid flow to prevent corrosion and contamination, zero dead volume connections preventing cross-contamination, minimum hold-up volume for fast priming using a minimum volume of various inks, and valves with suckback capability. Accordingly, various embodiments of bulk ink delivery system 3301 can utilize fewer valves and pumps than various embodiments of bulk ink delivery system 3300 of FIG. 14.

Bulk ink delivery system (BIDS) 3301 of FIG. 15 can have bulk ink supply system 3311 that can have first BIDS ink supply line $L_{B1}$ in flow communication with a first ink source, and second BIDS ink supply line $L_{B2}$ in flow communication with a second ink source. First BIDS ink supply line $L_{B1}$ and second BIDS ink supply line $L_{B2}$ can controlled by first BIDS valve $V_{B1}$ and second BIDS valve $V_{B2}$, respectively, which can part of the assembly of multi-port metering pump $P_{B1}$, as indicated in FIG. 15. In addition to providing flow control for bulk ink supply system 3311, given the capability that metering pump $P_{B1}$ has for controllably handling a variety of different fluids with minimum hold-up volume, metering pump $P_{B1}$ can also be used for controllably handling maintenance system 3331. For example, in FIG. 15, third BIDS solvent supply line $L_{B3}$ can be in flow communication with a solvent source and forth BIDS gas supply line $L_{B4}$ can be in flow communication with an inert gas source, for example, a nitrogen source as indicated in FIG. 15. Third BIDS solvent supply line $L_{B3}$ and forth BIDS gas supply line $L_{B4}$ can be controlled by third BIDS solvent supply valve $V_{B3}$ and forth BIDS gas supply valve $V_{B4}$, respectively. As depicted in FIG. 15, third BIDS solvent supply line $L_{B3}$ and forth BIDS gas supply line $L_{B4}$ can be in flow communication with fifth BIDS line $L_{B5}$, which can be controlled by fifth BIDS maintenance system supply valve $V_{B5}$. Fifth BIDS maintenance system supply valve $V_{B5}$ can part of the assembly of multi-port metering pump $P_{B1}$, as indicated in FIG. 15. Third BIDS solvent supply line $L_{B3}$, and forth BIDS gas supply line $L_{B4}$ can be joined at a T-junction using two valves, as shown in FIG. 15, or a 3-way valve can be used. Third BIDS solvent supply valve $V_{B3}$ and forth BIDS inert gas supply valve $V_{B4}$ are in a normally closed position during processing, but can be selectively opened during a maintenance procedure, as will be discussed in more detail subsequently, herein.

Initially for various embodiments of systems and methods of FIG. 15, for example, before a printing procedure has begun, priming of ink line through the manifold system of metering pump $P_{B1}$ can be done. For example, once an ink supply is available from first ink supply container Ink 1, first BIDS ink supply line $L_{B1}$ can be primed with ink from Ink 1 by opening first BIDS ink supply valve $V_{B1}$ and BIDS waste line valve $V_{BW}$, while all other valves remain closed. With the valve states so positioned, priming of first BIDS ink supply line $L_{B1}$ can be done, in which there is flow communication between first BIDS ink supply line $L_{B1}$ and bulk ink delivery system waste assembly 3341 through BIDS waste line $L_{BW}$. After priming, during, for example, the initiation of a printing process, first BIDS ink supply valve $V_{B1}$ and sixth BIDS valve $V_{B6}$ of metering pump $P_{B1}$ can be open, while all other valves are closed. With the valve states so positioned, first ink supply container, Ink 1, is in flow communication with bulk ink delivery system 3301, which is in flow communication with local ink delivery system 3501. Second BIDS line $L_{B2}$ can be primed with ink from Ink 2 in a similar fashion as given in the example for priming first BIDS ink supply line $L_{B1}$.

Though two ink supply sources are indicated in FIG. 15, a plurality of ink supply containers can be included in bulk ink supply system 3311, and can act as sequential supply sources of ink. For example, as shown in FIG. 15, when the level of ink in first ink supply container, Ink 1, is at the low level indicator, first BIDS ink supply valve $V_{B1}$ of metering pump $P_{B1}$ can be closed, so that first ink supply container, Ink 1, can be isolated and either refilled or replaced. Following the isolation of Ink 1, second BIDS ink supply valve $V_{B2}$ of metering pump $P_{B1}$ can be opened, so that second ink supply container, Ink 2, can act as the source of ink supply for a gas enclosure system, such as gas enclosure system 500A of FIG. 13. Either one of first BIDS line ink supply $L_{B1}$ or second BIDS ink supply line $L_{B2}$ can be in flow communication with sixth BIDS line $L_{B6}$, depending on which ink supply source is in use. During processes requiring ink flow from bulk ink supply system 3311, first BIDS ink supply valve $V_{B1}$ and sixth BIDS valve $V_{B6}$ of metering pump $P_{B1}$ can be open, while all other valves are closed, allowing flow between first BIDS ink supply line $L_{B1}$ and sixth BIDS line $L_{B6}$. Sixth BIDS line $L_{B6}$ passes through filter 3312 and is in flow communication with seventh BIDS line $L_{B7}$, which is in flow communication with a degasser for removing, for example, but not limited by, dissolved gases in an ink from an bulk in supply source of bulk ink supply system 3311. Finally, after being degassed, ink can flow through eighth BIDS line $L_{B8}$, which is in flow communication with local ink delivery system 3501. Unlike sixth BIDS line $L_{B6}$ of bulk ink supply system 3310 of FIG. 14, eighth BIDS line $L_{B8}$ does not require a suckback valve located in local ink delivery system 3500, as shown in FIG. 14, when a metering pump, such as metering pump $P_{B1}$ of FIG. 15, can provide such control.

As previously discussed herein, in addition to bulk ink supply system 3311, bulk ink delivery system 3301 of FIG. 15 can have BIDS maintenance system 3331. BIDS maintenance system 3331 can include third BIDS solvent supply line $L_{B3}$ and forth BIDS gas supply line $L_{B4}$, which can be controlled by third BIDS solvent supply valve $V_{B3}$ and forth BIDS inert gas supply valve $V_{B4}$, respectively. As depicted in FIG. 15, third BIDS solvent supply line $L_{B3}$ and forth BIDS gas supply line $L_{B4}$ can be in flow communication with fifth BIDS line $L_{B5}$. Fifth BIDS line $L_{B5}$ can be controlled by fifth BIDS maintenance system supply valve $V_{B5}$ of metering pump $P_{B1}$.•Additionally, for bulk ink delivery system 3301 of FIG. 15, BIDS waste line $L_{BW}$ can be in flow communication with bulk ink delivery system waste assembly 3341. BIDS waste line $L_{BW}$ can be controlled by BIDS waste line valve $V_{BW}$ of metering pump $P_{B1}$.•Third BIDS solvent supply valve $V_{B3}$, forth BIDS gas supply valve $V_{B4}$, fifth BIDS maintenance system supply valve $V_W$ and BIDS waste line valve $V_{BW}$ are in a normally closed position during processing, but can be selectively opened during a maintenance procedure.

For example, during a maintenance procedure, the BIDS valves of metering pump $P_{B1}$ associated with bulk ink supply system 3311, BIDS valves $V_{B1}$, $V_{B2}$, and $V_{B6}$, would remain in a closed position. If a maintenance procedure utilizing a solvent purge is implemented, then BIDS valves $V_{B3}$, $V_{B5}$, and $V_{BW}$ can be opened, so that solvent priming can be done through fifth BIDS line $L_{B5}$, which can be in flow communication bulk ink delivery system waste assembly 3341. After priming, during a maintenance procedure utilizing solvent cleaning of, for example, lines within local ink delivery system 3501, then BIDS waste line valve $V_{BW}$ can be closed, and BIDS valves $V_{B3}$, $V_{B5}$ and $V_{B6}$ can be opened, so that solvent can flow through fifth BIDS line $L_{B5}$, which can be in flow communication with sixth BIDS line $L_{B6}$. Sixth BIDS line $L_{B6}$ is in flow communication with local ink delivery system 3500, as previously described, providing solvent flow throughout local ink delivery system 3501, and eventually to bulk ink delivery system waste assembly 3341 through ninth BIDS line $L_{B9}$. Additionally, if a maintenance procedure utilizing an inert gas is implemented, then BIDS valves $V_{B4}$, $V_{B5}$, and $V_{B6}$ can be opened, so that inert gas can flow through fifth BIDS line $L_{B5}$, which can be in flow communication with sixth BIDS line $L_{B6}$. Sixth BIDS line $L_{B6}$ is in flow communication with local ink delivery system 3500, as previously described.

As depicted in FIG. 15, local ink delivery system 3501 according to various systems and methods of the present teachings can include local ink supply system 3601, printhead ink delivery system 3701 and local ink waste assembly 3801. For various embodiments of the present teachings, local ink supply system 3601 can be in flow communication with bulk ink delivery system 3301 via eighth BIDS line $L_{B8}$, while local ink waste assembly 3801 can be in flow communication with bulk ink delivery system waste assembly 3341 through ninth BIDS line $L_{B9}$. Ninth BIDS line $L_{B9}$ can have second BIDS pump $P_{B2}$, which can be a pneumatic piston syringe or metering pump compatible with the chemistry of the waste being removed from printhead ink delivery system 3701.

Figure 16:
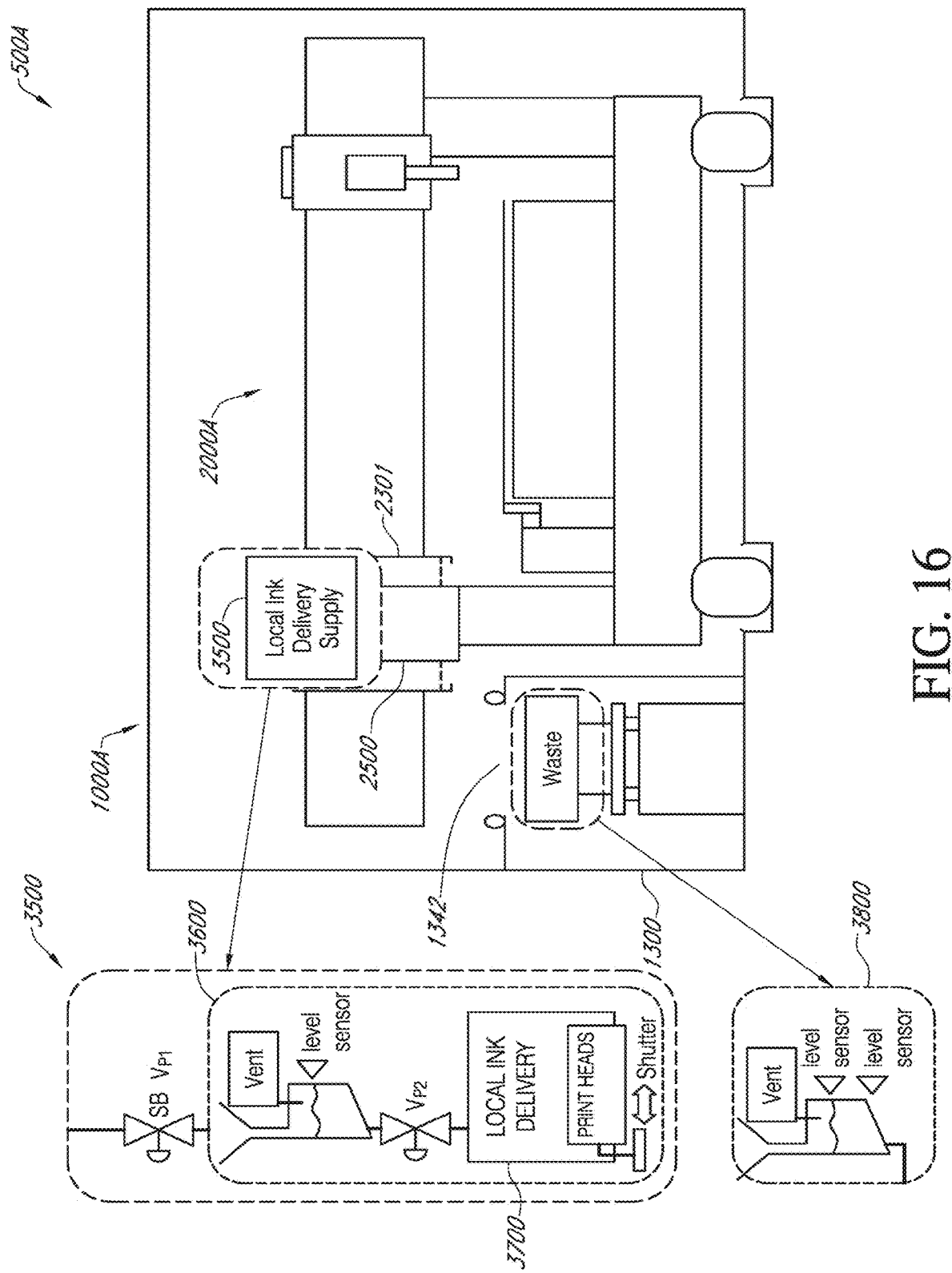
FIG. 16 is a schematic representation of a local ink delivery system for an enclosed printing system according to various embodiments of the present teachings.

FIG. 16 depicts a schematic section view of gas enclosure system 500A, that can include gas enclosure 1000A with local ink delivery system 3500. As previously described herein, local ink delivery system 3500 according to various embodiments of the present teachings can include local ink supply system 3600, printhead ink delivery system 3700 and local ink waste assembly 3800. As depicted in FIG. 16, sixth BIDS line $L_{E6}$ can be controlled by suckback valve $V_{P1}$ located in local ink delivery system 3500, so that ink can be delivered directly to a bulk ink supply reservoir, which is part of local ink supply system 3600. In that regard, various embodiments of a bulk ink delivery system of the present teachings can bring an ink supply directly to a bulk supply reservoir of ink reservoir local ink supply system 3600, which can be in flow communication with a bulk ink reservoir that is in flow communication with a dispensing reservoir in flow communication with, for example, a plurality of printhead devices, such as printhead devices 2505 of FIG. 1C. As will be discussed in more detail herein, various embodiments of printhead ink delivery system 3700 can utilize a two-stage ink delivery assembly. Moreover, a local ink waste assembly internal a gas enclosure can be in flow communication with a bulk ink delivery system waste assembly that is part of a bulk ink delivery system. Accordingly, various embodiments of a bulk ink delivery system, which can be substantially external to a gas enclosure system, can be in flow communication with a local ink delivery system internal a gas enclosure system in a fashion that avoids running ink lines to a printhead assembly, such as printhead device assembly 2500 on first X-axis carriage assembly 2301 of FIG. 1C, through a cable carrier. As such, a bulk replenishment system that is substantially external to a gas enclosure is more readily accessible for service, such as replenishing ink and solvent supplies, as well as changing lines carrying various inks and solvents.

Figure 17:
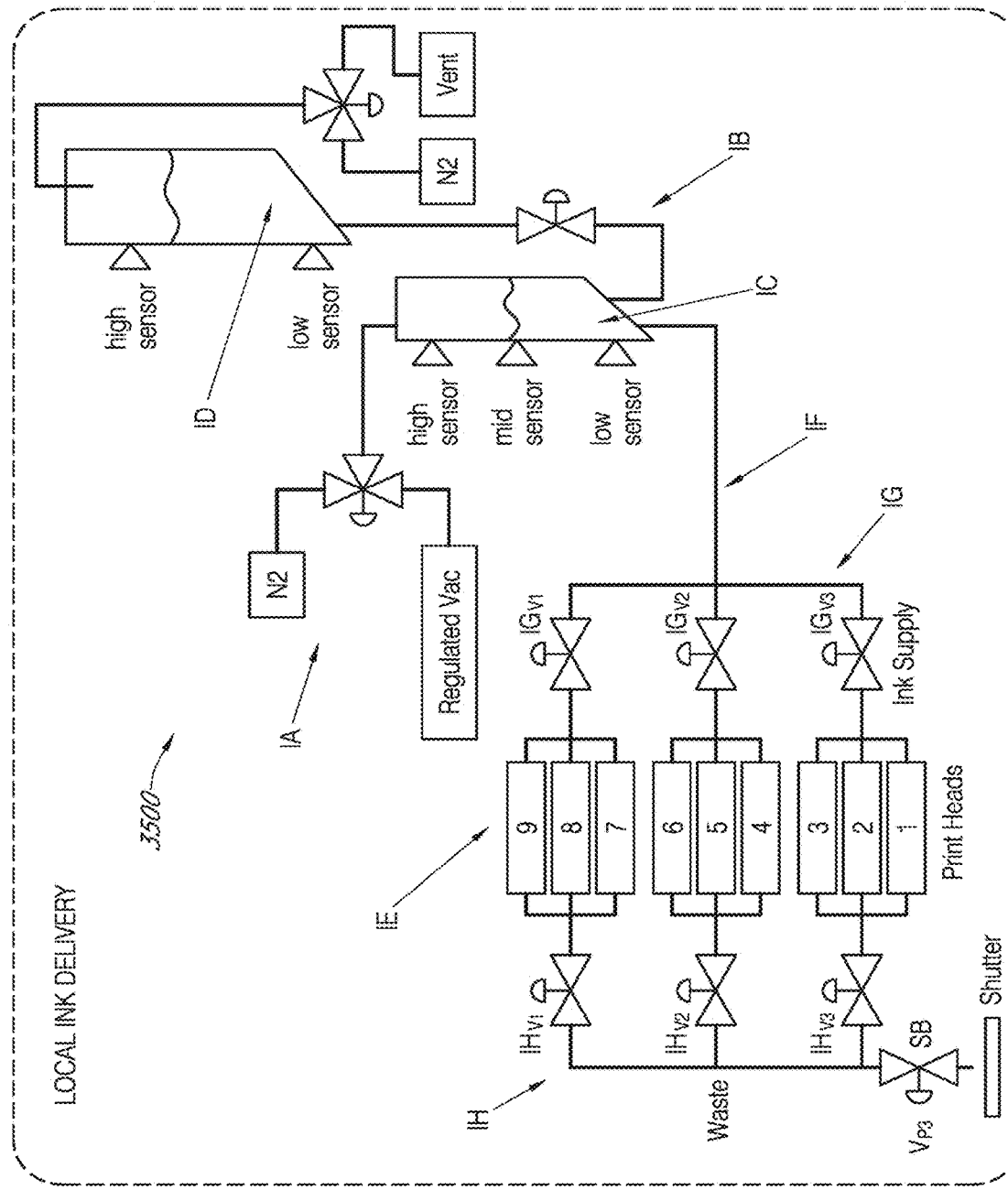
FIG. 17 is a schematic representation of a local ink delivery system in flow communication with a printhead ink delivery system for an enclosed printing system according to various embodiments of the present teachings.

FIG. 17 is a schematic view of a local ink delivery system including a printhead ink delivery system according to the present teachings. For various embodiments a local ink delivery system of the present teachings, pneumatic control assembly IA can provide control between primary dispensing reservoir IC and various pneumatic control sources, such as gas and vacuum sources. According to various embodiments of a local ink delivery system of the present teachings, local ink delivery line IB can be capable of proving fluidic distribution and control between primary dispensing reservoir IC and local bulk ink reservoir ID. Primary dispensing reservoir IC can be in flow communication with a plurality of printheads IE through input manifold line IF. In the schematic representation of FIG. 17, three printheads are indicated for each of 3 printhead device assemblies. Printhead assembly input manifold line IF can be in flow communication with printhead assembly input manifold IG. Printhead assembly input manifold IG can be in flow communication with each of a plurality of printhead devices, where each printhead device can have at least three printheads, number sequentially as printhead 1 through printhead 9 in FIG. 17. The flow communication between printhead assembly input manifold IG and each printhead device can be controlled by using printhead assembly manifold valves $IG_{V1}$, $IG_{V2}$ and $IG_{V3}$. Finally, the plurality of printhead assemblies can be in flow communication with a printhead assembly output waste line, which is a part of printhead output manifold IH. Printhead assembly output waste line can be in flow communication with a local ink waste assembly, which in turn is in flow communication with a bulk ink delivery system waste assembly (see, for example, FIG. 14 and FIG. 15). The flow communication between printhead assembly output manifold IH and each printhead device can be controlled by using printhead assembly manifold line valves $IH_{V1}$, $IH_{V2}$ and $IH_{V3}$.

Figure 18A:
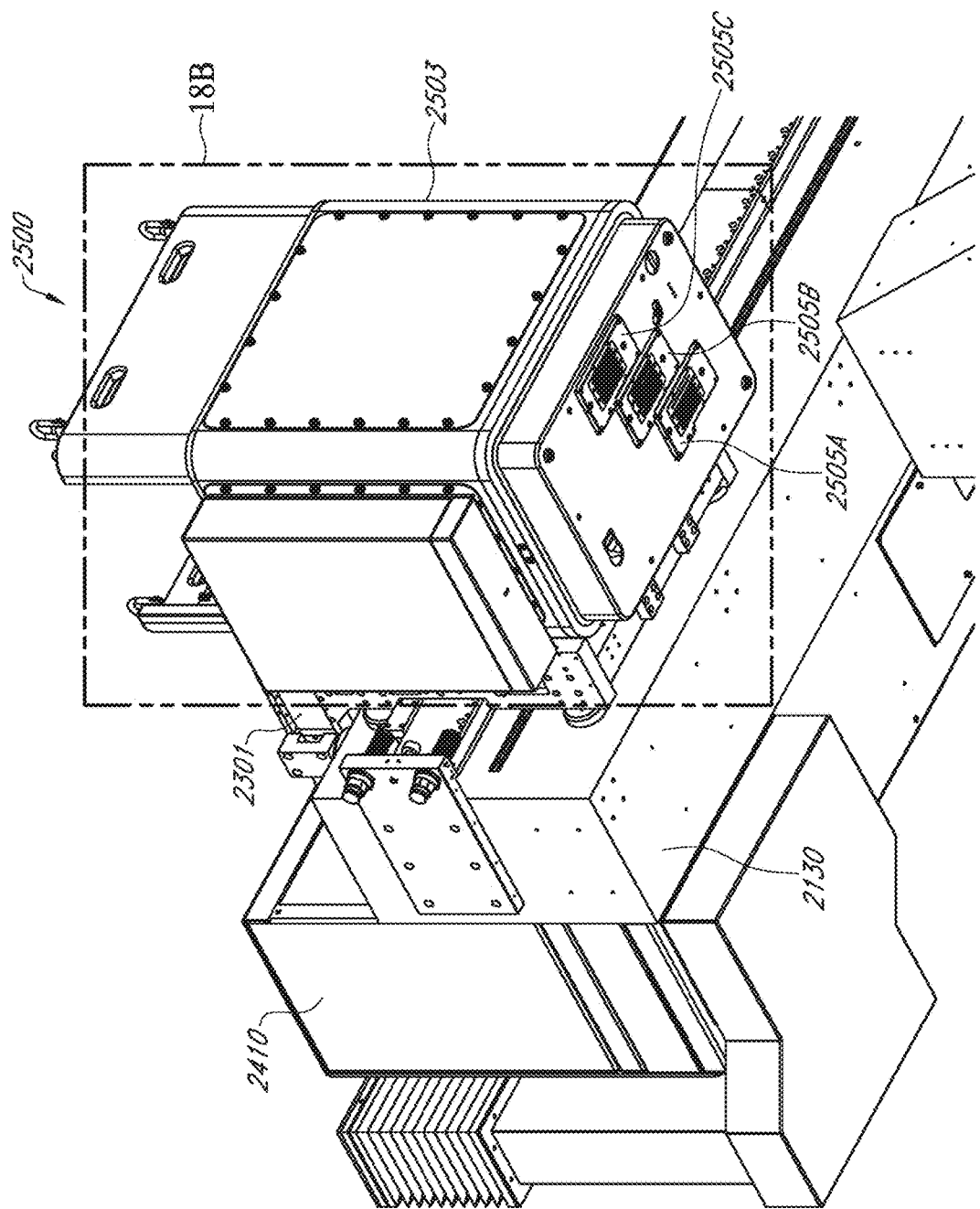
FIG. 18A is a bottom perspective view of a printhead assembly mounted on an X-axis bridge.

FIG. 18A is a bottom expanded perspective view of printhead device assembly 2500, mounted on a printhead assembly positioning system, such as first X-axis carriage assembly 2301 (see also FIG. 1C). First X-axis carriage assembly 2301 can be positioned in an X-axis direction on printing system bridge 2130 relative to a substrate, such as substrate 2050 of FIG. 1C. As shown in FIG. 18A, service bundle housing 2410 is mounted to printing system bridge 2130. Service bundle housing 2410 can contain various service bundles operatively connected from various apparatuses and system to a gas enclosure system including a printing system. Various embodiments of a service bundle can include bundled optical cables, electrical cables, wires and tubing, and the like, for providing optical, electrical, mechanical, and fluidic functions for various assemblies and systems disposed within the interior of the gas enclosure system. During various process steps, such as printing and maintenance steps, as X-axis carriage assembly 2301 moves printhead device assembly 2500 across printing system bridge 2130, various service bundles move accordingly. Therefore, liquid ink lines in such service bundles are subject to continuous flexure and wear. According to systems and methods of the present teachings, a bulk ink delivery system external a gas enclosure system can be in fluid communication with a local ink delivery supply system internal to a gas enclosure system that obviates the need to run ink lines through a service bundle located in service bundle housing 2410. As such, a bulk replenishment system that is substantially external to a gas enclosure is more readily accessible for service, such as replenishing ink and solvent supplies, as well as servicing or replacing various lines and valves.

As depicted in FIG. 18A, printhead device assembly 2500 can have printhead assembly enclosure 2503, which can enclose a plurality of printhead devices 2505A, 2505B, and 2505C, mounted therein. For various embodiments of printing system 2000 of FIG. 1C or printing system 2000A of FIG. 13 and FIG. 16, a printhead device assembly can include between about 1 to about 60 printhead devices, where each printhead device can have between about 1 to about 30 printheads in each printhead device. As depicted in FIG. 18A, according to systems and methods of the present teachings, printhead device assembly 2500 can have three printhead devices, where each printhead device can have three printheads (see also FIG. 17). As will be discussed in more detail herein, given the number of printhead devices and printheads requiring continual maintenance, printhead device assembly 2500 can be positioned over a maintenance system for ready placement or replacement of a printhead device or a printhead.

Figure 18B:
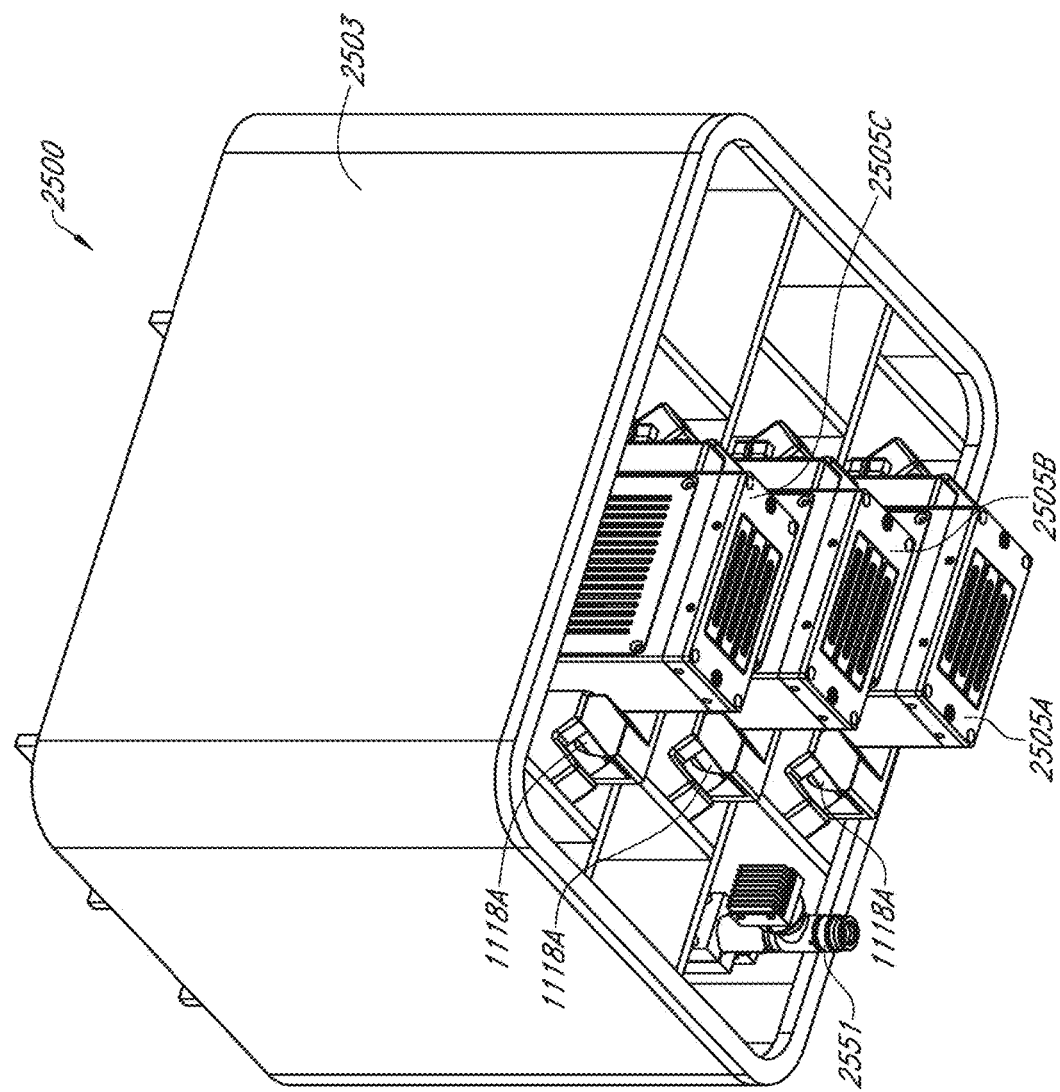
FIG. 18B is an expanded view of FIG. 18A.

As shown in the bottom perspective view of FIG. 18B, printhead device assembly 2500 can have printhead devices 2505A, 2505B, and 2505C mounted using a kinematic mount, similar to what was described for the kinematic mounting of printhead unit 1000 of, for example, FIG. 13A. In that regard, as will be discussed in more detail subsequently herein, various embodiments of a kinematic mounting assembly for the vertical mounting of embodiments of a printhead device, such as printhead devices 2505A, 2505B, and 2505C of FIG. 18B into a printhead device assembly, such as printhead device assembly 2500 of FIG. 18B can utilize, for example, a canoe sphere and V-block assembly. In FIG. 18B, canoe sphere 1118A is depicted for each printhead device 2505A, 2505B, and 2505C of FIG. 18B.

Additionally, camera assembly 2551 is shown mounted in printhead assembly enclosure 2503. For various embodiments of systems and methods of the present teachings, a plurality of cameras can be mounted on various devices, apparatuses and assemblies to provide real-time visualization of operations within a gas enclosure system, such as gas enclosure system 500A of FIG. 13. For example, camera assembly 2550 of FIG. 13, and camera assembly 2551 of FIG. 18B can be utilized, for example, but not limited by, navigation, as well as inspection. Various embodiments of a printing system camera assembly can have different specifications regarding field of view and resolution. For example, one camera can be a line scan camera for in situ particle inspection, while a second camera can be used for the regular navigation of a substrate in a gas enclosure system, or for the location of a printhead device assembly relative to a substrate. Such a camera useful for regular navigation can be an area scan camera having a field of view in the range of about 5.4 mm×4 mm with a magnification of about 0.9× to about 10.6 mm×8 mm with a magnification of about 0.45×. In still other embodiments, one camera can be a line scan camera for in situ particle inspection, while a second camera can be used for the precise navigation of a substrate in a gas enclosure system, for example, for substrate alignment, or for the precise location of a printhead device assembly relative to a substrate. Such a camera can be useful for precise navigation can be an area scan camera having a field of view of about 0.7 mm×0.5 mm with a magnification of about 7.2×.

Figure 19A:
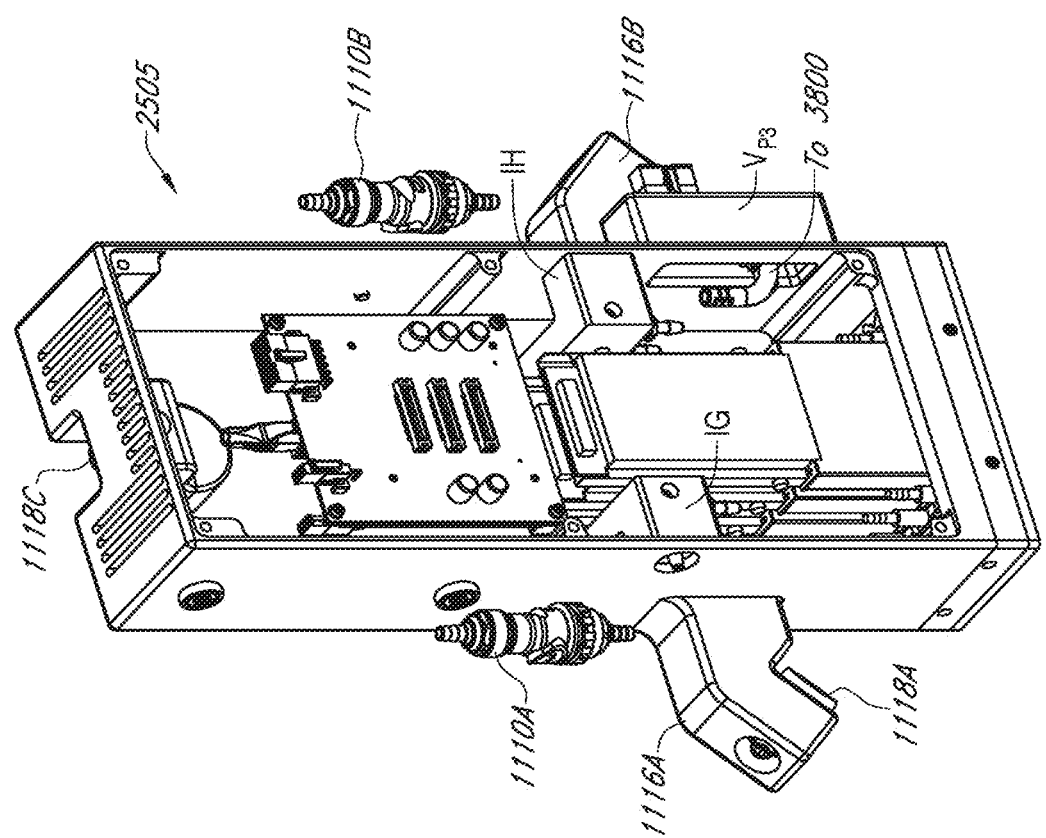
Figure 19B:
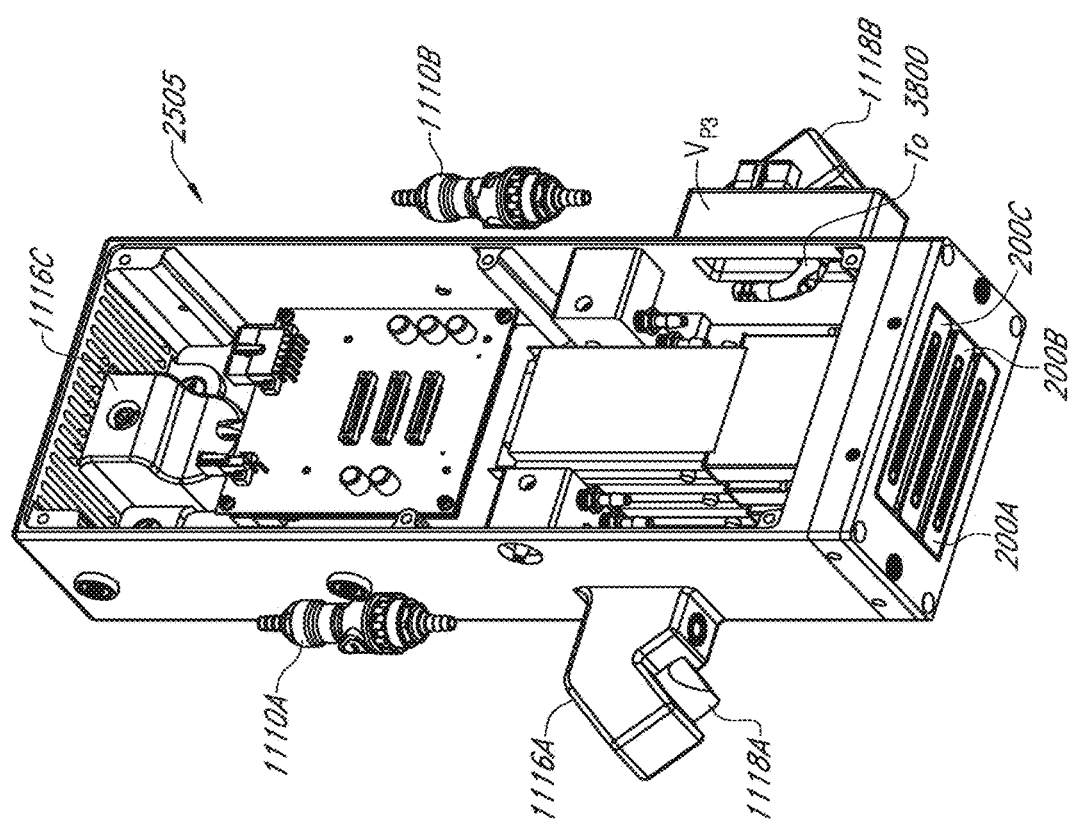
FIG. 19B is a front bottom perspective view of a printhead device, according to various embodiments of the present teachings.

FIG. 19A and FIG. 19B depict various perspective views of printhead device 2505 according to various embodiments of a printhead device of the present teachings. As previously described herein, kinematic mounting of a printhead unit to a printing system can provide for a repeatable, strain-free positioning of various embodiments of a printhead unit or a printhead device of the present teachings. For example, kinematic mounting assemblies described for the kinematic mounting of printhead unit 1000 can utilize a point contact kinematic assembly, such as a ball and V-block kinematic mounting assembly. Various embodiments of a kinematic mounting assembly for the vertical mounting of a plurality of printhead devices into a printhead device assembly can utilize a line contact kinematic assembly, for example, but not limited by, a canoe sphere and V-block kinematic mounting assembly. Various embodiments of a line contact kinematic mounting assembly can carry substantially more load, for example, at least about 100 times more load, than an equivalent kinematic mounting assembly providing point contact. Various embodiments of a kinematic mounting assembly provide significant stability for the repeatable, strain-free positioning of the vertical mounting a printhead device into a printhead device assembly, as well as providing stability during the X-axis movement of a printhead device assembly by naturally resisting the movement in the X-axis direction.

In the top perspective view of FIG. 19A and bottom perspective view of FIG. 19B, first canoe sphere mounting fixture 1116A for first canoe sphere 1118A can be seen, as well as second canoe sphere mounting fixture 1116B for second canoe sphere 1118B. Third canoe sphere mounting fixture 1116C is apparent in FIG. 19A and FIG. 19B, for which a third canoe sphere can be mounted on back of printhead device 2505. The positions of a set of canoe spheres 1118A, 1118B, and 1118C, once each is engaged in a mating surface of a V-block mount, can be used for the repeatable and strain-free vertical bottom insertion of printhead device 2505 into a printhead device assembly, such as printhead device assembly 2500 of FIG. 18A and FIG. 18B. As shown in FIG. 19B, each printhead device can have 3 end-user selected printhead assemblies, 200A, 200B, and 200C. Printhead device 2505 can have first quick-coupling connector 110A, providing ease of connecting fluidic lines coming into printhead device 2505, as well as second quick-coupling connector 1110B, providing ease of connecting fluidic lines going from printhead device 2505. As shown in the schematic depiction of the fluidic system in FIG. 17 for various embodiments of a local ink delivery system, the flow communication from the local ink delivery system for each printhead device in a printhead device assembly can be controlled by using printhead assembly manifold valves $IG_{V_1}$, $IG_{V_2}$ and $IG_{V_3}$. Also as shown in FIG. 17, the flow communication from each printhead device in a printhead device assembly to a printhead output manifold can be controlled by using printhead assembly manifold valves $IH_{V_1}$, $IH_{V_2}$ and $IH_{V_3}$, which are part of printhead output manifold IH of FIG. 17. Various embodiments of a printhead output manifold can be in flow communication with a local ink waste assembly, such as local ink waste assembly 3800, for example, of FIG. 16. In FIG. 19A and FIG. 19B, input printhead assembly manifold valve $IG_V$ and output printhead assembly manifold valve $IH_V$ are shown for printhead device 2505.

Figure 19C:
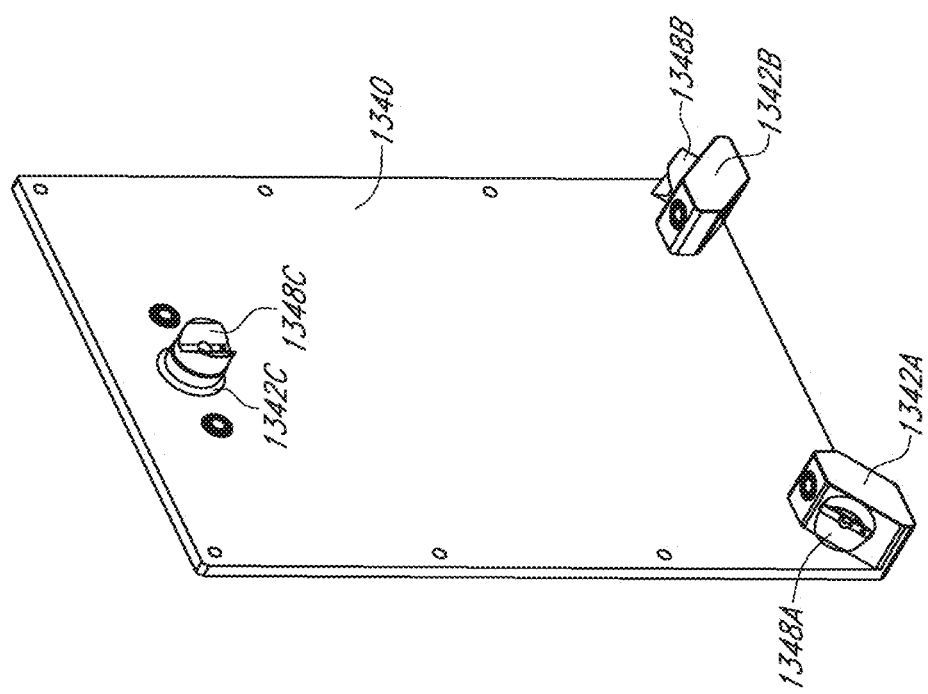
Figure 19D:
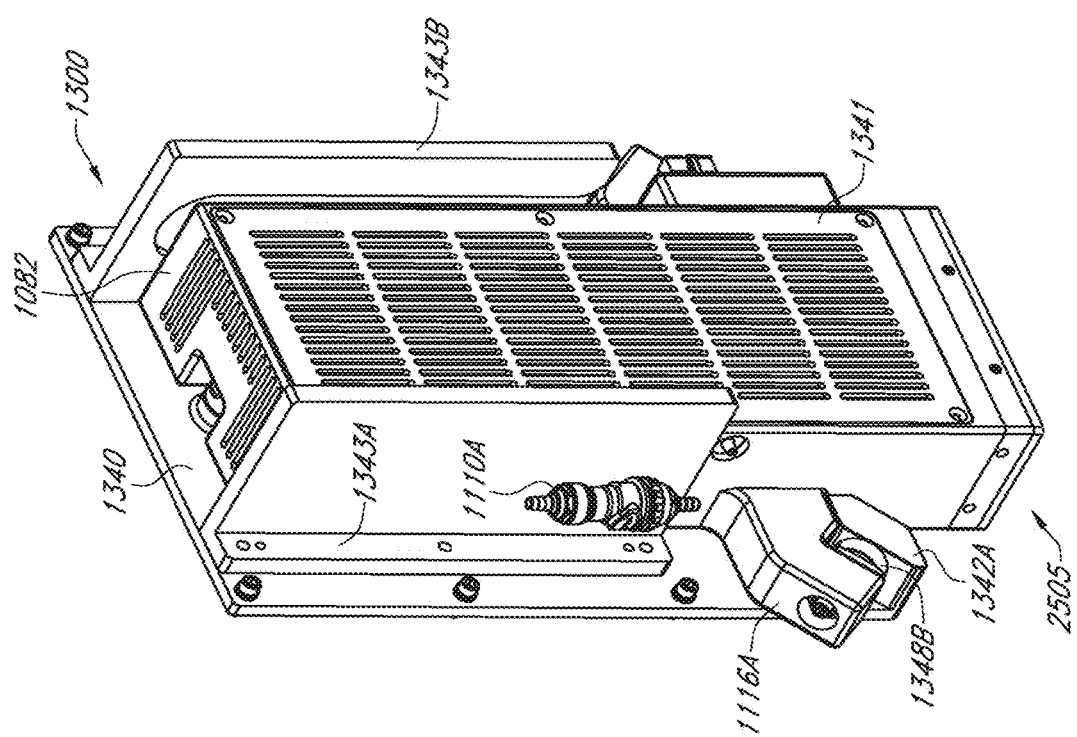
FIG. 19D is a front bottom perspective view of a printhead device mounted in a mounting assembly, according to various embodiments of the present teachings.

FIG. 19C depicts printhead device kinematic mounting plate 1340 with first V-block 1348A, second V-block 1348B, and third V-block 1348C, which are mating surfaces for first canoe sphere 1118A, second canoe sphere 1118B, and third canoe sphere 1118C, respectively of FIG. 19A and FIG. 19B. First V-block 1348A, second V-block 1348B, and third V-block 1348C can be affixed to printhead device kinematic mounting plate 1340 using first V-block mounting fixture 1342A, second V-block mounting fixture 1342B, and third V-block mounting fixture 1342C, respectively. As depicted in FIG. 19A through FIG. 19C, first V-block 1348A is a mating surface for first canoe sphere 1118A, second V-block 1348B is a mating surface for second canoe sphere 1118B, and third V-block 1348C is a mating surface for third canoe sphere 1118C. FIG. 19D depicts printhead device unit 1300, with printhead device 2505 mounted on printhead device kinematic mounting plate 1340, using canoe sphere and V-block kinematic mounts. For example, in FIG. 19D, first canoe sphere 1118A as shown in FIG. 19B is mounted to first canoe sphere mounting fixture 1116A, and is engaged in first V-block 1348A, which is mounted on first V-block mounting fixture 1342A. First V-block mounting fixture 1342A is one of three V-block mounting fixtures mounted to printhead device kinematic mounting plate 1340, as previously described herein. In that regard, the coupling of first canoe sphere 1118A to first V-block 1348A for printhead device unit 1300 of FIG. 19D is exemplary of the coupling of second canoe sphere 1118B and third canoe sphere 1118C with second V-block 1348B and third V-block 1348C, respectively. In addition to printhead device kinematic mounting plate 1340, various embodiments of a mounting assembly for a printhead device unit, such as printhead device unit 1300 of FIG. 19O, can include printhead device front mounting plate 1341 as well as first printhead device side mounting plate 1343A and second printhead device side mounting plate 1343B. Each quick-coupling connector as shown in FIG. 19A and FIG. 19B can be mounted to a printhead device side mounting plate, as depicted in FIG. 19O for first quick-coupling connector 1110A mounted to first printhead device side mounting plate 1343A.

According to various systems and methods of the present teaching a printhead device, such as printhead devices 2505A, 2505B, and 2505C of FIG. 18A and FIG. 18B can be manually or automatically inserted from the bottom of printhead device assembly 2500. For example, as depicted in FIG. 10 printhead installation or replacement can be done robotically. As previously discussed herein in reference to FIG. 13, a gas enclosure, such as gas enclosure 1000A, can have auxiliary panel assembly 1330, which can enclose printhead management system 2701. In FIG. 10, the installation or replacement of a printhead device or printhead, can be done in auxiliary panel assembly 1330 using robot 2530. Printhead replacement module 2713 of printhead management system 2701 FIG. 10 can include a docking station for a printhead device having at least one printhead, as well as a storage receptacle for a plurality of printhead devices, as well as a plurality of printheads. Each printhead assembly of the present teachings can include between about 1 to about 60 printhead devices, and as each printhead device can have between about 1 to about 30 printheads (for example, but not limited by, see printhead device assembly 2500 of FIG. 1C and FIG. 18A). Accordingly, in addition to having between 1 to about 60 printhead devices, various embodiments of a printing system of the present teachings can have between about 1 to about 1800 printheads. As previously discussed herein, a printhead device, such as printhead device 2505 of FIG. 19A and FIG. 19B can be installed or replaced through the strain-free bottom insertion of a printhead device in a printhead assembly, such as printhead device assembly 2500 of FIG. 23A and FIG. 18B, of which a bottom view is indicated in FIG. 1D.

Figure 20:
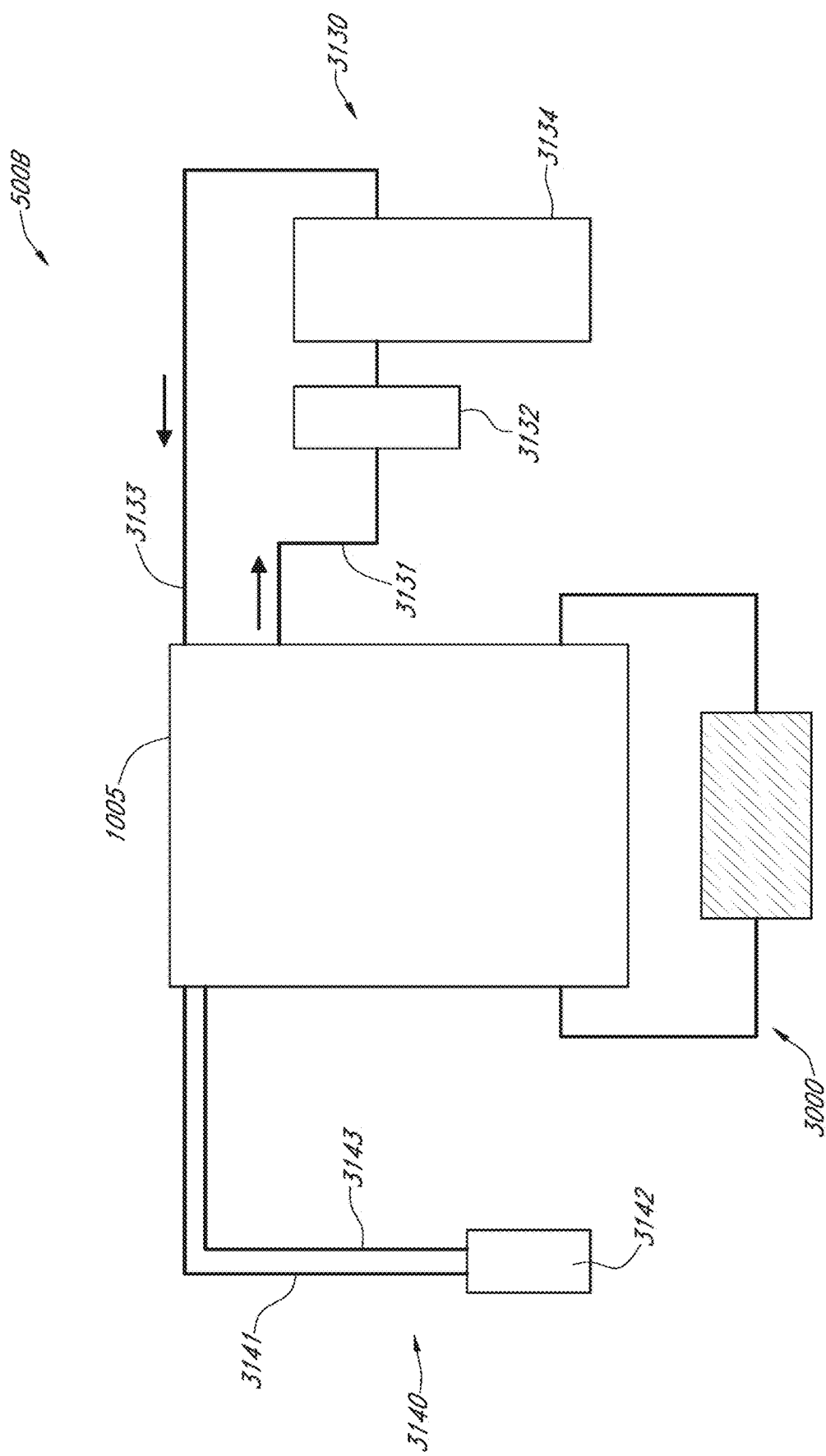
FIG. 20 is a schematic view of various embodiments of a gas enclosure assembly and related system components of the present teachings.

FIG. 20 is a schematic diagram showing a gas enclosure system 500B. Various embodiments of a gas enclosure system 500B according to the present teachings can comprise gas enclosure assembly 1000B for housing a printing system, gas purification loop 3130 in fluid communication gas enclosure assembly 1000B, and at least one thermal regulation system 3140. Additionally, various embodiments of gas enclosure system 1000B can have pressurized inert gas recirculation system 3000, which can supply inert gas for operating various devices, such as a substrate floatation table for an OLED printing system. Various embodiments of a pressurized inert gas recirculation system 3000 can utilize a compressor, a blower and combinations of the two as sources for various embodiments of pressurized inert gas recirculation system 3000, as will be discussed in more detail subsequently herein. Additionally, gas enclosure system 10008 can have a circulation and filtration system internal to gas enclosure system 1000B (not shown).

As depicted in FIG. 20, for various embodiments of a gas enclosure assembly according to the present teachings, the design of a filtration system can separate the inert gas circulated through gas purification loop 3130 from the inert gas that is continuously filtered and circulated internally for various embodiments of a gas enclosure assembly. Gas purification loop 3130 includes outlet line 3131 from gas enclosure assembly 10008, to a solvent removal component 3132 and then to gas purification system 3134. Inert gas purified of solvent and other reactive gas species, such as oxygen and water vapor, are then returned to gas enclosure assembly 1000B through inlet line 3133. Gas purification loop 3130 may also include appropriate conduits and connections, and sensors, for example, oxygen, water vapor and solvent vapor sensors. A gas circulating unit, such as a fan, blower or motor and the like, can be separately provided or integrated, for example, in gas purification system 3134, to circulate gas through gas purification loop 3130. According to various embodiments of a gas enclosure assembly, though solvent removal system 3132 and gas purification system 3134 are shown as separate units in the schematic shown in FIG. 20, solvent removal system 3132 and gas purification system 3134 can be housed together as a single purification unit.

Gas purification loop 3130 of FIG. 20 can have solvent removal system 3132 placed upstream of gas purification system 3134, so that inert gas circulated from gas enclosure assembly 1000B passes through solvent removal system 3132 via outlet line 3131. According to various embodiments, solvent removal system 3132 may be a solvent trapping system based on adsorbing solvent vapor from an inert gas passing through solvent removal system 3132 of FIG. 20. A bed or beds of a sorbent, for example, but not limited by, such as activated charcoal, molecular sieves, and the like, may effectively remove a wide variety of organic solvent vapors. For various embodiments of a gas enclosure system cold trap technology may be employed to remove solvent vapors in solvent removal system 3132. As previously discussed herein, for various embodiments of a gas enclosure system according to the present teachings, sensors, such as oxygen, water vapor and solvent vapor sensors, may be used to monitor the effective removal of such species from inert gas continuously circulating through a gas enclosure system, such as gas enclosure system 500B of FIG. 20. Various embodiments of a solvent removal system can indicate when sorbent, such as activated carbon, molecular sieves, and the like, has reached capacity, so that the bed or beds of sorbent can be regenerated or replaced. Regeneration of a molecular sieve can involve heating the molecular sieve, contacting the molecular sieve with a forming gas, a combination thereof, and the like. Molecular sieves configured to trap various species, including oxygen, water vapor, and solvents, can be regenerated by heating and exposure to a forming gas that comprises hydrogen, for example, a forming gas comprising about 96% nitrogen and 4% hydrogen, with said percentages being by volume or by weight. Physical regeneration of activated charcoal can be done using a similar procedure of heating under an inert environment.

Any suitable gas purification system can be used for gas purification system 3134 of gas purification loop 3130 of FIG. 20. Gas purification systems available, for example, from MBRAUN Inc., of Statham, N.H., or Innovative Technology of Amesbury, Mass., may be useful for integration into various embodiments of a gas enclosure assembly according to the present teachings. Gas purification system 3134 can be used to purify one or more inert gases in gas enclosure system 500B, for example, to purify the entire gas atmosphere within a gas enclosure assembly. As previously discussed herein, in order to circulate gas through gas purification loop 3130, gas purification system 3134 can have a gas circulating unit, such as a fan, blower or motor, and the like. In that regard, a gas purification system can be selected depending on the volume of the enclosure, which can define a volumetric flow rate for moving an inert gas through a gas purification system. For various embodiments of gas enclosure system having a gas enclosure assembly with a volume of up to about 4 $m^3$; a gas purification system that can move about 84 $m^3/h$ can be used. For various embodiments of gas enclosure system having a gas enclosure assembly with a volume of up to about 10 $m^3$; a gas purification system that can move about 155 $m^3/h$ can be used. For various embodiments of a gas enclosure assembly having a volume of between about 52-114 $m^3$, more than one gas purification system may be used.

Any suitable gas filters or purifying devices can be included in the gas purification system 3134 of the present teachings. In some embodiments, a gas purification system can comprise two parallel purifying devices, such that one of the devices can be taken off line for maintenance and the other device can be used to continue system operation without interruption. In some embodiments, for example, the gas purification system can comprise one or more molecular sieves. In some embodiments, the gas purification system can comprise at least a first molecular sieve, and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously discussed herein, molecular sieves may be regenerated and reused.

Thermal regulation system 3140 of FIG. 20 can include at least one chiller 3142, which can have fluid outlet line 3141 for circulating a coolant into a gas enclosure assembly, and fluid inlet line 3143 for returning the coolant to the chiller. An at least one fluid chiller 3142 can be provided for cooling the gas atmosphere within gas enclosure system 500B. For various embodiments of a gas enclosure system of the present teachings, fluid chiller 3142 delivers cooled fluid to heat exchangers within the enclosure, where inert gas is passed over a filtration system internal the enclosure. At least one fluid chiller can also be provided with gas enclosure system 500B to cool heat evolving from an apparatus enclosed within gas enclosure system 500B. For example, but not limited by, at least one fluid chiller can also be provided for gas enclosure system 500B to cool heat evolving from an OLED printing system. Thermal regulation system 3140 can comprise heat-exchange or Peltier devices and can have various cooling capacities. For example, for various embodiments of a gas enclosure system, a chiller can provide a cooling capacity of from between about 2 kW to about 20 kW. Various embodiments of a gas enclosure system can have a plurality of fluid chillers that can chill one or more fluids. In some embodiments, the fluid chillers can utilize a number of fluids as coolant, for example, but not limited by, water, anti-freeze, a refrigerant, and a combination thereof as a heat exchange fluid. Appropriate leak-free, locking connections can be used in connecting the associated conduits and system components.

As previously discussed herein, the present teachings disclose various embodiments of a gas enclosure system that can include a printing system enclosure defining a first volume and an auxiliary enclosure defining a second volume. Various embodiments of a gas enclosure system can have an auxiliary enclosure that can be sealably constructed as a section of gas enclosure assembly. According to systems and methods of the present teachings, an auxiliary enclosure can be sealable isolated from a printing system enclosure, and can be opened to an environment external a gas enclosure assembly without exposing a printing system enclosure to the external environment. Such physical isolation of an auxiliary enclosure to perform, for example, but not limited by, various printhead management procedures, can be done to eliminate or minimize the exposure of a printing system enclosure to contamination, such as air and water vapor and various organic vapors, as well as particulate contamination. Various printhead management procedures that can include measurement and maintenance procedures on a printhead assembly can be done with little or no interruption of a printing process, thereby minimizing or eliminating gas enclosure system downtime.

For a gas enclosure system having a printing system enclosure defining a first volume and an auxiliary enclosure defining a second volume, both volumes can be readily integrated with gas circulation, filtration and purification components to form a gas enclosure system that can sustain an inert, substantially low-particle environment for processes requiring such an environment with little or no interruption of a printing process. According to various systems and methods of the present teachings, a printing system enclosure may be introduced to a level of contamination that is sufficiently low that a purification system can remove the contamination before it can affect a printing process. Various embodiments of an auxiliary enclosure can be a substantially smaller volume of the total volume of a gas enclosure assembly and can be readily integrated with gas circulation, filtration and purification components to form an auxiliary enclosure system that can rapidly recover an inert, of a low-particle environment after exposure to an external environment, thereby providing little or no interruption of a printing process.

Additionally, various embodiments of an auxiliary enclosure can be readily integrated with a dedicated set of environmental regulation system components, such as lighting, gas circulation and filtration, gas purification, and thermostating components. In that regard, various embodiments of a gas enclosure system that include an auxiliary enclosure that can be sealably isolated as a section of gas enclosure assembly can have a controlled environment that is set to be uniform with a first volume defined by a gas enclosure assembly housing a printing system. Further, various embodiments of a gas enclosure system including an auxiliary enclosure that can be sealably isolated as a section of gas enclosure assembly can have a controlled environment that is set to be different than the controlled environment of a first volume defined by a gas enclosure assembly housing a printing system.

While the examples above mentioning cooling capacities and chilling applications, the examples above can also be applied to applications where including buffering of substrates in a controlled environment, or for applications where circulating gas can be maintained at a temperature similar to other portions of the system, such as to avoid unwanted heat transfer from substrates being fabricated or to avoid disruption of temperature uniformity across a substrate or between substrates.

Figure 21A:
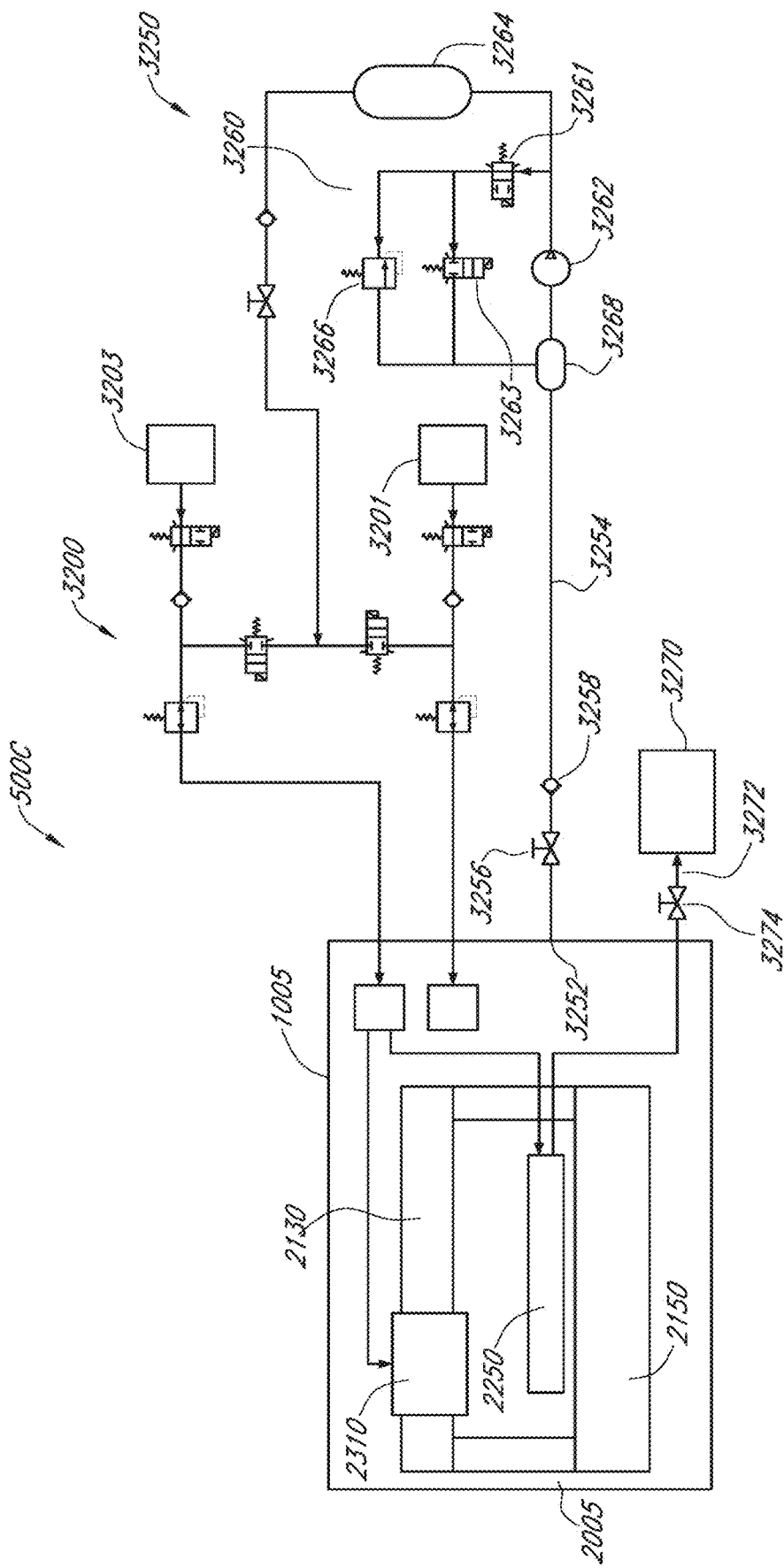
FIG. 21A and FIG. 21B are schematic views of various embodiments of an enclosed printing system and components for integrating and controlling gas sources such as can be used to establish a controlled gas environment in a gas enclosure, which various embodiments can include a supply of pressurized gas for use with a floatation table.
Figure 21B:
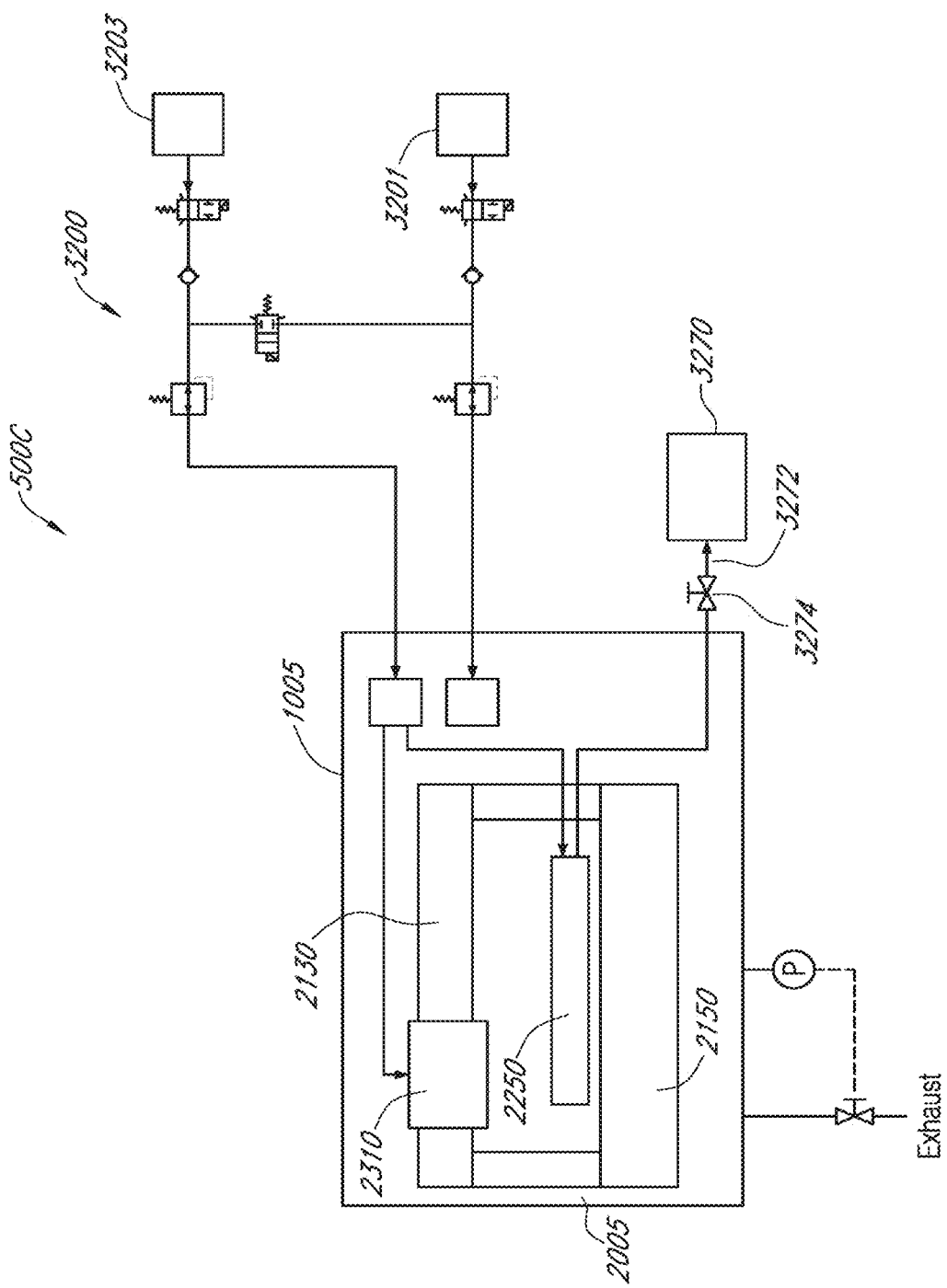
Figure 22A:
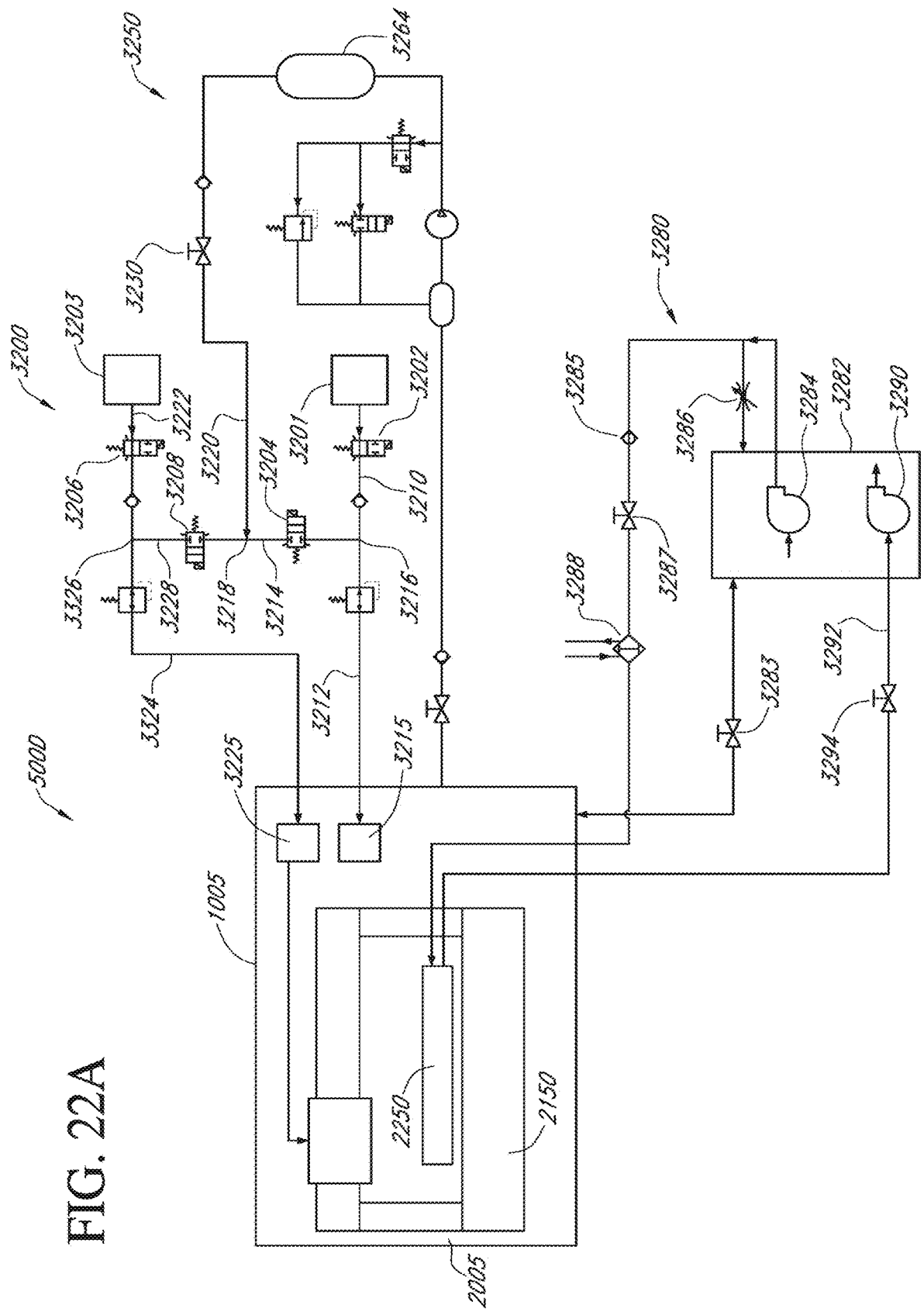
FIG. 22A through FIG. 22C are schematic views of various embodiments of an enclosed printing system and components for integrating and controlling gas sources such as can be used to establish a controlled gas environment in a gas enclosure, which various embodiments can include a blower loop to provide, for example, pressurized gas, as well as a vacuum source for use with a floatation table.
Figure 22B:
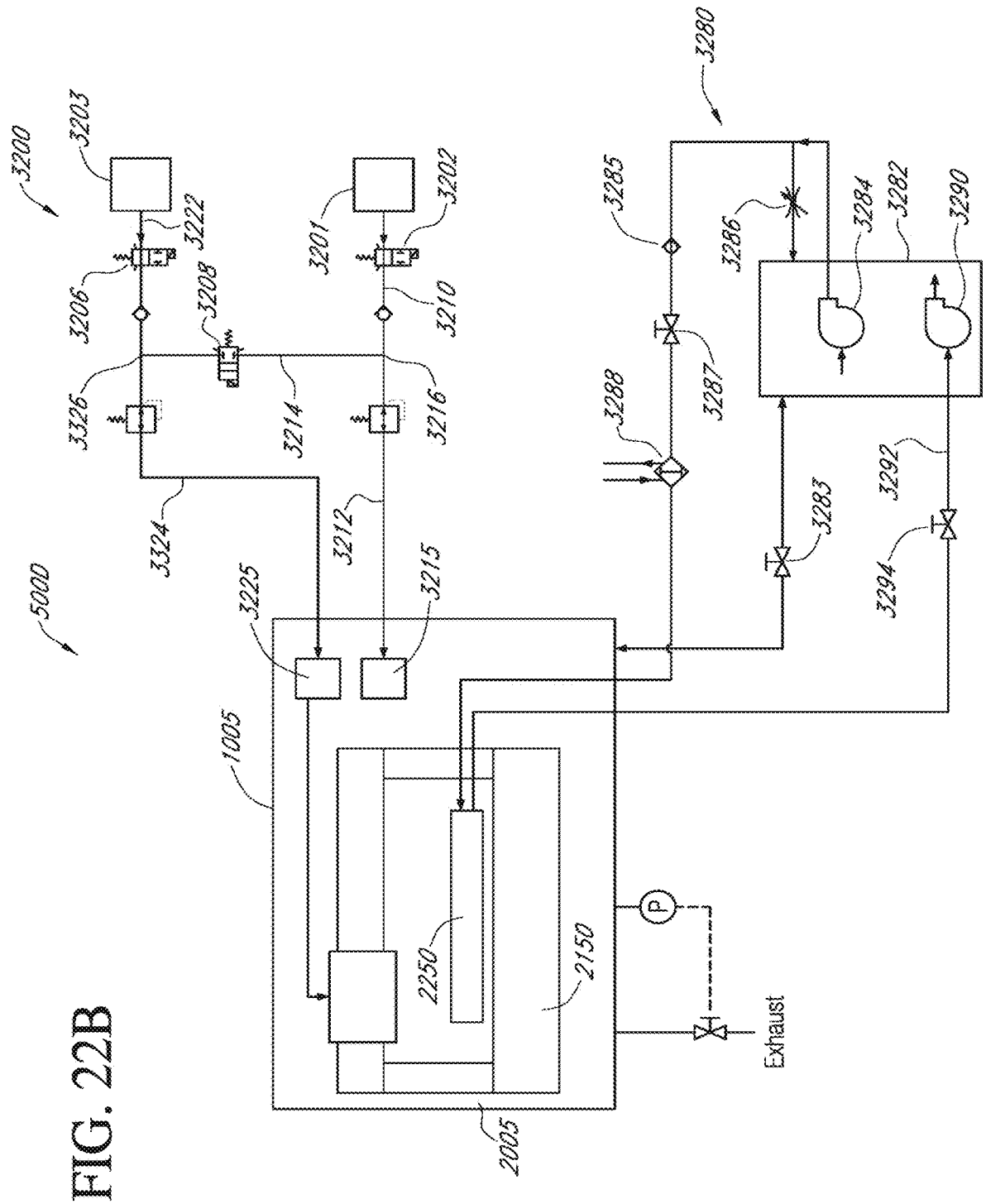
Figure 22C:
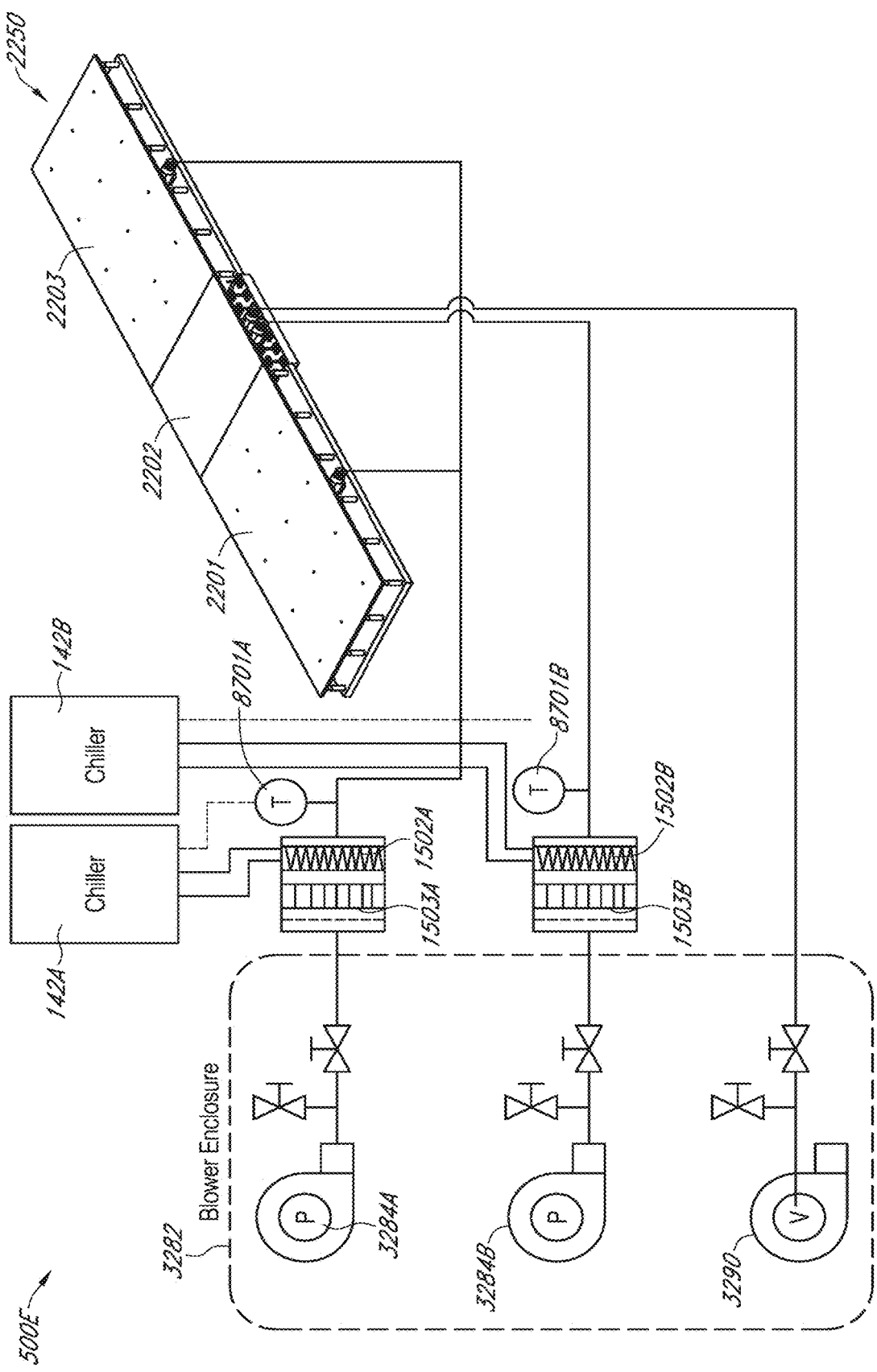

FIGS. 21A and 21B illustrate generally examples of a gas enclosure system for integrating and controlling non-reactive gas and clean dry air (CDA) sources such as can be used to establish the controlled environment referred to in other examples described elsewhere herein, and such as can include a supply of pressurized gas for use with a floatation table. FIGS. 22A and 22B illustrate generally examples of a gas enclosure system for integrating and controlling non-reactive gas and clean dry air (CDA) sources such as can be used to establish the controlled environment referred to in other examples described elsewhere herein, and such as can include a blower loop to provide, for example, pressurized gas and at least partial vacuum for use with a floatation table. FIG. 22C illustrates generally a further example of a system for integrating and controlling one or more gas or air sources, such as to establish floatation control zones included as a portion of a floatation conveyance system.

Various examples described herein include enclosed modules that can be environmentally-controlled. Enclosure assemblies and corresponding support equipment can be referred to as a "gas enclosure system" and such enclosure assemblies can be constructed in a contoured fashion that reduces or minimizes an internal volume of a gas enclosure assembly, and at the same time provides a working volume for accommodating various footprints of printing system components, such as the deposition (e.g., printing), holding, loading, or treatment modules described herein. For example, a contoured gas enclosure assembly according to the present teachings can have a gas enclosure volume of between about 6 m3 to about 95 m3 for various examples of a gas enclosure assembly of the present teachings covering, for example, substrate sizes from Gen 3.5 to Gen 10. Various examples of a contoured gas enclosure assembly according to the present teachings can have a gas enclosure volume of, for example, but not limited by, of between about 15 m3 to about 30 m3 which might be useful for printing of, for example, but not limited by, Gen 5.5 to Gen 8.5 substrate sizes or other substrate sizes. Various examples of an auxiliary enclosure can be constructed as a section of gas enclosure assembly and readily integrated with gas circulation and filtration, as well as purification components to form a gas enclosure system that can sustain a controlled, substantially low-particle environment for processes requiring such an environment.

As shown in FIG. 21A and FIG. 22A, various examples of a gas enclosure system can include a pressurized non-reactive gas recirculation system. Various examples of a pressurized gas recirculation loop can utilize a compressor, a blower and combinations thereof. According to the present teachings, several engineering challenges were addressed in order to provide for various examples of a pressurized gas recirculation system in a gas enclosure system. First, under typical operation of a gas enclosure system without a pressurized non-reactive gas recirculation system, a gas enclosure system can be maintained at a slightly positive internal pressure (e.g., above atmospheric pressure) relative to an external pressure in order to safeguard against outside gas or air from entering the interior should any leaks develop in a gas enclosure system. For example, under typical operation, for various examples of a gas enclosure system of the present teachings, the interior of a gas enclosure system can be maintained at a pressure relative to the surrounding atmosphere external to the enclosure system, for example, of at least 2 mbarg, for example, at a pressure of at least 4 mbarg, at a pressure of at least 6 mbarg, at a pressure of at least 8 mbarg, or at a higher pressure.

Maintaining a pressurized gas recirculation system within a gas enclosure system can be challenging, as it presents a dynamic and ongoing balancing act regarding maintaining a slight positive internal pressure of a gas enclosure system, while at the same time continuously introducing pressurized gas into a gas enclosure system. Further, variable demand of various devices and apparatuses can create an irregular pressure profile for various gas enclosure assemblies and systems of the present teachings. Maintaining a dynamic pressure balance for a gas enclosure system held at a slight positive pressure relative to the external environment under such conditions can provide for the integrity of an ongoing fabrication process. For various examples of a gas enclosure system, a pressurized gas recirculation system according to the present teachings can include various examples of a pressurized gas loop that can utilize at least one of a compressor, an accumulator, and a blower, and combinations thereof. Various examples of a pressurized gas recirculation system that include various examples of a pressurized gas loop can have a specially designed pressure-controlled bypass loop that can provide internal pressure of a non-reactive gas in a gas enclosure system of the present teachings at a stable, defined value. In various examples of a gas enclosure system, a pressurized gas recirculation system can be configured to re-circulate pressurized gas via a pressure-controlled bypass loop when a pressure of a gas in an accumulator of a pressurized gas loop exceeds a pre-set threshold pressure. The threshold pressure can be, for example, within a range from between about 25 psig to about 200 psig, or more specifically within a range of between about 75 psig to about 125 psig, or more specifically within a range from between about 90 psig to about 95 psig. In that regard, a gas enclosure system of the present teachings having a pressurized gas recirculation system with various examples of a specially designed pressure-controlled bypass loop can maintain a balance of having a pressurized gas recirculation system in a hermetically sealed gas enclosure.

According to the present teachings, various devices and apparatuses can be disposed in the interior of a gas enclosure system and in fluid communication with various examples of a pressurized gas recirculation system. For various examples of a gas enclosure and system of the present teachings, the use of various pneumatically operated devices and apparatuses can provide low-particle generating performance, as well as being low maintenance. Exemplary devices and apparatuses that can be disposed in the interior of a gas enclosure system and in fluid communication with various pressurized gas loops can include, for example, but not limited by, one or more of a pneumatic robot, a substrate floatation table, an air bearing, an air bushing, a compressed gas tool, a pneumatic actuator, and combinations thereof. A substrate floatation table, as well as air bearings can be used for various aspects of operating a printing system in accordance with various examples of a gas enclosure system of the present teachings. For example, a substrate floatation table utilizing air-bearing technology can be used to transport a substrate into position in a printhead chamber, as well as to support a substrate during a printing process.

For example, as shown in FIGS. 21A, 21B, 22A, and 22B, various examples of gas enclosure system 500C and gas enclosure system 500D can have external gas loop 3200 for integrating and controlling a non-reactive gas source 3201 and clean dry air (CDA) source 3203 for use in various aspects of operation of gas enclosure system 500C and gas enclosure system 500D. Gas enclosure system 500C and gas enclosure system 500D can also include various examples of an internal particle filtration and gas circulation system, as well as various examples of an external gas purification system, as previously described. Such examples of a gas enclosure system can include a gas purification system for purifying various reactive species from a gas. Some commonly used non-limiting examples of a non-reactive gas can include nitrogen, any of the noble gases, and any combination thereof. Various examples of a gas purification system according to the present teachings can maintain levels for each species of various reactive species, including various reactive atmospheric gases, such as water vapor, oxygen, ozone, as well as organic solvent vapors at 1000 ppm or lower, for example, at 100 ppm or lower, at 10 ppm or lower, at 1.0 ppm or lower, or at 0.1 ppm or lower. In addition to external loop 3200 for integrating and controlling gas source 3201 and CDA source 3203, gas enclosure system 500C and gas enclosure system 500D can have compressor loop 3250, which can supply gas for operating various devices and apparatuses that can be disposed in the interior of gas enclosure system 500C and gas enclosure system 500D. A vacuum system 3270 can be also be provided, such as in communication with gas enclosure assembly 1005 through line 3272 when valve 3274 is in an open position.

Compressor loop 3250 of FIG. 21A can include compressor 3262, first accumulator 3264 and second accumulator 3268, which are configured to be in fluid communication. Compressor 3262 can be configured to compress gas withdrawn from gas enclosure assembly 1005 to a desired pressure. An inlet side of compressor loop 3250 can be in fluid communication with gas enclosure assembly 1005 via gas enclosure assembly outlet 3252 through line 3254, having valve 3256 and check valve 3258. Compressor loop 3250 can be in fluid communication with gas enclosure assembly 1005 on an outlet side of compressor loop 3250 via external gas loop 3200. Accumulator 3264 can be disposed between compressor 3262 and the junction of compressor loop 3250 with external gas loop 3200 and can be configured to generate a pressure of 5 psig or higher. Second accumulator 3268 can be in compressor loop 3250 for providing dampening fluctuations due to compressor piston cycling at about 60 Hz. For various examples of compressor loop 3250, first accumulator 3264 can have a capacity of between about 80 gallons to about 160 gallons, while second accumulator can have a capacity of between about 30 gallons to about 60 gallons. According to various examples of gas enclosure system 500C, compressor 3262 can be a zero ingress compressor. Various types of zero ingress compressors can operate without leaking atmospheric gases into various examples of a gas enclosure system of the present teachings. Various examples of a zero ingress compressor can be run continuously, for example, during a fabrication process utilizing the use of various devices and apparatuses requiring compressed gas.

Accumulator 3264 can be configured to receive and accumulate compressed gas from compressor 3262. Accumulator 3264 can supply the compressed gas as needed in gas enclosure assembly 1005. For example, accumulator 3264 can provide gas to maintain pressure for various components of gas enclosure assembly 1005, such as, but not limited by, one or more of a pneumatic robot, a substrate floatation table, an air bearing, an air bushing, a compressed gas tool, a pneumatic actuator, and combinations thereof. As shown in FIG. 21A for gas enclosure system 500C, gas enclosure assembly 1005 can have printing system 2005 enclosed therein. As schematically depicted in FIG. 21A, printing system 2005 can be supported by printing system base 2150, which can be a granite stage. Printing system base 2150 can support a substrate support apparatus, such as a chuck, for example, but not limited by, a vacuum chuck, a substrate floatation chuck having pressure ports, and a substrate floatation chuck having vacuum and pressure ports. In various examples of the present teachings, a substrate support apparatus can be a substrate floatation table, such as substrate floatation table 2250. Substrate floatation table 2250 can be used for the frictionless support of a substrate. In addition to a low-particle generating floatation table, for frictionless Y-axis conveyance of a substrate, printing system 2005 can have a Y-axis motion system utilizing air bushings.

Additionally, printing system 2005 can have at least one X,Z-axis carriage assembly with motion control provided by a low-particle generating X-axis air bearing assembly. Various components of a low-particle generating motion system, such as an X-axis air bearing assembly, can be used in place of, for example, various particle-generating linear mechanical bearing systems. For various examples of a gas enclosure and system of the present teachings, the use of a variety of pneumatically operated devices and apparatuses can provide low-particle generating performance, as well as being low maintenance. Compressor loop 3250 can be configured to continuously supply pressurized gas to various devices and apparatuses of gas enclosure system 500C. In addition to a supply of pressurized gas, substrate floatation table 2250 of printing system 2005, which utilizes air bearing technology, also utilizes vacuum system 3270, which is in communication with gas enclosure assembly 1005 through line 3272 when valve 3274 is in an open position.

A pressurized gas recirculation system according to the present teachings can have pressure-controlled bypass loop 3260 as shown in FIG. 21A for compressor loop 3250, which acts to compensate for variable demand of pressurized gas during use, thereby providing dynamic balance for various examples of a gas enclosure system of the present teachings. For various examples of a gas enclosure system according to the present teachings, a bypass loop can maintain a constant pressure in accumulator 3264 without disrupting or changing the pressure in enclosure 1005. Bypass loop 3260 can have first bypass inlet valve 3261 on an inlet side of bypass loop, which is closed unless bypass loop 3260 is used. Bypass loop 3260 can also have back pressure regulator 3266, which can be used when second valve 3263 is closed. Bypass loop 3260 can have second accumulator 3268 disposed at an outlet side of bypass loop 3260. For examples of compressor loop 3250 utilizing a zero ingress compressor, bypass loop 3260 can compensate for small excursions of pressure that can occur over time during use of a gas enclosure system. Bypass loop 3260 can be in fluid communication with compressor loop 3250 on an inlet side of bypass loop 3260 when bypass inlet valve 3261 is in an opened position. When bypass inlet valve 3261 is opened, gas shunted through bypass loop 3260 can be recirculated to the compressor if gas from compressor loop 3250 is not in demand within the interior of gas enclosure assembly 1005. Compressor loop 3250 is configured to shunt gas through bypass loop 3260 when a pressure of the gas in accumulator 3264 exceeds a pre-set threshold pressure. A pre-set threshold pressure for accumulator 3264 can be from between about 25 psig to about 200 psig at a flow rate of at least about 1 cubic feet per minute (cfm), or from between about 50 psig to about 150 psig at a flow rate of at least about 1 cubic feet per minute (cfm), or from between about 75 psig to about 125 psig at a flow rate of at least about 1 cubic feet per minute (cfm) or between about 90 psig to about 95 psig at a flow rate of at least about 1 cubic feet per minute (cfm).

Various examples of compressor loop 3250 can utilize a variety of compressors other than a zero ingress compressor, such as a variable speed compressor or a compressor that can be controlled to be in either an on or off state. As previously discussed herein, a zero ingress compressor ensures that no atmospheric reactive species can be introduced into a gas enclosure system. As such, any compressor configuration preventing atmospheric reactive species from being introduced into a gas enclosure system can be utilized for compressor loop 32SO. According to various examples, compressor 3262 of gas enclosure system SOOC can be housed in, for example, but not limited by, a hermetically-sealed housing. The housing interior can be configured in fluid communication with a source of gas, for example, the same gas that forms the gas atmosphere for gas enclosure assembly 1005. For various examples of compressor loop 3250, compressor 3262 can be controlled at a constant speed to maintain a constant pressure. In other examples of compressor loop 3250 not utilizing a zero ingress compressor, compressor 3262 can be turned off when a maximum threshold pressure is reached, and turned on when a minimum threshold pressure is reached.

In FIG. 22A for gas enclosure system 500D, blower loop 3280 utilizing vacuum blower 3290 is shown for the operation of substrate floatation table 2250 of printing system 2005, which are housed in gas enclosure assembly 1005. As previously discussed herein for compressor loop 3250, blower loop 3280 can be configured to continuously supply pressurized gas to a substrate floatation table 2250 of printing system 2005.

Various examples of a gas enclosure system that can utilize a pressurized gas recirculation system can have various loops utilizing a variety of pressurized gas sources, such as at least one of a compressor, a blower, and combinations thereof. In FIG. 22A for gas enclosure system 500D, compressor loop 3250 can be in fluid communication with external gas loop 3200, which can be used for the supply of gas for high consumption manifold 3225, as well as low consumption manifold 3215. For various examples of a gas enclosure system according to the present teachings as shown in FIG. 22A for gas enclosure system 500D, high consumption manifold 3225 can be used to supply gas to various devices and apparatuses, such as, but not limited by, one or more of a substrate floatation table, a pneumatic robot, an air bearing, an air bushing, and a compressed gas tool, and combinations thereof. For various examples of a gas enclosure system according to the present teachings, low consumption 3215 can be used to supply gas to various apparatuses and devises, such as, but not limited by, one or more of an isolator, and a pneumatic actuator, and combinations thereof.

For various examples of gas enclosure system SOOD of FIGS. 22A and 22B, a blower loop 3280 can be utilized to supply pressurized gas to various examples of substrate floatation table 2250. In addition to a supply of pressurized gas, substrate floatation table 2250 of printing system 2005, which utilizes air bearing technology, also utilizes blower vacuum 3290, which is in communication with gas enclosure assembly 1005 through line 3292 when valve 3294 is in an open position. Housing 3282 of blower loop 3280 can maintain first blower 3284 for supplying a pressurized source of gas to substrate floatation table 2250, and second blower 3290, acting as a vacuum source for substrate floatation table 2250, which is housed in a gas environment in gas enclosure assembly 1005. Attributes that can make blowers suitable for use as a source of either pressurized gas or vacuum for various examples a substrate floatation table include, for example, but not limited by, that they have high reliability; making them low maintenance, have variable speed control, and have a wide range of flow volumes; various examples capable of providing a volume flow of between about 100 m3/h to about 2,500 m3/h. Various examples of blower loop 3280 additionally can have first isolation valve 3283 at an inlet end of blower loop 3280, as well as check valve 3285 and a second isolation valve 3287 at an outlet end of blower loop 3280. Various examples of blower loop 3280 can have adjustable valve 3286, which can be, for example, but not limited by, a gate, butterfly, needle or ball valve, as well as heat exchanger 3288 for maintaining gas from blower loop 3280 to substrate floatation table 2250 at a defined temperature.

FIG. 22A depicts external gas loop 3200, also shown in FIG. 21A, for integrating and controlling gas source 3201 and clean dry air (CDA) source 3203 for use in various aspects of operation of gas enclosure system 500C of FIG. 21A and gas enclosure system 500D of FIG. 22A. External gas loop 3200 of FIG. 21A and FIG. 22A can include at least four mechanical valves. These valves include first mechanical valve 3202, second mechanical valve 3204, third mechanical valve 3206, and fourth mechanical valve 3208. These various valves are located at positions in various flow lines that allow control of both a non-reactive gas and an air source such as clean dry air (CDA). According to the present teachings, a non-reactive gas can be any gas that does not undergo a chemical reaction under a defined set of conditions. Some commonly used non-limiting examples of non-reactive gas can include nitrogen, any of the noble gases, and any combination thereof. From a house gas source 3201, a house gas line 3210 extends. House gas line 3210 continues to extend linearly as low consumption manifold line 3212, which is in fluid communication with low consumption manifold 3215. A cross-line first section 3214 extends from a first flow juncture 3216, which is located at the intersection of house gas line 3210, low consumption manifold line 3212, and cross-line first section 3214. Cross-line first section 3214 extends to a second flow juncture 3218. A compressor gas line 3220 extends from accumulator 3264 of compressor loop 3250 and terminates at second flow juncture 3218. A CDA line 3222 extends from a CDA source 3203 and continues as high consumption manifold line 3224, which is in fluid communication with high consumption manifold 3225. A third flow juncture 3226 is positioned at the intersection of a cross-line second section 3228, clean dry air line 3222, and high consumption manifold line 3224. Cross-line second section 3228 extends from second flow juncture 3218 to third flow juncture 3226. Various components that are high consumption can be supplied CDA during maintenance, by means high consumption manifold 3225. Isolating the compressor using valves 3204, 3208, and 3230 can prevent reactive species, such as ozone, oxygen, and water vapor from contaminating a gas within the compressor and accumulator.

By contrast with FIGS. 21A and 22A, FIGS. 21B and 22B illustrate generally a configuration wherein a pressure of gas inside the gas enclosure assembly 1005 can be maintained within a desired or specified range, such as using a valve coupled to a pressure monitor, P, where the valve allows gas to be exhausted to another enclosure, system, or a region surrounding the gas enclosure assembly 1005 using information obtained from the pressure monitor. Such gas can be recovered and re-processed as in other examples described herein. As mentioned above, such regulation can assist in maintaining a slight positive internal pressure of a gas enclosure system, because pressurized gas is also contemporaneously introduced into the gas enclosure system. Variable demand of various devices and apparatuses can create an irregular pressure profile for various gas enclosure assemblies and systems of the present teachings. Accordingly, the approach shown in FIGS. 21B and 22B can be used in addition or instead of other approaches described herein such as to assist in maintaining a dynamic pressure balance for a gas enclosure system held at a slight positive pressure relative to the environment surrounding the enclosure.

FIG. 22C illustrates generally a further example of a system 500E for integrating and controlling one or more gas or air sources, such as to establish floatation control zones included as a portion of a floatation conveyance system. Similar to the examples of FIG. 1C, FIG. 22A and FIG. 22B, FIG. 22C illustrates generally floatation table 2250. Additionally, shown in the illustrative example of FIG. 22C are an input region 2201 and an output region 2203. The regions 2201, 2200, 2203 are referred to as input, printing, and output for illustration only. Such regions can be used for other processing steps, such as conveyance of a substrate, or support of a substrate such as during one or more of holding, drying, or thermal treatment of the substrate in one or more other modules. In the illustration of FIG. 22C, a first blower 3284A is configured to provide pressurized gas in one or more of the input or output regions 2201 or 2203 of a floatation table apparatus. Such pressurized gas can be temperature controlled such as using a first chiller 142A coupled to a first heat exchanger 1502A. Such pressurized gas can be filtered using a first filter 1503A. A temperature monitor 8701A can be coupled to the first chiller 142 (or other temperature controller).

Similarly, a second blower 3284B can be coupled to the printing region 2202 of the floatation table. A separate chiller 142B can be coupled to a loop including a second heat exchanger 1502B and a second filter 1503B. A second temperature monitor 8701B can be used to provide independent regulation of the temperature of pressurized gas provided by the second blower 3284B. In this illustrative example, as previously described herein for FIG. 1C, the input and output regions 2201 and 2203 are supplied with positive pressure, but the printing region 2202 can include use of a combination of positive pressure and vacuum control to provide precise control over the substrate position. For example, using such a combination of positive pressure and vacuum control, the substrate can be exclusively controlled using the floating gas cushion provided by gas enclosure system 500D in the zone defined by the printing region 2202. The vacuum can be established by a third blower 3290, such as also provided at least a portion of the make-up gas for the first and second blowers 3284A or 3284B within the blower housing 3282.

It should be understood that various alternatives to the embodiments of the disclosure described herein may be employed in practicing the disclosure. For example, while vastly different arts such as chemistry, biotechnology, high technology and pharmaceutical arts may benefit from the present teachings. Printing is used to exemplify the utility of various embodiments of a gas enclosure system according to the present teachings. Various embodiments of a gas enclosure system that may house a printing system can provide features such as, but not limited by, sealing providing an hermetic-sealed enclosure through cycles of construction and deconstruction, minimization of enclosure volume, and ready access from the exterior to the interior during processing, as well as during maintenance. Such features of various embodiments of a gas enclosure system may have an impact on functionality, such as, but not limited by, structural integrity providing ease of maintaining low levels of reactive species during processing, as well as rapid enclosure-volume turnover minimizing downtime during maintenance cycles. As such, various features and specifications providing utility for substrate printing may also provide benefit to a variety of technology areas.

While embodiments of the present disclosure have been shown and described herein, it will be obvious to those skilled in the art that such embodiments are provided by way of example only. Numerous variations, changes, and substitutions will now occur to those skilled in the art without departing from the disclosure. It is intended that the following claims define the scope of the disclosure and that methods and structures within the scope of these claims and their equivalents be covered thereby.

What is claimed is:

1. A method, comprising:
supporting a substrate on a gas cushion;
holding the substrate along an edge thereof using a gripper;
moving a carriage assembly to move the gripper in a Y-axis direction to position the substrate in a work position;
moving a dispenser across the substrate in an X-axis direction that crosses the Y-axis direction; and
maintaining orientation of the edge of the substrate parallel to the Y-axis direction by using an actuator to rotate a component of the gripper about a Z-axis that is substantially perpendicular to a plane defined by the Y-axis and X-axis directions while moving the gripper in the Y-axis direction, wherein rotation applied by the actuator is adjusted as the substrate is moved in the Y-direction based on signals from a sensor configured to detect a position of the actuator in the X-direction relative to a position of the carriage assembly in the X-direction.

2. The method of claim 1, further comprising dispensing droplets of a liquid material onto the substrate using the dispenser.

3. The method of claim 1, wherein the actuator is a voice coil.

4. The method of claim 1, further comprising moving the dispenser in a direction substantially parallel to the Z-axis direction.

5. The method of claim 1, wherein the gripper comprises a substrate gripping surface supported by a gripper frame mounted to a carriage assembly, and further comprising supporting the carriage assembly on a gas cushion and supporting the dispenser on a gas cushion.

6. The method of claim 1, further comprising enclosing the substrate support, the dispenser, and the gripper in an enclosure.

7. The method of claim 6, wherein the holding the substrate along an edge thereof using a gripper comprises contacting the component of the gripper with the edge of the substrate and applying a vacuum to the edge of the substrate through the component.

8. The method of claim 1, wherein the actuator is positioned within 2 microns of the carriage assembly.

9. A method, comprising:
supporting a substrate on a gas cushion;
holding the substrate along an edge thereof using a substrate gripping surface of a gripper;
moving a carriage assembly to move the gripper in a Y-axis direction to position the substrate in a work position;
moving a dispenser across the substrate in an X-axis direction that crosses the Y-axis direction;
dispensing droplets of a liquid material onto the substrate using the dispenser;
moving the dispenser in the X-axis direction toward a maintenance system; and
maintaining orientation of the edge of the substrate parallel to the Y-axis direction by using an actuator to rotate the substrate gripping surface of the gripper about a Z-axis that is substantially perpendicular to a plane defined by the Y-axis and X-axis directions while moving the gripper in the Y-axis direction, wherein rotation applied by the actuator is adjusted as the substrate is moved in the Y-direction based on signals from a sensor configured to detect a position of the actuator in the X-direction relative to a position of the carriage assembly in the X-direction.

10. The method of claim 9, further comprising measuring at least one characteristic of a droplet ejected from the dispenser using the maintenance system.

11. The method of claim 9, further comprising moving the maintenance system in a direction substantially parallel to the Y-axis direction to engage with the dispenser.

12. The method of claim 9, wherein the actuator is a voice coil.

13. The method of claim 9, further comprising moving the dispenser in a direction substantially parallel to the Z-axis direction to engage with the maintenance system.

14. The method of claim 9, further comprising enclosing the substrate support, the dispenser, the maintenance system, and the gripper in an enclosure.

15. The method of claim 14, wherein the holding the substrate along an edge thereof comprises contacting the substrate gripping surface of the gripper with the edge of the substrate and applying a vacuum to the edge of the substrate through the substrate gripping surface.

16. The method of claim 9, wherein the actuator is a first voice coil, rotating the substrate gripping surface of the gripper comprises adjusting signals provided to the first voice coil and a second voice coil, and the first voice coil and the second voice coil are configured to operate in a master slave relationship to rotate the substrate gripping surface of the gripper.

17. The method of claim 9, wherein the dispensing droplets of the liquid material onto the substrate is performed concurrently with the moving the gripper in the Y-axis direction to position the substrate in a work position and with the moving the dispenser across the substrate in the X-axis direction.

18. A method, comprising:
supporting a substrate on a gas cushion using positive pressure and vacuum;
holding the substrate along an edge thereof using a substrate gripping surface of a gripper;
moving a carriage assembly to move the gripper in a Y-axis direction to position the substrate in a work position;
moving a dispenser across the substrate in an X-axis direction that crosses the Y-axis direction;
dispensing droplets of a liquid material onto the substrate using the dispenser;
moving the dispenser in the X-axis direction toward a maintenance system; and
maintaining orientation of the edge of the substrate parallel to the Y-axis direction by using an actuator to rotate a component of the gripper about a Z-axis axis that is substantially perpendicular to a plane defined by the Y-axis and X-axis directions while moving the gripper in the Y-axis direction, wherein rotation applied by the actuator is adjusted as the substrate is moved in the Y-direction based on signals from a sensor configured to detect a position of the actuator in the X-direction relative to a position of the carriage assembly in the X-direction.

19. The method of claim 18, wherein the actuator is a voice coil.

20. The method of claim 19, wherein the dispensing droplets of the liquid material onto the substrate is performed concurrently with the moving the gripper in the Y-axis direction to position the substrate in a work position and with the moving the dispenser across the substrate in the X-axis direction.

* * * * *